(12) United States Patent
Akimoto et al.

(10) Patent No.: US 10,101,867 B2
(45) Date of Patent: Oct. 16, 2018

(54) DISPLAY DEVICE AND OPERATION METHOD THEREOF

(71) Applicant: Semiconductor Energy Laboratory Co., Ltd., Kanagawa-ken (JP)

(72) Inventors: Kengo Akimoto, Tochigi (JP); Hironobu Takahashi, Tochigi (JP); Yuki Okamoto, Kanagawa (JP); Isamu Shigemori, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/922,238

(22) Filed: Mar. 15, 2018

(65) Prior Publication Data

US 2018/0203547 A1    Jul. 19, 2018

Related U.S. Application Data

(62) Division of application No. 14/686,109, filed on Apr. 14, 2015, now Pat. No. 9,952,724.

(30) Foreign Application Priority Data

Apr. 18, 2014 (JP) ................................ 2014-086089
May 2, 2014 (JP) ................................ 2014-095331

(51) Int. Cl.
*G06F 3/044* (2006.01)
*G09G 3/36* (2006.01)
(Continued)

(52) U.S. Cl.
CPC ............ *G06F 3/044* (2013.01); *G06F 3/0418* (2013.01); *G09G 3/3233* (2013.01);
(Continued)

(58) Field of Classification Search
CPC ................... G06F 3/044; G06F 3/0418; G06F 2203/04103; G06F 2203/04102;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1 737 044 A1    12/2006
EP    2 226 847 A2    9/2010
(Continued)

OTHER PUBLICATIONS

Asakuma, N. et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
(Continued)

*Primary Examiner* — Abhishek Sarma
(74) *Attorney, Agent, or Firm* — Husch Blackwell LLP

(57) ABSTRACT

A flexible display device with high viewability is provided. The display device includes a first substrate, a second substrate, a first element layer, and a second element layer. The first element layer is positioned between the first substrate and the second substrate. The second element layer is positioned between the first substrate and the second substrate. The first element layer and the second element layer overlap with each other in a region. The first substrate and the second substrate have flexibility. The first element layer includes a display element and a first circuit. The display element is electrically connected to the first circuit. The second element layer includes a sensor element. The sensor element has a function of sensing distortion.

13 Claims, 35 Drawing Sheets

(51) Int. Cl.
G09G 3/3233 (2016.01)
G06F 3/041 (2006.01)
H01L 27/32 (2006.01)

(52) U.S. Cl.
CPC . *G09G 3/3648* (2013.01); *G06F 2203/04102* (2013.01); *G06F 2203/04103* (2013.01); *G09G 2320/029* (2013.01); *G09G 2330/12* (2013.01); *G09G 2380/02* (2013.01); *H01L 27/323* (2013.01); *H01L 27/3225* (2013.01); *H01L 27/3262* (2013.01); *H01L 2251/5338* (2013.01)

(58) Field of Classification Search
CPC ............... G09G 3/3233; G09G 3/3648; G09G 2320/029; G09G 2330/12; G09G 2380/02; H01L 2251/5338; H01L 27/3225; H01L 27/323; H01L 27/3262
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 8,319,725 B2 | 11/2012 | Okamoto et al. |
| 8,367,440 B2 | 2/2013 | Takayama et al. |
| 8,415,208 B2 | 4/2013 | Takayama et al. |
| 8,543,166 B2 | 9/2013 | Choi et al. |
| 8,547,197 B2 | 10/2013 | Byun et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0064244 A1 | 3/2010 | Kilpatrick, II et al. |
| 2010/0064536 A1 | 3/2010 | Caskey et al. |
| 2010/0065844 A1 | 3/2010 | Tokunaga |
| 2010/0066643 A1 | 3/2010 | King et al. |
| 2010/0085274 A1 | 4/2010 | Kilpatrick, II et al. |
| 2010/0085382 A1 | 4/2010 | Lundqvist et al. |
| 2010/0092800 A1 | 4/2010 | Itagaki et al. |
| 2010/0109002 A1 | 5/2010 | Itagaki et al. |
| 2011/0126141 A1 | 5/2011 | King et al. |
| 2011/0134144 A1 | 6/2011 | Moriwaki |
| 2011/0216064 A1 | 9/2011 | Dahl et al. |
| 2012/0217516 A1 | 8/2012 | Hatano et al. |
| 2012/0256720 A1 | 10/2012 | Byun et al. |
| 2012/0329528 A1 | 12/2012 | Song |
| 2013/0214324 A1 | 8/2013 | Takayama et al. |
| 2014/0028597 A1 | 1/2014 | Cho et al. |
| 2014/0166998 A1 | 6/2014 | Lee et al. |
| 2014/0361980 A1 | 12/2014 | Iwaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |

(56) References Cited

FOREIGN PATENT DOCUMENTS

| | | |
|---|---|---|
| JP | 2002-278515 A | 9/2002 |
| JP | 2002-289859 A | 10/2002 |
| JP | 2003-086000 A | 3/2003 |
| JP | 2003-086808 A | 3/2003 |
| JP | 2003-174153 A | 6/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO 2004/114391 A1 | 12/2004 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2:Al and Sn-Doped Zinc Indium Oxide Thin Film Transistors for AMOLED Black-Plane," SID Digest '09: SID International Symposium Digest of Technical Papers, May 31, 2009, pp. 280-283.

Clark, S.J. et al., "First Principles Methods Using Castep," Zeitschrift fur Kristallographie, 2005, vol. 220, pp. 567-570.

Coates, D. et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits, 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2006, pp. 663-666.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "Suftla Flexible Microelectronics on Their Way to Business," SID Digest '07: SID International Symposium Digest of Technical Papers, 2007, vol. 38, pp. 1673-1676.

(56) References Cited

OTHER PUBLICATIONS

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," Nirim Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J.-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J.-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J.-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K.-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

"Sharp and Semiconductor Energy Laboratory Jointly Develop New Oxide Semiconductor Technology That Will Revolutionize Displays," http://www.sharp-world.com/corporate/news/120601.html, Jun. 1, 2012, pp. 1-2.

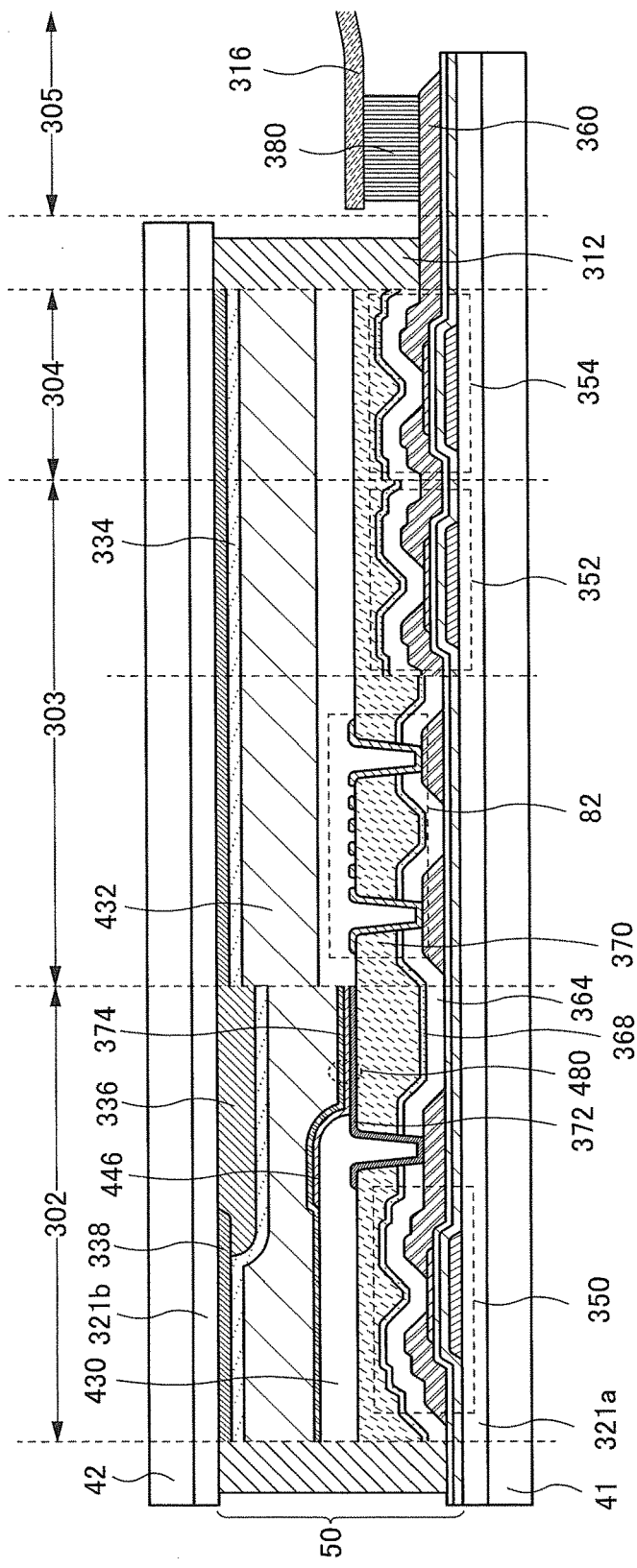
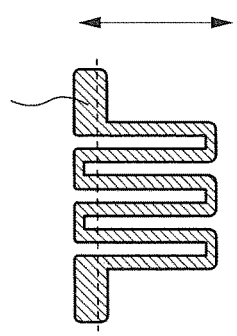
FIG. 3A
FIG. 3B

FIG. 27A
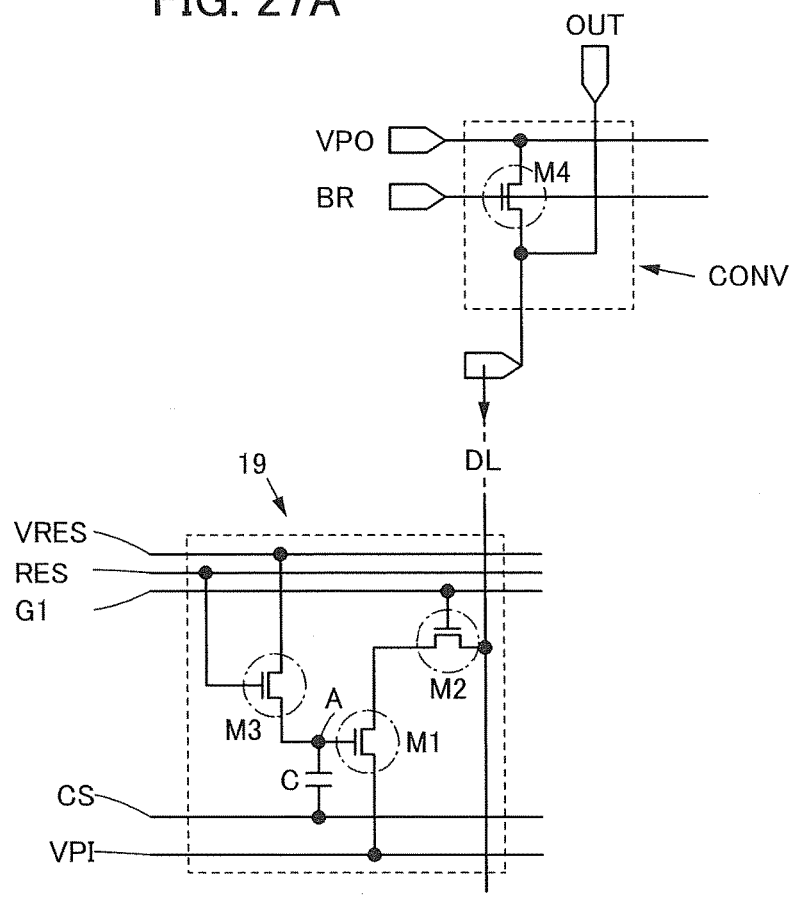
FIG. 27B1
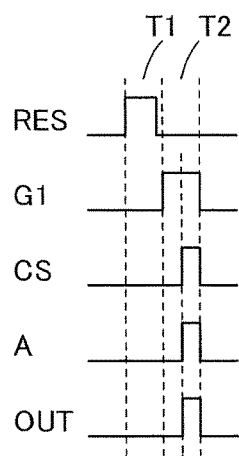
FIG. 27B2
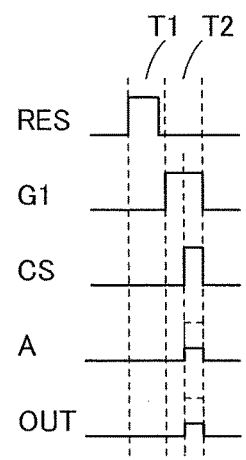
FIG. 27C
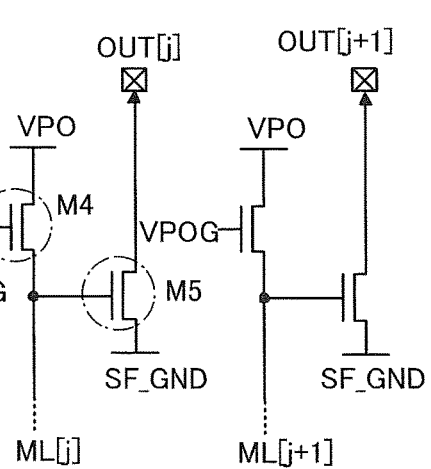

DISPLAY DEVICE AND OPERATION METHOD THEREOF

This application is a divisional of copending U.S. application Ser. No. 14/686,109, filed on Apr. 14, 2015 which is incorporated herein by reference.

BACKGROUND OF THE INVENTION

1. Field of the Invention

One embodiment of the present invention relates to a semiconductor device and a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, a program, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

2. Description of the Related Art

A transistor including a semiconductor thin film is applied to a wide range of electronic devices such as an integrated circuit or a display device. A silicon-based semiconductor material is widely known as a material for a semiconductor thin film applicable to the transistor. As another material, an oxide semiconductor has been attracting attention.

For example, a transistor whose active layer includes an amorphous oxide semiconductor containing indium (In), gallium (Ga), and zinc (Zn) is disclosed in Patent Document 1.

For a display device, it is required to improve the flexibility or impact resistance besides a reduction in the thickness and weight. For example, Patent Document 2 discloses a flexible active matrix light-emitting device in which an organic EL element and a transistor serving as a switching element are provided over a film substrate.

REFERENCE

Patent Document

[Patent Document 1] Japanese Published Patent Application No. 2006-165528
[Patent Document 2] Japanese Published Patent Application No. 2003-174153

SUMMARY OF THE INVENTION

Application of a flexible display device utilizing its flexibility as in a curved display or the like is expected. Meanwhile, intentional or unintentional change in the shape of a display during display operation reduces display viewability in some cases.

It is an object of one embodiment of the present invention to provide a display device with high viewability. Another object is to provide a flexible display device. Another object is to provide a lightweight display device. Another object is to provide a display device with high reliability. Another object is to provide a novel display device or the like. Another object is to provide an operation method of the display device. Another object is to provide a program for operating the display device. Another object is to provide a novel semiconductor device or the like. Another object is to provide an operation method of the semiconductor device or the like. Another object is to provide a program for operating the semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a flexible display device including a distortion sensor.

One embodiment of the present invention is a display device including a first substrate, a second substrate, a first element layer, and a second element layer. The first element layer is positioned between the first substrate and the second substrate. The second element layer is positioned between the first substrate and the second substrate. The first element layer and the second element layer overlap with each other in a region. The first substrate and the second substrate have flexibility. The first element layer includes a display element and a first circuit. The display element is electrically connected to the first circuit. The second element layer includes a sensor element. The sensor element has a function of sensing distortion of the first substrate or the second substrate.

In this specification, ordinal numbers such as "first", "second", and the like are used in order to avoid confusion among components, and the terms do not limit the components numerically.

The second element layer may include a second circuit, and the second circuit may be electrically connected to the sensor element.

One embodiment of the present invention is a display device including a first substrate, a second substrate, and an element layer. The element layer is positioned between the first substrate and the second substrate. The first substrate and the second substrate have flexibility. The element layer includes a display element, a sensor element, a first circuit, and a second circuit. The display element is electrically connected to the first circuit. The sensor element is electrically connected to the second circuit. The sensor element has a function of sensing distortion of the first substrate or the second substrate.

The first circuit and the second circuit may each include a transistor in which a channel formation region includes an oxide semiconductor.

The oxide semiconductor preferably contains In, Zn, and M (M is Al, Ti, Ga, Sn, Y, Zr, La, Ce, Nd, or Hf).

The oxide semiconductor preferably includes a c-axis aligned crystal.

As the sensor element, a metal thin film resistor can be used.

As the display element, an organic EL element can be used.

One embodiment of the present invention is an operation method of a display device, which includes a first step of acquiring image data to form a virtual screen; a second step of acquiring data on a shape of a display portion to form a three-dimensional shape model; a third step of acquiring positional data of a viewer to regard the three-dimensional shape model as a two-dimensional display portion and to assign a coordinate to the two-dimensional display portion; a fourth step of performing calculation to determine a portion of the display portion not seen from a position of the viewer; a fifth step of converting a coordinate of the virtual screen to the coordinate of the two-dimensional display portion; and a sixth step of outputting image data obtained in the fifth step to the display portion.

One embodiment of the present invention is an operation method of a display device, which includes a first step of acquiring image data to form a virtual screen; a second step of sensing a status of the display device and a status of a viewer; a third step of acquiring data on a shape of a display portion to form a three-dimensional shape model; a fourth step of acquiring positional data of the viewer to regard the three-dimensional shape model as a two-dimensional display portion and to assign a coordinate to the two-dimensional display portion; a fifth step of performing calculation to determine a portion of the display portion not seen from a position of the viewer; a sixth step of converting a coordinate of the virtual screen to the coordinate of the two-dimensional display portion; and a seventh step of outputting image data obtained in the sixth step to the display portion. The second to seventh steps are performed one by one.

The second step of sensing the status of the display device and the status of the viewer may include an eighth step of determining whether the shape of the display portion is changed or not; a ninth step of determining whether the position of the viewer is changed or not; and a tenth step of determining whether an image change instruction is issued or not. Here, operation proceeds to the third step when the shape of the display portion is changed in the eighth step, whereas the operation proceeds to the ninth step when the shape of the display portion is not changed in the eighth step; the operation proceeds to the fourth step when the position of the viewer is changed in the ninth step, whereas the operation proceeds to the tenth step when the position of the viewer is not changed in the ninth step; and the operation proceeds to the first step and proceeds to the sixth step after the first step is performed when the image change instruction is issued in the tenth step, whereas the operation returns to the second step when the image change instruction is not issued in the tenth step.

In the above mode of the operation method of the display device, operation of returning from the seventh step to the second step may be performed.

According to one embodiment of the present invention, a display device with high viewability can be provided. Alternatively, according to one embodiment of the present invention, a flexible display device can be provided. Alternatively, according to one embodiment of the present invention, a lightweight display device can be provided. Alternatively, according to one embodiment of the present invention, a display device with high reliability can be provided. Alternatively, according to one embodiment of the present invention, a novel display device or the like can be provided. Alternatively, according to one embodiment of the present invention, an operation method of the display device can be provided. Alternatively, according to one embodiment of the present invention, a program for operating the display device can be provided. Alternatively, according to one embodiment of the present invention, a novel semiconductor device or the like can be provided. Alternatively, according to one embodiment of the present invention, an operation method of the semiconductor device or the like can be provided. Alternatively, according to one embodiment of the present invention, a program for operating the semiconductor device or the like can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 3A and 3B are a cross-sectional view illustrating a display device and a top view illustrating a distortion sensor element.

FIGS. 27A, 27B1, 27B2, and 27C illustrate examples of structures of a sensor circuit and a converter and an example of a driving method of the sensor circuit.

DETAILED DESCRIPTION OF THE INVENTION

Figure 1A:
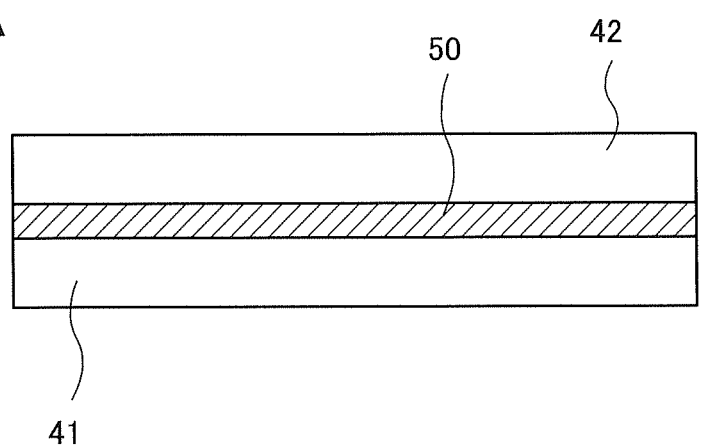
FIGS. 1A and 1B are cross-sectional views illustrating display devices.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that in this specification and the like, when it is explicitly described that X and Y are connected, the case where X and Y are electrically connected, the case where X and Y are functionally connected, and the case where X and Y are directly connected are included therein. Here, X and Y each denote an object (e.g., a device, an element, a circuit, a wiring, an electrode, a terminal, a conductive film, or a layer). Accordingly, a connection relationship other than those shown in drawings and texts is also included without limitation to a predetermined connection relationship, for example, the connection relationship shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is turned on or off (is brought into an on state or an off state) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal outputted from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit positioned therebetween), the case where X and Y are functionally connected (i.e., the case where X and Y are functionally connected with another element or another circuit positioned therebetween), and the case where X and Y are directly connected (i.e., the case where X and Y are connected without another element or another circuit positioned therebetween) are included therein. That is, when it is explicitly described that "X and Y are electrically connected", the description is the same as the case where it is explicitly only described that "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Note that the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

Embodiment 1

In this embodiment, a display device of one embodiment of the present invention will be described with reference to the drawings.

The "display device" in this specification means an image display device or a light source (including a lighting device). Further, the display device includes any of the following modules in its category: a module including a connector such as a flexible printed circuit (FPC), or tape carrier package (TCP); a module including TCP which is provided with a printed wiring board at the end thereof; and a module including a driver circuit which is directly mounted on a display element by a chip on glass (COG) method.

The display device that is one embodiment of the present invention has flexibility (flexible display device). Note that "flexible device" means that a device can be bent or warped.

FIG. 1A is a schematic diagram illustrating a cross section of a display device of one embodiment of the present invention. The display device illustrated in FIG. 1A includes a first substrate 41, a second substrate 42, and an element layer 50. The element layer 50 is provided between the first substrate 41 and the second substrate 42.

The first substrate 41 and the second substrate 42 have flexibility. It is preferable that the first substrate 41 and the second substrate 42 be formed using the same material and have the same thickness to prevent a warp due to thermal expansion or the like. Note that the two substrates and the element layer 50 can be bonded using bonding layers that are not illustrated.

The element layer 50 includes a display element, a distortion sensor element, a first circuit electrically connected to the display element, and a second circuit electrically connected to the distortion sensor element. The display device of one embodiment of the present invention includes the distortion sensor element, thereby sensing distortion of the first substrate 41 and/or the second substrate 42. As a result, the display device self-detects the shape of a display portion and can perform display suitable for the shape.

As the display element, typically, an organic EL element can be used. Instead of an organic EL element, an inorganic EL element can be used. A liquid crystal element can also be used. For example, a reflective display device can be provided by combination of a liquid crystal element and a reflective electrode. A transmissive display device can be provided by combination of a liquid crystal element and a thin light source such as an organic EL element. A semi-transmissive display device can be provided by combination of a liquid crystal element, a reflective electrode, and a thin light source.

As the distortion sensor element, typically, a metal thin film resistor can be used. The amount of distortion in the vicinity of the region where the metal thin film resistor is provided can be measured on the basis of the amount of change in the resistance of the metal thin film resistor. As the distortion sensor element, a piezoelectric element can also be used. As the piezoelectric element, an element including a piezoelectric substance such as barium titanate, lead zirconate titanate, or zinc oxide can be used.

The first circuit electrically connected to the display element can function as a pixel circuit. When the display element is an organic EL element, a circuit configuration including two transistors and one capacitor can be employed, for example. When the display element is a liquid crystal element, a circuit configuration including one transistor and one capacitor can be employed.

The second circuit electrically connected to the distortion sensor element has a function of reading the amount of change in the resistance of the distortion sensor element. The second circuit can include, for example, two or three transistors.

Figure 1B:
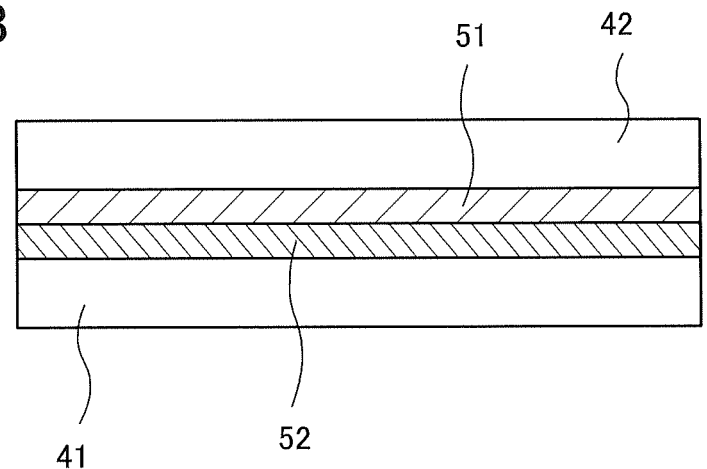

The display device of one embodiment of the present invention may have a structure illustrated in FIG. 1B. The display device illustrated in FIG. 1B includes the first substrate 41, the second substrate 42, and a first element layer 51, and a second element layer 52. The first and second element layers 51 and 52 are provided between the first substrate 41 and the second substrate 42.

The first element layer 51 includes a display element and a first circuit electrically connected to the display element. The second element layer 52 includes a distortion sensor element. A second circuit, which has a function of reading the amount of change in the resistance from the distortion sensor element, can be provided outside the display device. The second circuit may be included in the second element layer 52. The second circuit may be included in the first element layer 51.

Figure 2A:
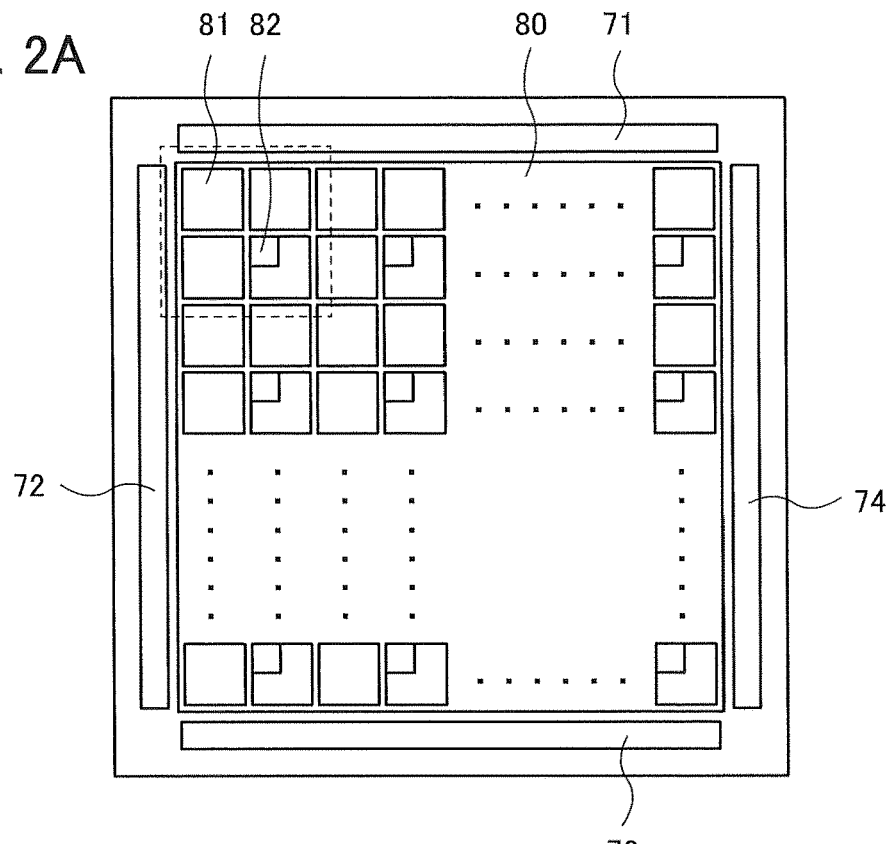
FIGS. 2A and 2B are top views illustrating a display device.

FIG. 2A is an example of a top view of a pixel portion 80 and driver circuits in the display device of one embodiment of the present invention.

The pixel portion 80 includes pixels 81 arranged in matrix and distortion sensor elements 82. The pixel 81 includes the above display element and first circuit. The first circuit is electrically connected to a circuit 71 and a circuit 72. The circuit 71 can function as a signal line driver circuit (source driver), for example. The circuit 72 can function as a scan line driver circuit (gate driver), for example.

Figure 2B:
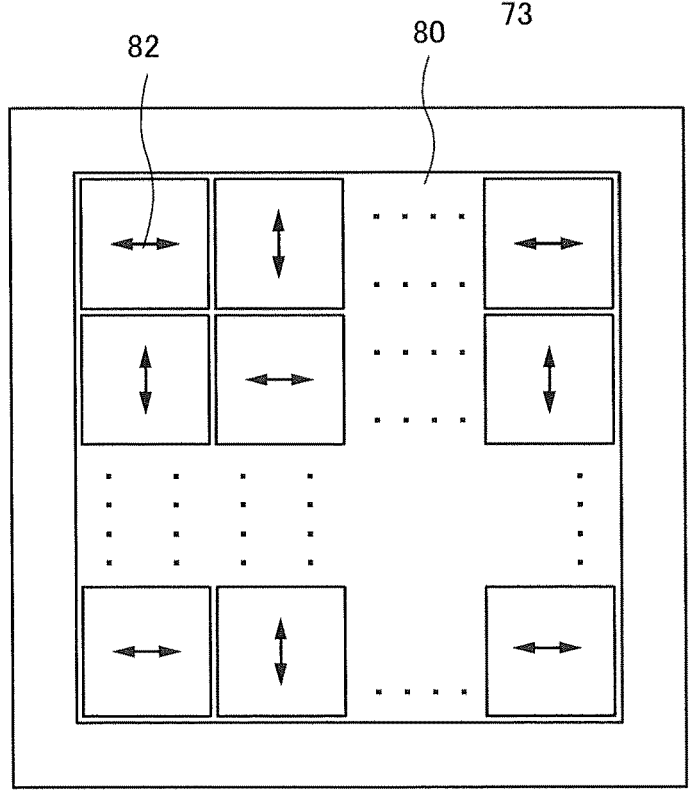

The distortion sensor element 82 is provided so as to be included in any of the pixels 81 or to overlap with any of the pixels 81. For example, as shown in FIGS. 2A and 2B, one distortion sensor element 82 can be provided for every four pixels adjacent to one another horizontally and vertically. Because the pitch of the pixels 81 is extremely small, distortion of the pixel portion 80 can be efficiently sensed when the distortion sensor element 82 is provided for every plurality of the pixels 81. It is needless to say that the number of the distortion sensors 82 may be greater than or equal to the total number of the pixels 81.

The above-described second circuit can be included in the pixel 81, can be provided to overlap with the pixel 81, or can be externally provided. A circuit 73 and a circuit 74 are a circuit selecting the distortion sensor element 82 and a circuit for reading a signal, respectively. The second circuit can also be included in any of the circuit 73 and the circuit 74.

FIG. 2B illustrates only the distortion sensor element 82 provided in the pixel portion 80. The left right arrows represent the distortion sensor elements that are arranged to be able to sense distortion in the horizontal direction, and the up down arrows represent the distortion sensor elements that are arranged to be able to sense distortion in the vertical direction. The metal thin film resistor senses distortion (bend) in a major-axis direction; thus, by being arranged such that a metal thin film resistor in facing in one direction and a metal thin film resistor facing in another direction are alternately arranged as illustrated in FIG. 2B, the metal thin film resistors can accurately read data on change in shape in both the horizontal direction and the vertical direction. When change in only one of the horizontal direction and the vertical direction needs to be read out, the distortion sensor elements 82 are arranged only in the corresponding direction. In addition, the distortion sensor elements facing in the direction corresponding to the horizontal direction may overlap with those facing in the direction corresponding to the vertical direction.

FIG. 3A is an example of a cross-sectional view of a display device that includes an organic EL element as a display element. Note that FIG. 3A illustrates part of typical structures in a region 302 including a display element of the pixel 81, a region 303 including the distortion sensor element 82, a region 304 including the circuit 71, and a flexible printed circuit (FPC) connection region 305. FIG. 3B is a top view of the distortion sensor element 82, with which change in shape in the direction indicated by the up down arrow can be sensed. Note that although not illustrated, regions including the circuits 72 to 74 can have a structure similar to that of the region 304.

In the display device illustrated in FIG. 3A, which is one example of the display device illustrated in FIG. 1A, the first substrate 41, an insulating film 321a, the element layer 50, an insulating film 321b, and the second substrate 42 are stacked in this order. Note that bonding layers or the like that are not illustrated may be provided between the first substrate 41 and the insulating film 321a and between the insulating film 321b and the second substrate 42. Furthermore, a touch sensor may be provided.

As the insulating film 321a and the insulating film 321b, a single layer of a silicon oxide film, a silicon oxynitride film, a silicon nitride film, or a silicon nitride oxide film, or a stacked layer including any of the films can be used.

In FIG. 3A, the element layer 50 includes a transistor 350, a transistor 352, a transistor 354, the distortion sensor element 82, an insulating film 364, an insulating film 368, a planarization insulating film 370, a connection electrode 360, a conductive film 372, a conductive film 374, an insulating film 334, a sealing layer 432, a coloring layer 336 (color filter), and a light-blocking layer 338 (black matrix). The element layer 50 is sealed with the first substrate 41, the second substrate 42, the sealing layer 432, and a sealant 312. Note that there is a case where part of the above components is not included or a component other than the above components is included in the element layer 50.

The insulating film 364 can be formed using, for example, silicon oxide or silicon oxynitride. The insulating film 364 is preferably formed using an oxide insulating film containing oxygen in excess of that in the stoichiometric composition. The insulating film 368 has a function of blocking oxygen, hydrogen, water, an alkali metal, an alkaline earth metal, or the like. For example, a nitride insulating film is preferably used.

The planarization insulating film 370 can be formed using a heat-resistant organic material, such as a polyimide resin, an acrylic resin, a polyimide amide resin, a benzocyclobutene resin, a polyamide resin, or an epoxy resin. Note that the planarization insulating film 370 may be formed by stacking a plurality of insulating films formed using these materials.

In the region 302, the transistor 350 is included in the first circuit and is electrically connected to an organic EL element 480. The organic EL element 480 includes the conductive film 372, an EL layer 446, and the conductive film 374. The display device illustrated in FIG. 3A is capable of displaying an image by light emission from the EL layer 446 included in the organic EL element 480.

An insulating film 430 is provided over the conductive film 372 over the planarization insulating film 370. The insulating film 430 covers part of the conductive film 372. A conductive film with high properties of reflecting light emitted from the EL layer 446 is used for the conductive film 372, and a conductive film with high properties of transmitting the light is used for the conductive film 374, whereby the organic EL element 480 can have a top emission structure. Alternatively, a conductive film with high properties of transmitting the light is used for the conductive film 372, and a conductive film with high properties of reflecting the light is used for the conductive film 374, whereby the organic EL element 480 can have a bottom emission structure. Further alternatively, a conductive film with high properties of transmitting the light is used for both the conductive film 372 and the conductive film 374, whereby a dual emission structure can be obtained.

For the insulating film 430, an organic resin or an inorganic insulating material can be used, for example. As the organic resin, for example, a polyimide resin, a polyamide resin, an acrylic resin, a siloxane resin, an epoxy resin, or a phenol resin can be used. As the inorganic insulating material, silicon oxide, or silicon oxynitride can be used, for example.

The coloring layer 336 is provided to overlap with the organic EL element 480, and the light-blocking layer 338 is provided to overlap with the insulating film 430. The coloring layer 336 and the light-blocking layer 338 are covered with the insulating film 334. A space between the organic EL element 480 and the insulating film 334 is filled with the sealing layer 432.

For the sealing layer 432, a solid sealing material with flexibility can be used. For example, a glass material such as a glass frit, or a resin material such as a resin, which is curable at room temperature (e.g., a two-component-mixture-type resin), a light curable resin, or a thermosetting resin can be used.

Although a structure with the coloring layer 336 is described as the display device in FIG. 3A, the structure is not limited thereto. In the case where the EL layers 446 with different emission colors are selectively formed, the coloring layer 336 is not necessarily provided. The color of the coloring layer 336 is not limited to three colors of R (red), G (green), and B (blue). For example, four pixels of an R pixel, a G pixel, a B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different between respective dots of the color elements. Embodiments of the disclosed invention are not limited to a display device for color display; the disclosed invention can also be applied to a display device for monochrome display.

Each of the first substrate 41 and the second substrate 42 is preferably formed using a material with high toughness. Thus, a display device with high impact resistance that is less likely to be broken can be provided. For example, when an organic resin substrate is used as the first substrate 41 and the second substrate 42, the display device can be lightweight and unlikely to broken as compared to the case where a glass substrate is used as the substrate.

For the first substrate 41 and the second substrate 42, for example, a material selected from the following can be used: glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polyether etherketone (PEEK) resin. In particular, a material whose thermal expansion coefficient is low is preferred, and for example, a polyamide imide resin, a polyimide resin, or PET is preferably used. A substrate in which a glass fiber is impregnated with an organic resin or a substrate whose thermal expansion coefficient is reduced by mixing an organic resin with an inorganic filler can also be used.

In the region 303, the transistor 352 can be included in the second circuit. Electrodes of the distortion sensor element 82 are electrically connected to the respective wirings. One of the wirings is electrically connected to a gate electrode of the transistor 352.

In the region 304, the transistor 354 can be included in the circuit 71. Although the transistor 350, the transistor 352, and the transistor 354 have the same size (e.g., channel length and channel width) in the drawing, one embodiment of the present invention is not limited thereto. The transistors can have their appropriate sizes. The same applies to the circuits 72 to 74.

Furthermore, although the circuit 71 is provided in the region 304 in FIG. 3A, the circuit may be formed by mounting an IC chip by chip on glass (COG) or the like. Alternatively, the circuit may be connected to a TCP or the like. The same applies to the circuits 72 to 74.

The FPC connection region 305 includes the connection electrode 360, an anisotropic conductive film 380, and an FPC 316. The connection electrode 360 can be formed in a step of forming the source electrode layer and the drain electrode layer of the transistor. The connection electrode 360 is electrically connected to a terminal included in the FPC 316 through the anisotropic conductive film 380.

Note that the distortion sensor element 82 senses change in resistance due to expansion and contraction of the metal thin film; thus, one surface and the other surface of the metal thin film are preferably in contact with different materials having the respective mechanical properties (e.g., elastic modulus, bending strength, a Young's modulus, Poisson's ratio, or hardness) so that the metal thin film can easily expand and contract. For example, in the structure in FIGS. 3A and 3B, one surface is in contact with the planarization insulating film 370, and the other surface is in contact with the insulating film 430. Here, since the planarization insulating film 370 and the insulating film 430 are formed using materials with different mechanical properties, the surface on which the metal thin film can expand and contract relatively easily is determined. Therefore, for example, the metal thin film expands when the shape is changed to be convex, and the metal thin film contracts when the shape is changed to be concave. Accordingly, the direction of change in shape can be sensed on the basis of the resistance when the metal thin film expands and the resistance when the metal thin film contracts.

Figure 4:
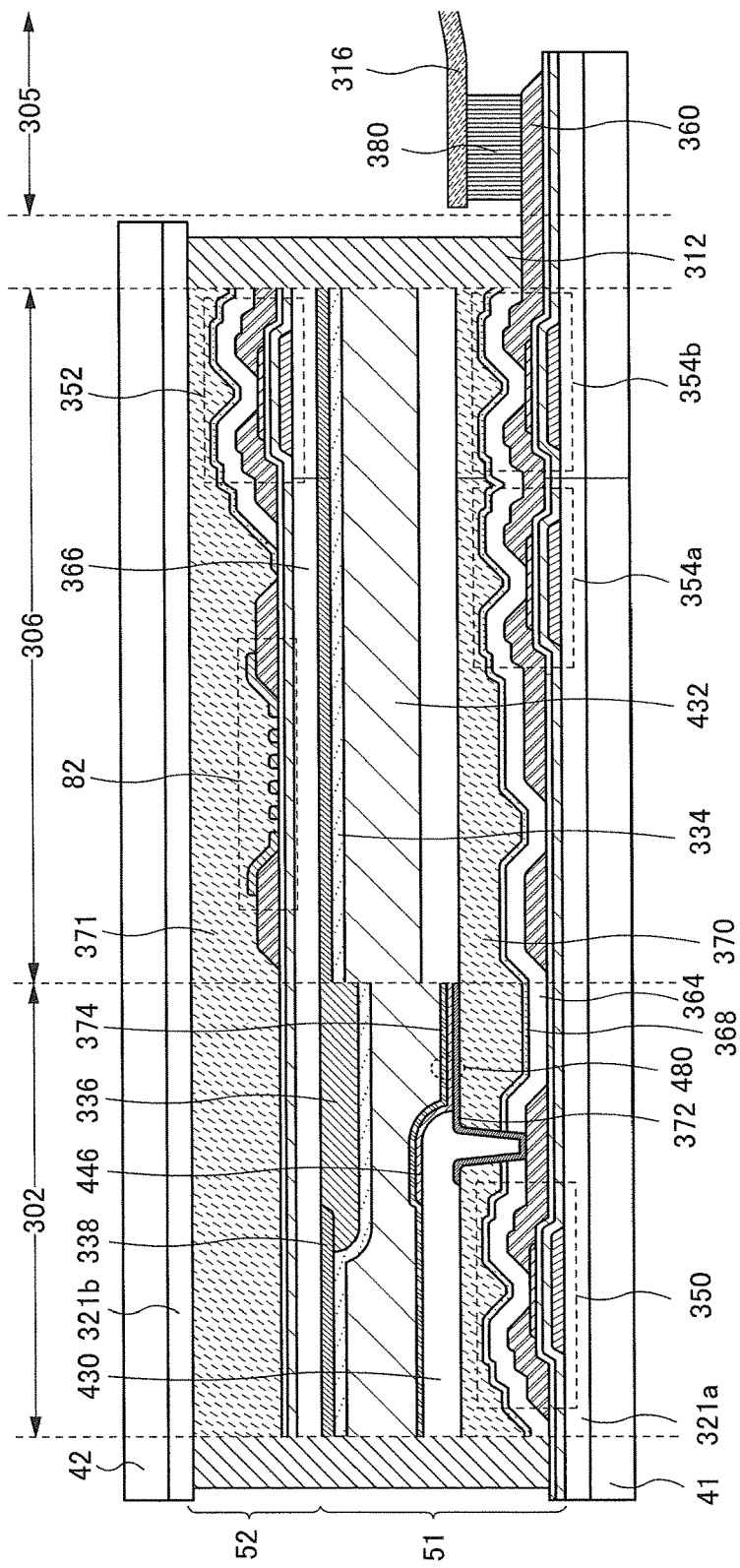
FIG. 4 is a cross-sectional view illustrating a display device.

The display device of one embodiment of the present invention may have a structure illustrated in the cross-sectional view in FIG. 4. The display device illustrated in FIG. 4 is an example of the display device in FIG. 1B and includes a region 306 in which the region 303 and the region 304 of the display device illustrated in FIG. 3A are stacked.

In a lower layer of the region 306, a transistor 354a and a transistor 354b are provided and these transistors can be included in any of the circuits 71 to 74.

In an upper layer of the region 306, which is provided over the lower layer with an insulating layer 366 positioned therebetween, the distortion sensor element 82, the transistor 352, and a planarization insulating film 371 are provided.

The planarization insulating film 371 can be formed using a material similar to that for the planarization insulating film 370.

In the region 302, the distortion sensor element 82 and the transistor 352 may be formed on a surface opposite to the surface through which light from the organic EL element 480 is emitted. Note that the circuit including the transistor 352 may be provided in an external IC chip. In other words, a structure in which the transistor 352 is not provided in the upper layer of the region 306 may be employed.

In the structures illustrated in FIGS. 3A and 3B and FIG. 4, two or more distortion sensor elements may be provided at different heights (in the thickness direction) between the first substrate 41 and the second substrate 42. The distortion sensor element may be provided over the first substrate 41, the second substrate 42, or both the first substrate 41 and the second substrate 42.

The transistor in the above display device is preferably a transistor whose channel formation region is provided in an oxide semiconductor layer.

Since the transistor using an oxide semiconductor layer has high mobility, an area occupied by transistors can be made small, and the aperture ratio can be increased. With use of the transistor, the circuits 71 to 74 can be formed over the substrate provided with the pixel portion 80. In addition, the transistor has extremely low off-state current and can hold a video signal or the like for a longer period; thus, the frame frequency can be lowered, and the power consumption of the display device can be reduced.

Furthermore, a transistor including an oxide semiconductor layer is preferably used as the transistor electrically connected to the distortion sensor element 82. By the use of a transistor with an extremely low off-state current as the transistor, electric charge which is unnecessarily input and output into and from an output wiring or the like can be inhibited.

The oxide semiconductor layer preferably includes a c-axis aligned crystal. In the case where the oxide semiconductor layer including the crystal is used for a channel formation region of the transistor, a crack or the like is less likely to occur in the oxide semiconductor layer when the display device 300 is bent, for example. As a result, the reliability can be improved.

Note that the transistor including an oxide semiconductor layer is merely an example, and a transistor including an amorphous silicon layer or a polycrystalline silicon layer can also be used. Alternatively, a transistor including an organic semiconductor may be used. Examples of an organic semiconductor include acenes such as tetracene and pentacene, oligothiophene derivatives, phthalocyanines, perylene derivatives, rubrene, $Alq_3$, TTF-TCNQ, polythiophene (e.g., poly(3-hexylthiophene) (P3HT)), polyacetylene, polyfluorene, polyphenylene vinylene, polypyrrole, polyaniline, anthracene, tetracyanoquinodimethane (TCNQ), and poly-paraphenylene vinylene (PPV).

Figure 5:
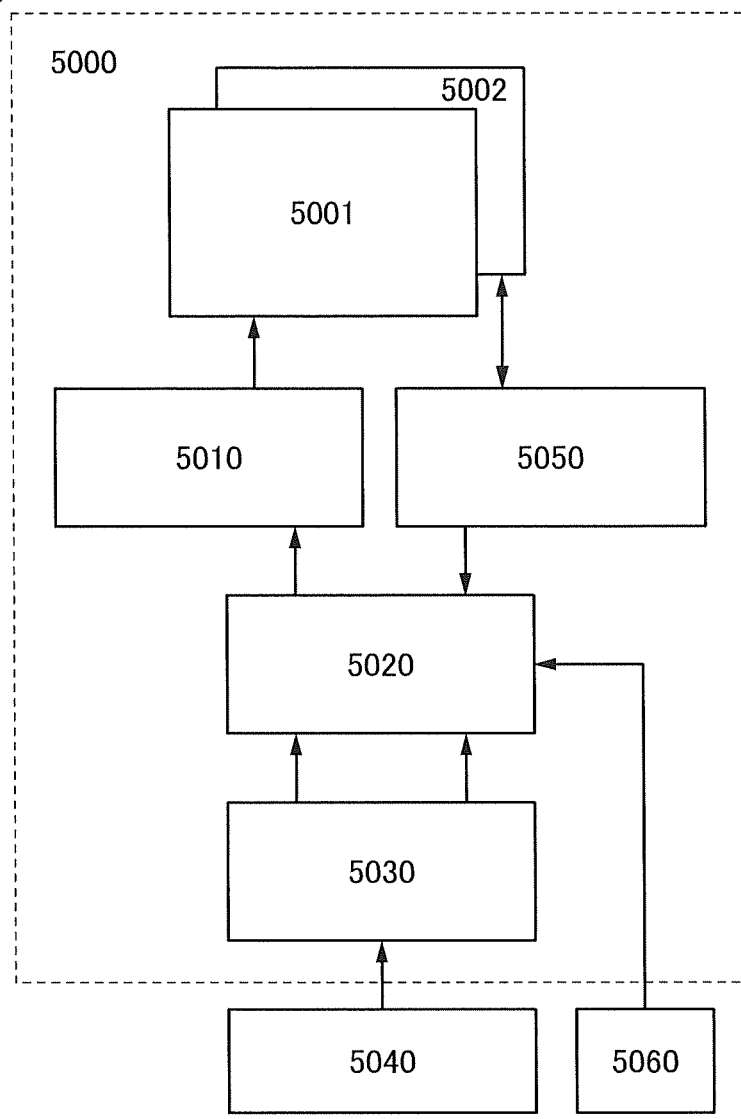
FIG. 5 is a block diagram illustrating a display device.

FIG. 5 is an example of a block diagram of a display device of one embodiment of the present invention. A display device 5000 includes a display portion 5001, a distortion sensor portion 5002, a circuit 5010, a circuit 5020, a circuit 5030, and a circuit 5050. Note that a structure may be employed in which components other than the display portion 5001 and the distortion sensor portion 5002 are not provided in the display device 5000 and externally provided. To the display device 5000, various circuits such as a control circuit, an arithmetic circuit, a power supply circuit, and a memory circuit that are not shown in the drawing can be connected.

Here, the circuit 5010 can have a function of controlling the display portion. The circuit 5020 can have a function of image processing. The circuit 5030 can have a function of converting an image signal. The circuit 5050 can have a function of controlling the distortion sensor portion 5002.

For example, an analog video signal outputted from a video signal output device 5040 such as a camera or an image reproducing device is inputted to the circuit 5030 to be converted into a digital video signal. The digital video signal is transmitted to the display portion 5001 through the circuit 5020 and the circuit 5010, so that the display portion 5001 displays an image.

The shape of the display portion 5001 having flexibility is sensed in the distortion sensor portion 5002 and data on the shape is inputted to the circuit 5020 through the circuit 5050.

The circuit 5020 performs processing related to data on the shape of the display portion. When signals obtained from the distortion sensor portion 5002 are arranged two-dimensionally, data on the shape of the display portion 5001 can be obtained. Note that depending on the usage, data on the shape only in the horizontal direction or the vertical direction of the display portion 5001 may be obtained. An image signal corresponding to the shape of the display portion is outputted to the circuit 5010.

Note that a signal specifying a display mode of an image may be inputted from a control device 5060 to the circuit 5020. The control device 5060 can also be operated by a viewer. The control device 5060 has a sensing function with respect to a viewer and can control the circuit 5020 such that an image with high viewability is automatically displayed toward the viewer. Note that the control device 5060 may be included in the display device 5000. The control device 5060 can input a signal to the display device 5000 by wireless communication.

In the above manner, the display device of one embodiment of the present invention can self-detect the shape of the display portion. Moreover, a suitable image can be displayed in accordance with the shape of the display portion.

Figure 6A:
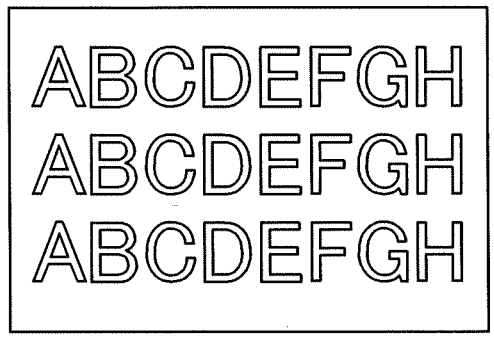
FIGS. 6A to 6F illustrate display modes.

An example of a display mode for the display device of one embodiment of the present invention at the time when the shape of the display portion is changed is described. Note that in the initial state, the display portion is substantially flat and performs or is capable of performing image display as shown in FIG. 6A.

Figure 6B:
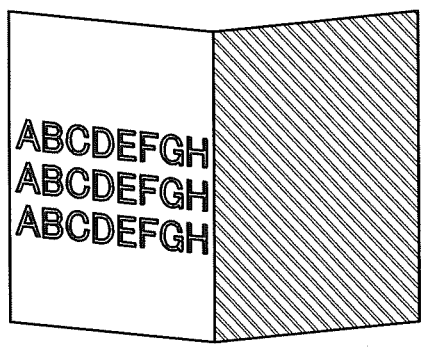
Figure 6C:

For example, in the case where the display portion is divided into two by being mountain-folded or valley-folded, an image can be displayed in reduced form on only one display portion, as illustrated in FIG. 6B. Display can be switched from a portrait mode (in FIG. 6B) to a landscape mode (in FIG. 6C). Here, the other display portion, which does not perform display, is in an off state, whereby power consumption can be reduced. Note that the bending position of the display portion and the number of divisions formed by bending are not limited.

Figure 6D:
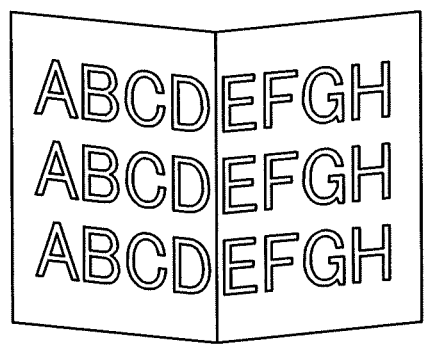
Figure 6E:
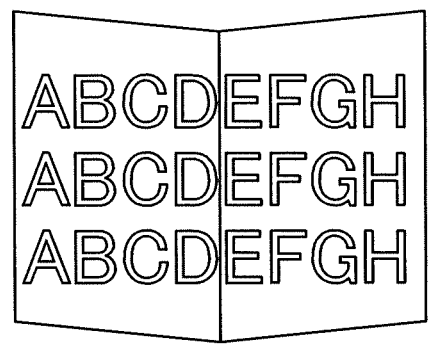

In the case where an image in the initial state is displayed on the display portion divided into two as described above, an image is viewed as if distorted as illustrated in FIG. 6D when viewed from a specific direction, resulting in low viewability. However, when an image that is changed in shape is displayed as illustrated in FIG. 6E, the viewability of the image when viewed from the same direction can be improved.

Figure 6F:
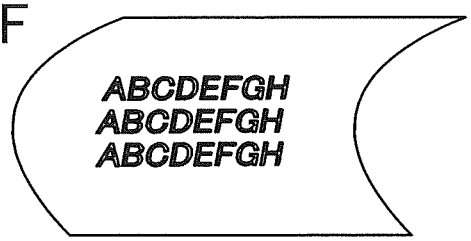

When the display portion is bent to have a curved surface, an image can be displayed in reduced form in a region of the display portion that can be easily viewed, as illustrated in FIG. 6F.

Figure 7A:
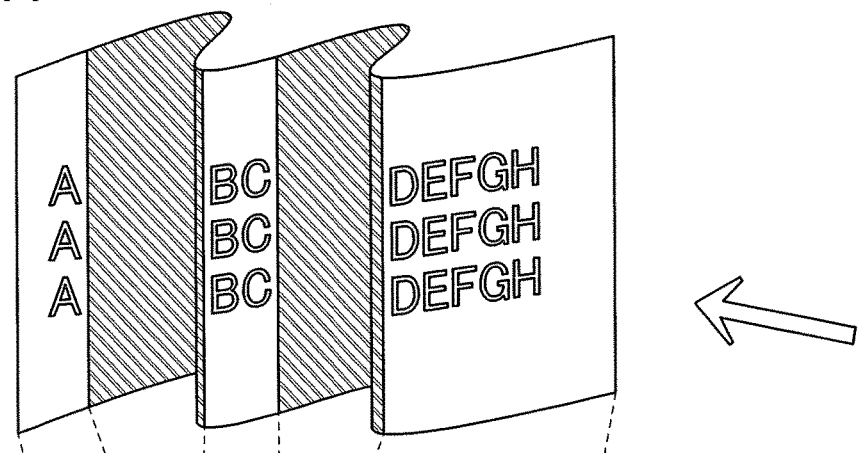
FIGS. 7A and 7B illustrate a display mode.
Figure 7B:
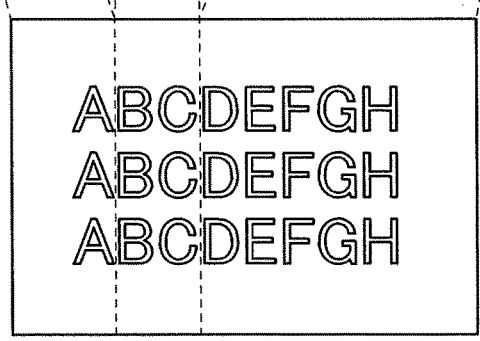

In the case where the display portion has a wavy shape as illustrated in FIG. 7A and a viewer views the display portion from the direction indicated by the arrow, display in a region not seen from the position of the viewer can be turned off, and display can be performed in a region that can be seen by the viewer. When display is performed in such a manner, the viewer can view an image with high viewability as illustrated in FIG. 7B. In addition, an image can be changed in accordance with the shape of the display portion; thus, even when the shape of the display portion is constantly changed, the viewer can view an image with high viewability.

Note that in the display portion divided into two or more by bending or the like, a region in which image display is performed, a region in which image display is turned off, and a region in which an image is changed in shape can be set as appropriate. For example, there are a method in which the region where the above operation is performed is set in advance and a method in which the region where the above operation is performed is switched by a function using a touch sensor or a distortion sensor or the like. A method in which the region where the above operation is performed is automatically set with the use of a sensor that senses the position of the viewer can also be used. Note that the sensor corresponds to the control device 5060 in FIG. 5.

The structure described in this embodiment can be used in appropriate combination with the structure described in any of the other embodiments.

Embodiment 2

In this embodiment, an example of a method for performing the display in Embodiment 1, which is described with reference to FIGS. 7A and 7B, with the use of the display device of one embodiment of the present invention will be described.

Figure 32:
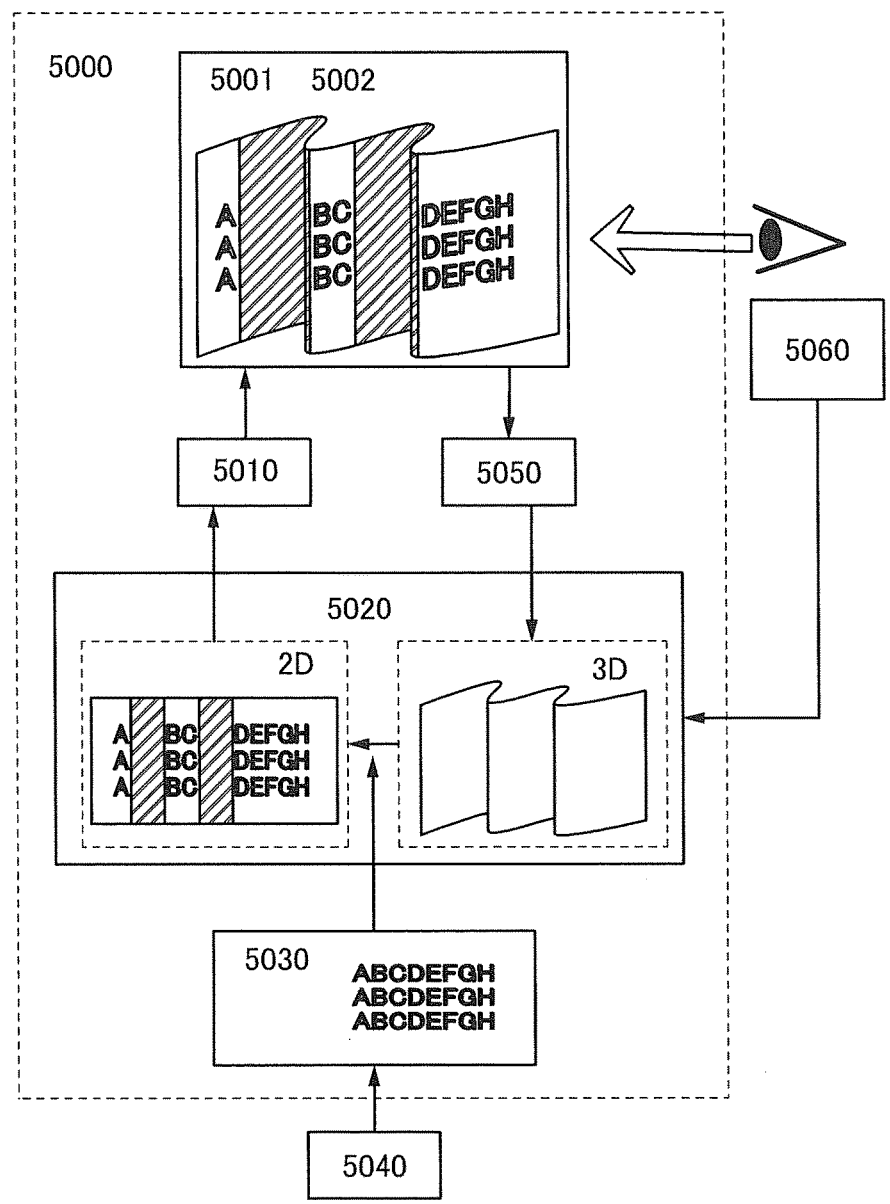
FIG. 32 illustrates operation of a display device.
Figure 33:
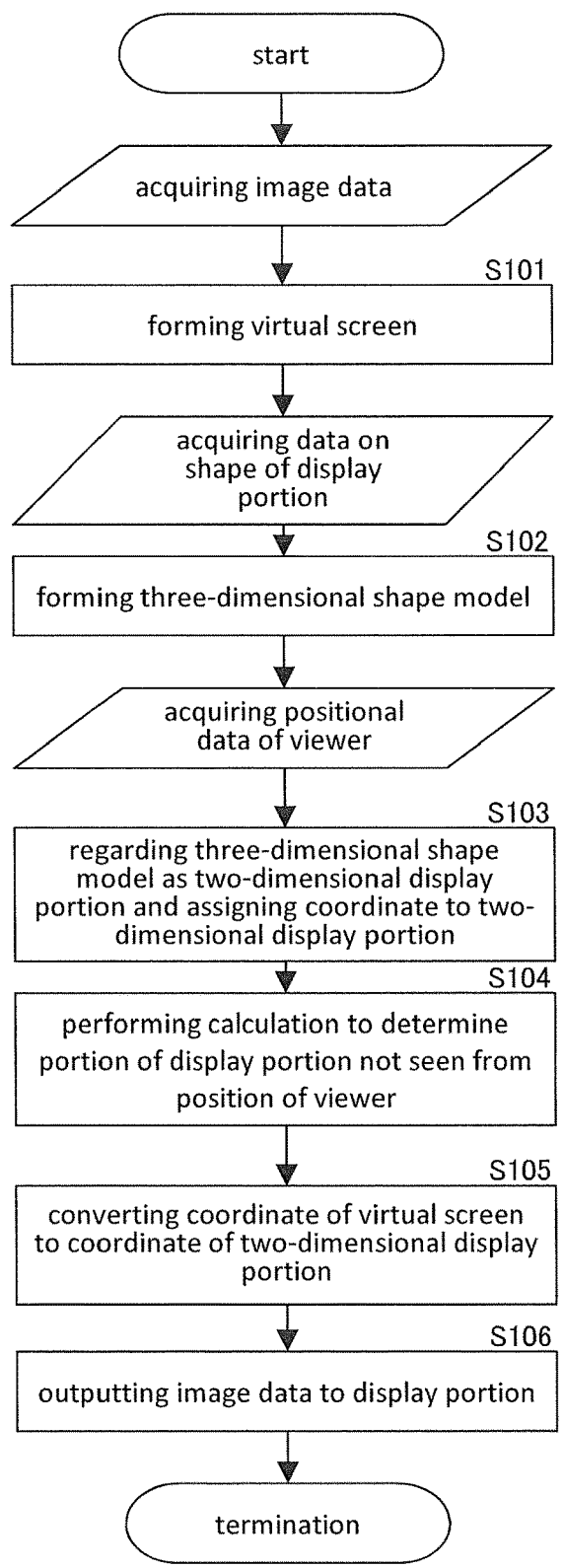
FIG. 33 is a flow chart of operation of a display device.

FIG. 32 illustrates, using the block diagram in FIG. 5, the flow of processing for performing the display in FIGS. 7A and 7B. A flow chart in FIG. 33 shows the flow illustrated in FIG. 32. Note that the flow chart in FIG. 33 mainly illustrates operation in the circuit 5020.

Image data inputted from the video signal output device 5040 to the circuit 5030 is inputted to the circuit 5020; then, the circuit 5020 forms a virtual screen (S101). The virtual screen is regarded as a screen on which an image that a viewer can see most easily is displayed, and corresponds to, for example, a screen on which an image as illustrated in FIG. 6A is displayed. It can be said that this state is one in which the viewer views an image displayed on a flat screen in the front.

Next, from the display portion 5001 (which includes the distortion sensor portion 5002) with a given shape, the circuit 5020 extracts data on the shape through the circuit 5050 and forms a three-dimensional shape model of the display portion 5001 (S102).

Then, the circuit 5020 extracts positional data of the viewer from the control device 5060. Note that S101, S102, and the extraction of the positional data of the viewer are not necessarily performed in the above order and may be performed in parallel with one another or may be performed one by one in no particular order.

Then, the circuit 5020 regards the above three-dimensional shape model viewed from the viewer as a two-dimensional display portion and assigns coordinates to the two-dimensional display portion (S103).

A portion of the display portion 5001 not seen from the position of the viewer is determined by calculation (S104).

Then, the circuit 5020 converts coordinates of the virtual screen to the coordinates of the above two-dimensional display portion (S105).

Image data processed in the above manner is transmitted to the display portion 5001 through the circuit 5010 and display is performed. At this time, display on the portion of the display portion 5001 not seen from the position of the viewer can be turned off (S106).

Next, description is made on processing that is performed when an anticipated change in status (interruption) occurs in a state where, for example, an image is displayed on the display portion 5001 as a result of the above-described processing. Here, processing in response to change in the shape of the display portion 5001, change in the position of the viewer, and an image change instruction, each of which is interruption, is described with reference to the flow chart in FIG. 34.

Figure 34:
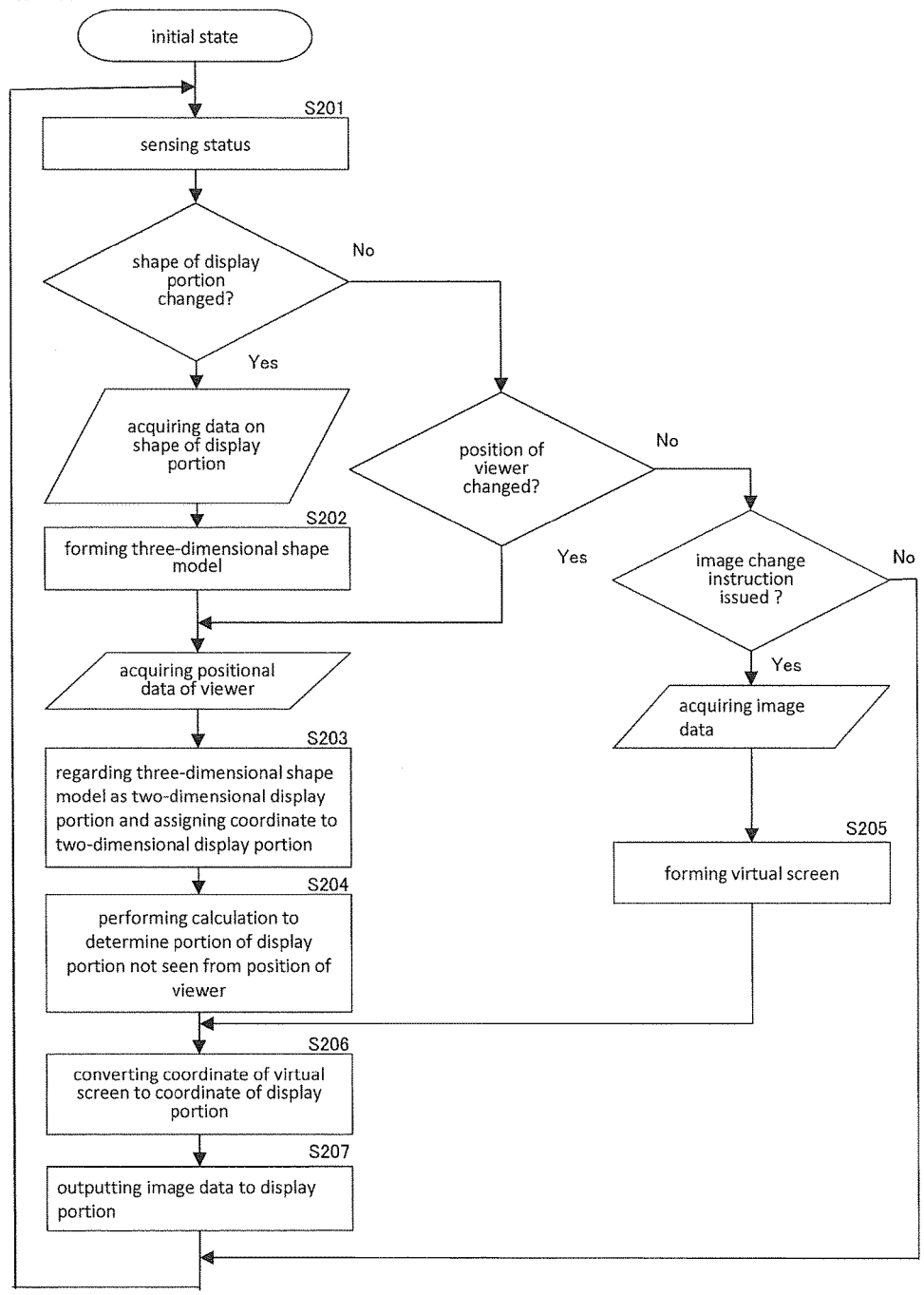
FIG. 34 is a flow chart of operation of a display device.

In the flow chart in FIG. 34, the initial state is the state where an image is displayed by the processing shown in the flow chart in FIG. 33. Note that the initial state may be a state where no image is displayed. In this state, the display device 5000 senses the status (S201).

First, whether change in the shape of the display portion 5001, which is interruption, occurs or not is determined. In the case where the shape of the display portion 5001 is changed, data on the shape of the display portion 5001 is extracted and the operation proceeds to a step of forming a new three-dimensional shape model (S202).

In the case where the shape of the display portion 5001 is not changed, whether the position of the viewer is changed or not is determined. In the case where the position of the viewer is changed, positional data of the viewer is extracted and the three-dimensional shape model is regarded as a new two-dimensional display portion; then, the operation proceeds to a step of assigning coordinates to the two-dimensional display portion (S203). After the step of S203, the steps of S204, S206, and S207 are performed one by one.

In the case where the position of the viewer is not changed, whether an image change instruction is issued or not is determined. In the case where an image change instruction is issued, new image data is acquired and the operation proceeds to a step of forming a virtual screen (S205). After the step of S205, the steps of S206 and S207 are performed one by one.

When an image change instruction is not issued as interruption, the operation returns to S201 to deal with the next interruption. The operation may be terminated without returning to S201. Note that S201 may be performed by the viewer at a given timing or may be performed at regular intervals with the use of a timer or the like. Alternatively, the steps from S201 to S207 may be repeated.

Figure 35:
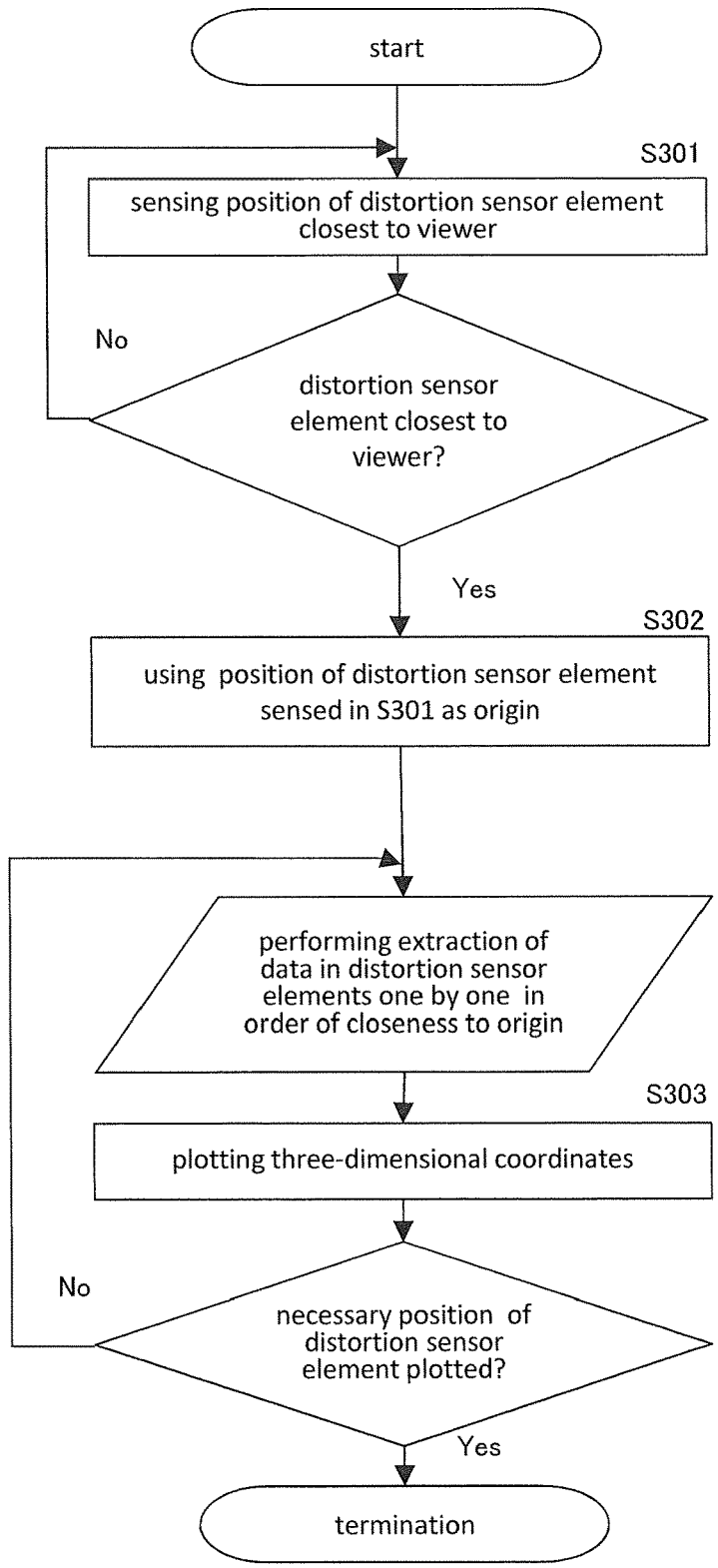
FIG. 35 is a flow chart of operation of a display device.

The above three-dimensional shape model can be formed in accordance with the flow chart in FIG. 35.

First, the control device 5060 or the like is used to sense the position of the distortion sensor element that is closer to the viewer than any other distortion sensor elements provided in the distortion sensor portion 5002 overlapping with the display portion 5001 are (S301). Note that there is no limitation on the kind and position of a sensor to sense the position of the distortion sensor element that is the closest to the viewer. For example, the sensor may be provided to be in contact with the display portion 5001.

With the use of the position of the distortion sensor element sensed in S301 as an origin (S302), extraction of data is performed in the distortion sensor elements one by one in order of closeness to the origin. Note that the distortion sensor element from which data is extracted may be all the distortion sensor elements included in the display device 5000 or may be only the distortion sensor element positioned in a specified position.

Then, three-dimensional coordinates are plotted in accordance with the distance from the origin to the distortion sensor element from which data is extracted and data on distortion of the distortion sensor element (S303). In the above manner, the three-dimensional shape model can be formed.

The display device 5000 may have a program in which the steps in the above-mentioned flow charts are written. Alternatively, the control device that controls the display device 5000 may have the program. Further alternatively, the program may be stored in a memory medium.

The structure described in this embodiment can be used in appropriate combination with the structure described in any of the other embodiments.

Embodiment 3

In this embodiment, the distortion sensor element and the second circuit having a function of reading the amount of change in resistance of the distortion sensor element which are described in Embodiment 1, will be described in more detail. Note that in this embodiment, the second circuit electrically connected to the distortion sensor element is called a distortion sensor circuit.

Figure 8A:
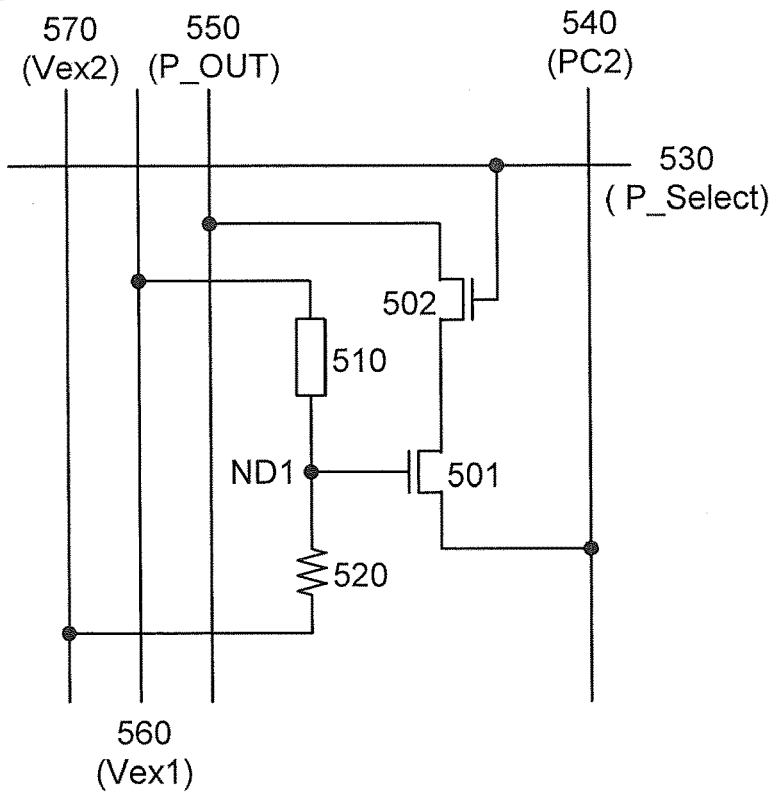
FIGS. 8A and 8B illustrate distortion sensor circuits.

FIG. 8A illustrates an example of a distortion sensor circuit that includes, as a distortion sensor element, a variable resistor such as a metal thin film resistor. The distortion sensor circuit includes a transistor 501, a transistor 502, a variable resistor 510, and a resistor 520.

One of a source and a drain of the transistor 501 is electrically connected to a wiring 540, and the other of the source and the drain is electrically connected to one of a source and a drain of the transistor 502. The other of the source and the drain of the transistor 502 is electrically connected to a wiring 550, and a gate thereof is electrically connected to a wiring 530. One terminal of the variable resistor 510 is electrically connected to a wiring 560, and the other terminal thereof is electrically connected to one terminal of the resistor 520 and a gate of the transistor 501. The other terminal of the resistor 520 is electrically connected to a wiring 570.

Here, the wiring 530 can function as a selection signal line of the distortion sensor circuit. The wiring 540 can function as a high power supply potential line. The wiring 550 can function as an output signal line. The wiring 560 can function as a high power supply potential line. The wiring 570 can function as a low power supply potential line. Note that the wiring 560 may be a low power supply potential line and the wiring 570 may be a high power supply potential line.

Conduction and non-conduction of the transistor 501 are controlled with the potential of a node ND1, and conduction and non-conduction of the transistor 502 are controlled with the potential of the wiring 530.

For example, with the assumption that a potential $V_{pc2}$ of the wiring 540 and the initial potential $V_{ini}$ of the wiring 550 satisfy $V_{ini} < V_{pc2}$, when the potential of the wiring 530 is at the "H" level and the transistor 502 is on, the potential $V_{out}$ of the wiring 550 depends on whether the transistor 501 is on or off. In other words, the potential $V_{out}$ of the wiring 550 depends on the potential $V1$ of the node ND1, which is the gate potential of the transistor 501.

The potential of the node ND1 depends on the resistance R1 of the variable resistor 510 and the resistance R2 of the resistor 520. In other words, the potential V1 of the node ND1 can be expressed by the formula below where Vex1 represents the potential of the wiring 560 and Vex2 represents the potential of the wiring 570.

$$V1 = \frac{R2}{R1+R2}Vex1 + \frac{R1}{R1+R2}Vex2 \qquad \text{[Formula 1]}$$

According to the above formula, V1 decreases when the resistance R1 of the variable resistor 510 changes in the positive direction, and V1 increases when the resistance R1 of the variable resistor 510 changes in the negative direction. In the distortion sensor circuit, the potential corresponding to V1 is outputted to the wiring 550. Thus, the amount of distortion of the variable resistor 510 can be known from the potential outputted to the wiring 550.

Figure 8B:
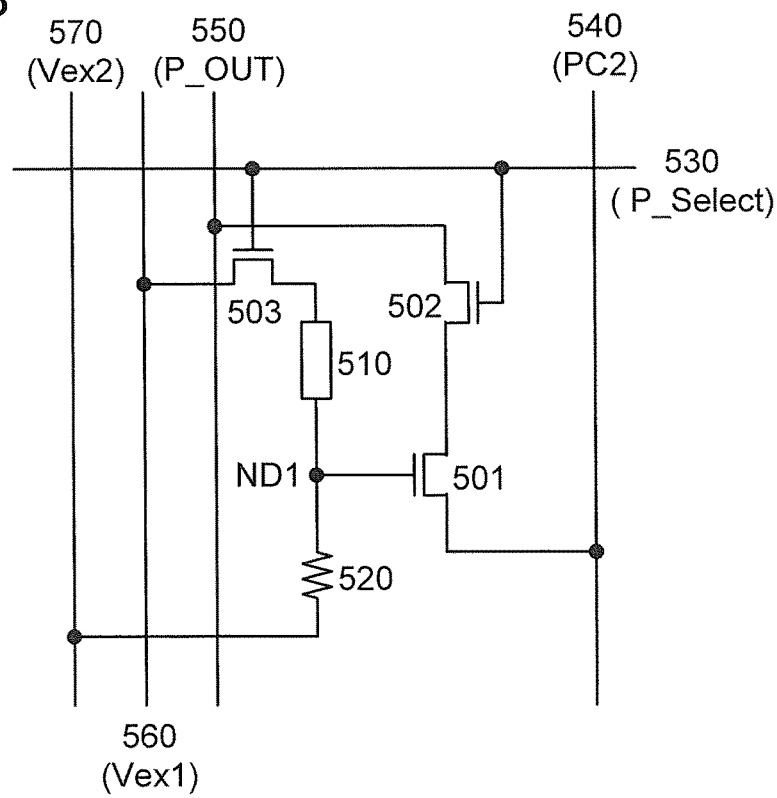

Note that the distortion sensor circuit of one embodiment of the present invention may have a structure illustrated in FIG. 8B. The distortion sensor circuit in FIG. 8B is different from the distortion sensor circuit in FIG. 8A in that it includes a transistor 503. One of a source and a drain of the transistor 503 is electrically connected to one terminal of the variable resistor 510, and the other of the source and the drain is electrically connected to the wiring 560. A gate of the transistor 503 is electrically connected to the wiring 530.

The transistor 503 is on only when the potential of the wiring 530 is at the "H" level, i.e., when the distortion sensor circuit is selected. Therefore, the transistor 503 is off when the potential of the wiring 530 is at the "L" level, whereby current unnecessarily flowing between the wiring 560 and the wiring 570 can be suppressed.

Figure 9:
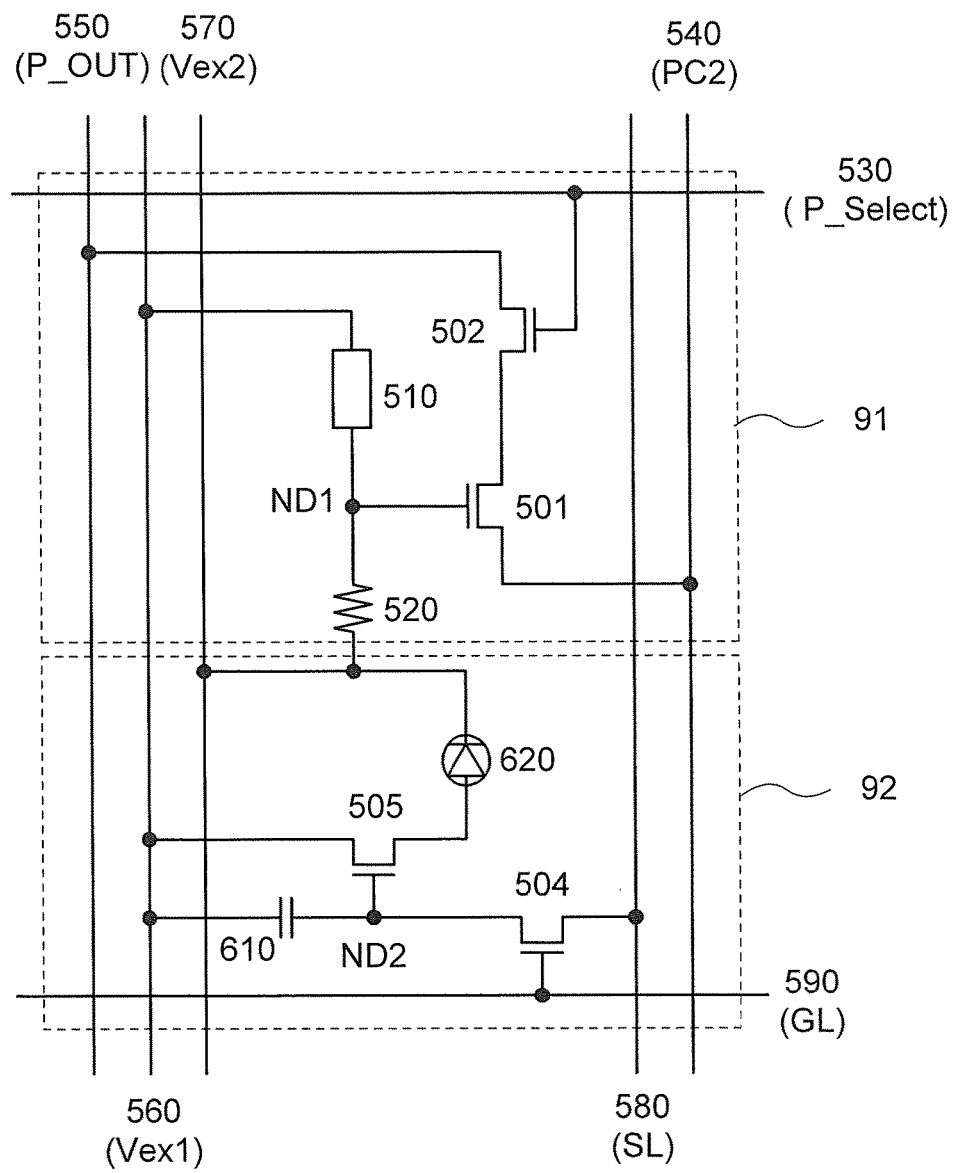
FIG. 9 illustrates a distortion sensor circuit and a pixel circuit.

FIG. 9 illustrates an example of a circuit in which a distortion sensor circuit portion 91, which is similar to the circuit in FIG. 8A, and a pixel circuit portion 92 including an organic EL element are combined. The pixel circuit portion 92 includes a transistor 504, a transistor 505, a capacitor 610, and an organic EL element 620.

One of a source and a drain of the transistor 504 is electrically connected to a wiring 580, and the other of the source and the drain is electrically connected to a gate of the transistor 505 and one terminal of the capacitor 610. A gate of the transistor 504 is electrically connected to a wiring 590. The other terminal of the capacitor 610 and one of a source and a drain of the transistor 505 are electrically connected to the wiring 560. The other of the source and the drain of the transistor 505 is electrically connected to one terminal of the organic EL element 620, and the other terminal of the organic EL element 620 is electrically connected to the wiring 570.

In the circuit illustrated in FIG. 9, the other terminal of the organic EL element 620 and the other terminal of the resistor 520 can be electrically connected to each other.

Here, the wiring 580 can function as a signal line inputting an image signal to the pixel circuit portion 92. The wiring 590 can function as a selection signal line of the pixel circuit portion 92.

The transistor 504 is turned on when the potential of the wiring 590 is set at the "H" level, whereby data corresponding to the potential of the wiring 580 can be written into the node ND2. When the potential of the wiring 590 is set at the "L" level, the data in the node ND2 can be stored.

Conduction and non-conduction of the transistor 505 is controlled with the potential of the node ND2. Accordingly, whether the organic EL element 620 emits light or not can be controlled with the potential of the node ND2.

Figure 10:
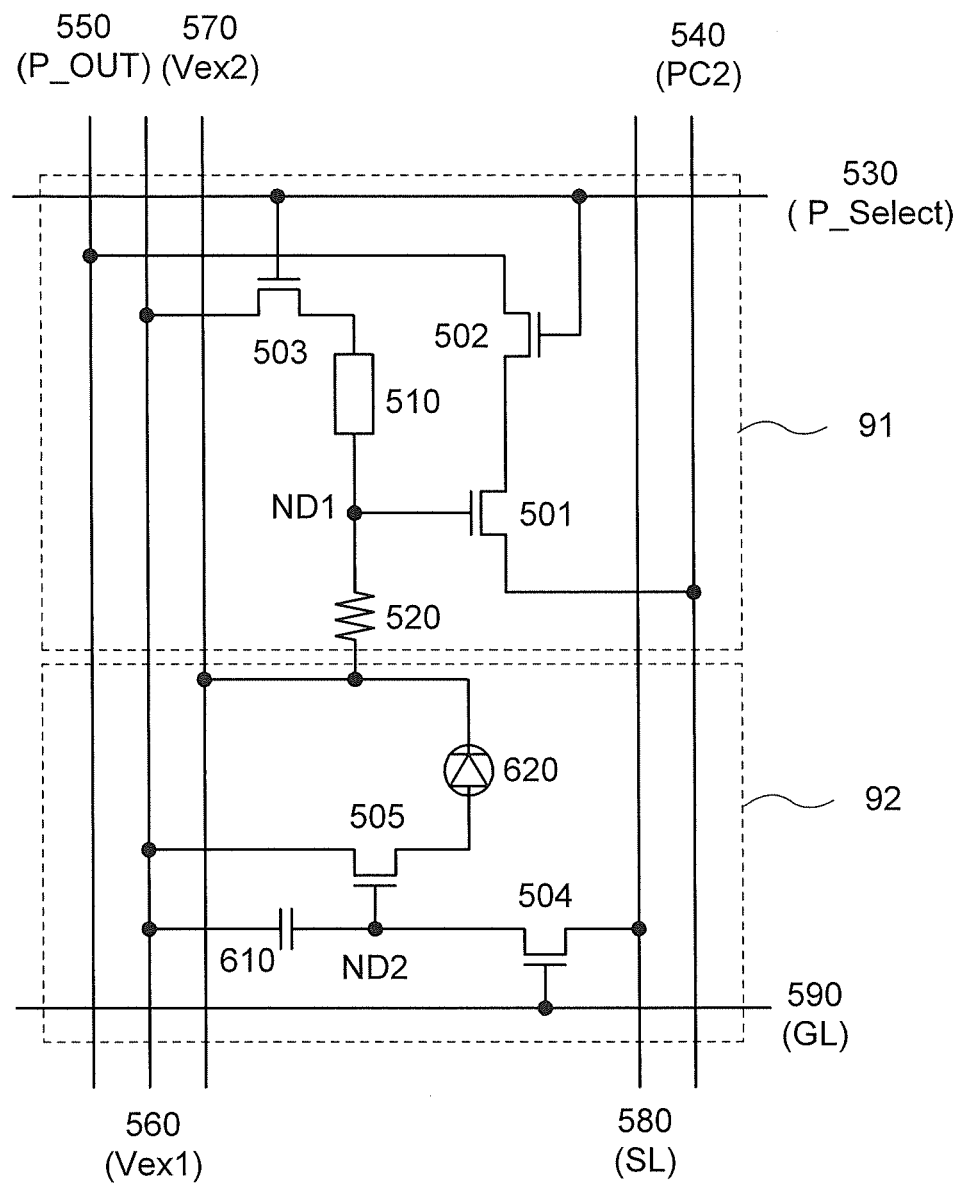
FIG. 10 illustrates a distortion sensor circuit and a pixel circuit.

Note that the circuit may have a structure as illustrated in FIG. 10 where the distortion sensor circuit portion 91, which is similar to the circuit in FIG. 8B, and the pixel circuit portion 92 including the organic EL element are combined. The other terminal of the capacitor 610, one of the source and the drain of the transistor 505, and the other of the source and the drain of the transistor 503 can be electrically connected to one another.

Figure 11:
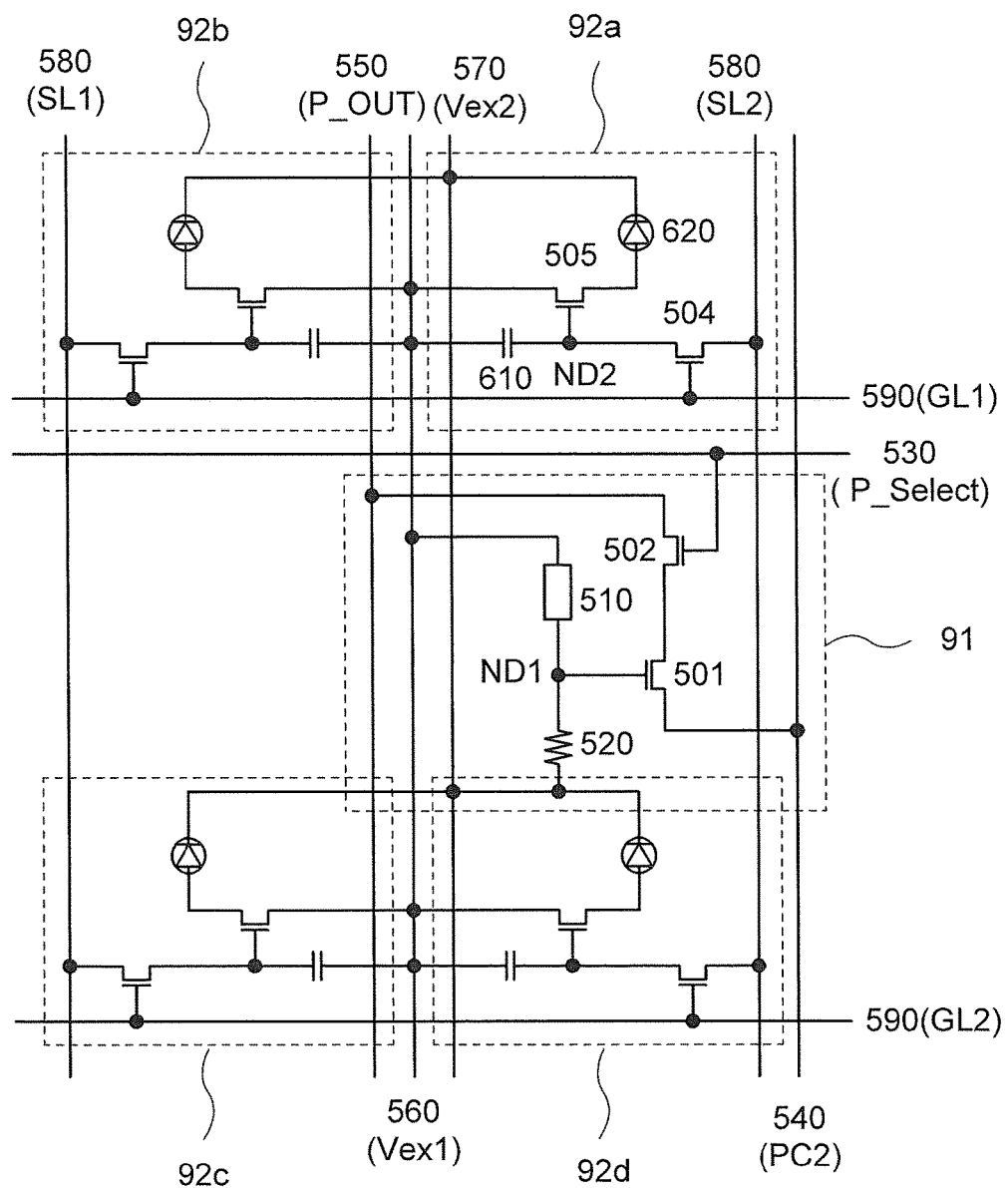
FIG. 11 illustrates a distortion sensor circuit and a pixel circuit.
Figure 12:
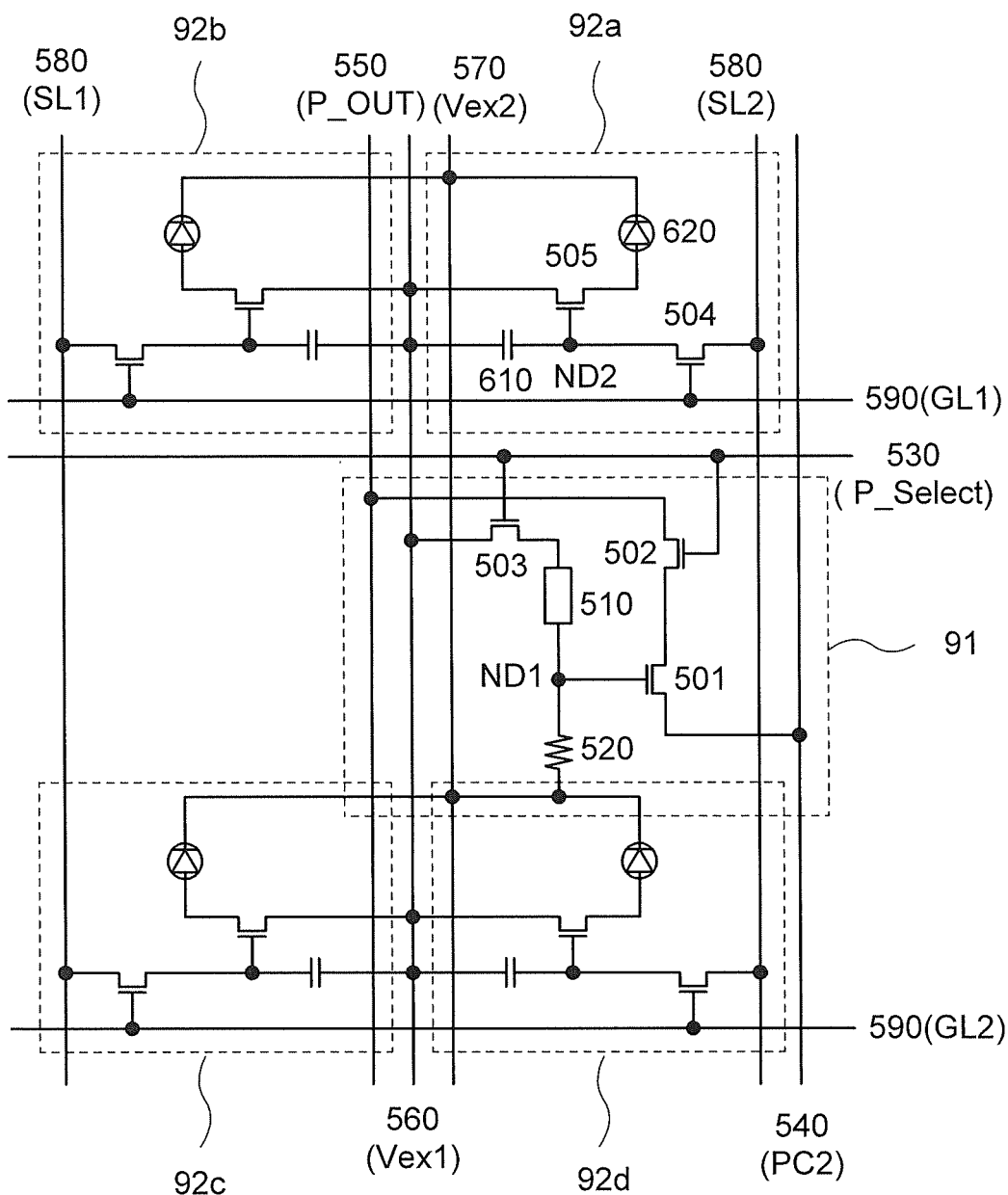
FIG. 12 illustrates a distortion sensor circuit and a pixel circuit.

Although one pixel circuit portion 92 and one distortion sensor circuit portion 91 are combined in the circuits illustrated in FIGS. 9 and 10, the plurality of pixel circuit portions 92 and one distortion sensor circuit portion 91 can be combined as illustrated in FIG. 11. Note that although four pixel circuit portions (pixel circuit portions 92a to 92d) are shown in FIG. 11, one embodiment of the present invention is not limited to this structure and two or more pixel circuit portions and one distortion sensor circuit portion 91 can be combined. Note that as illustrated in FIG. 12, the distortion sensor circuit portion 91 may include the transistor 503.

Figure 13:
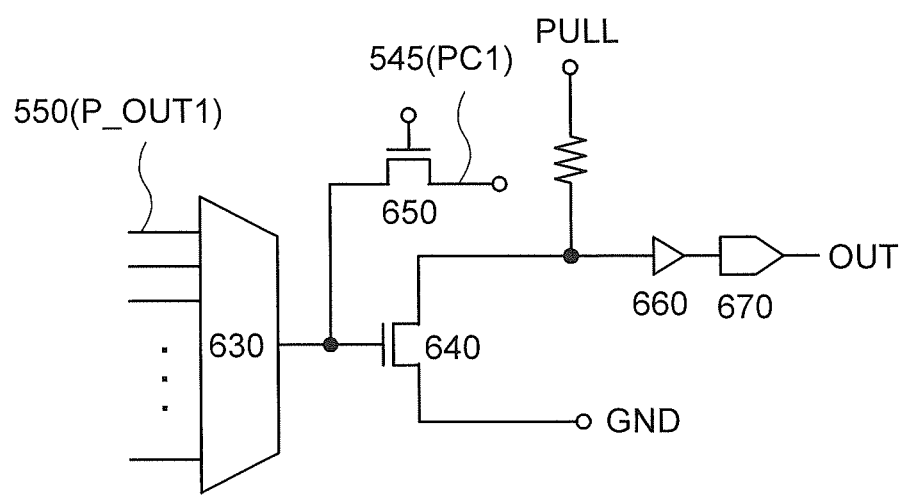
FIG. 13 illustrates a read circuit.

Note that the wiring 550 can be provided with a circuit having a reading function as illustrated in FIG. 13. The wiring 550 is connected to a selector 630, and a selected signal is inputted to a gate of a transistor 640. Here, a transistor 650 is a switch for resetting the gate potential of the transistor 640 to a potential supplied from a wiring 545. A signal outputted from the transistor 640 can be outputted as digital data through an amplifier 660 and an analog-digital converter 670. The wiring 545 can function as a low power supply potential line. Note that the wiring 540 may be a low power supply potential line and the wiring 545 may be a high power supply potential line.

Figure 14:
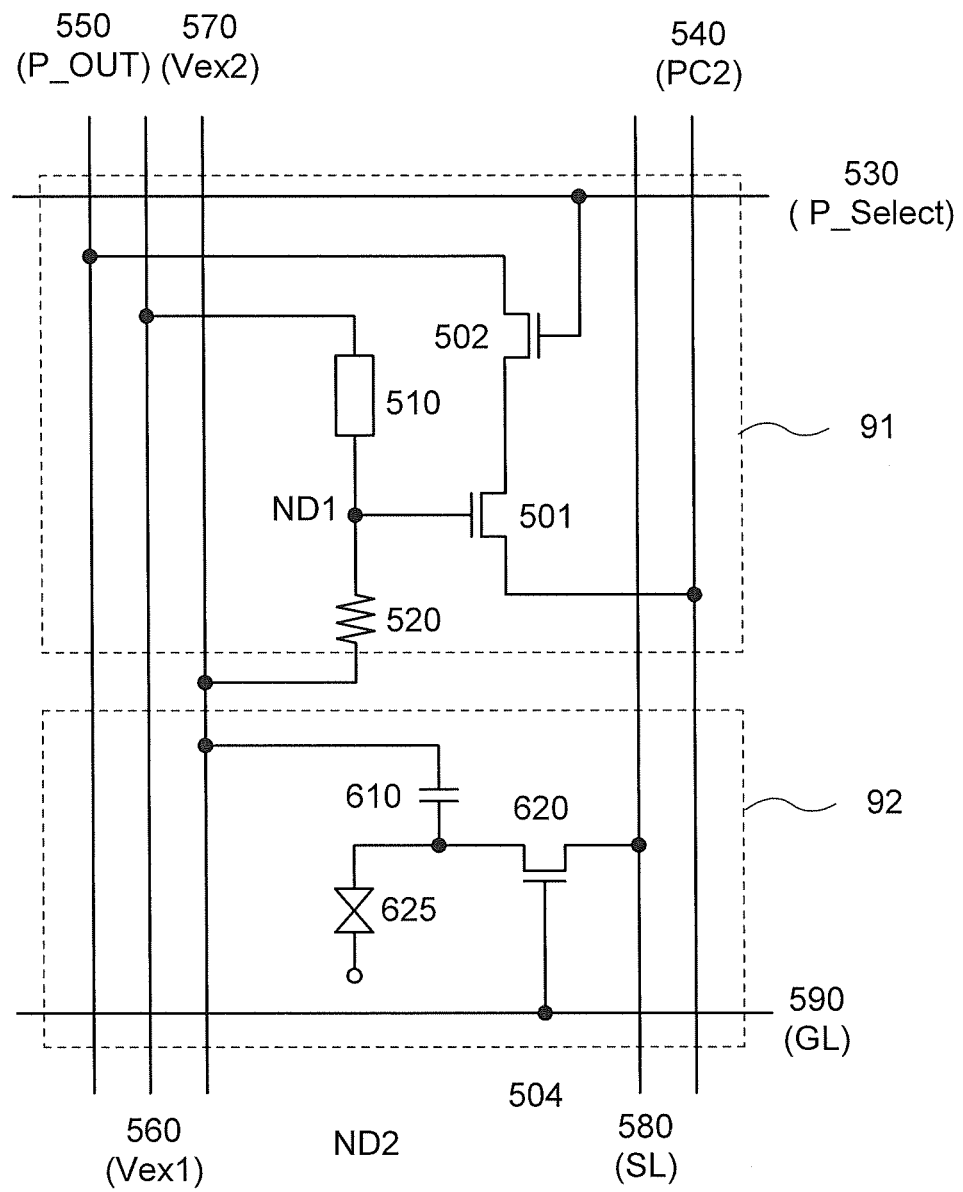
FIG. 14 illustrates a distortion sensor circuit and a pixel circuit.
Figure 15:
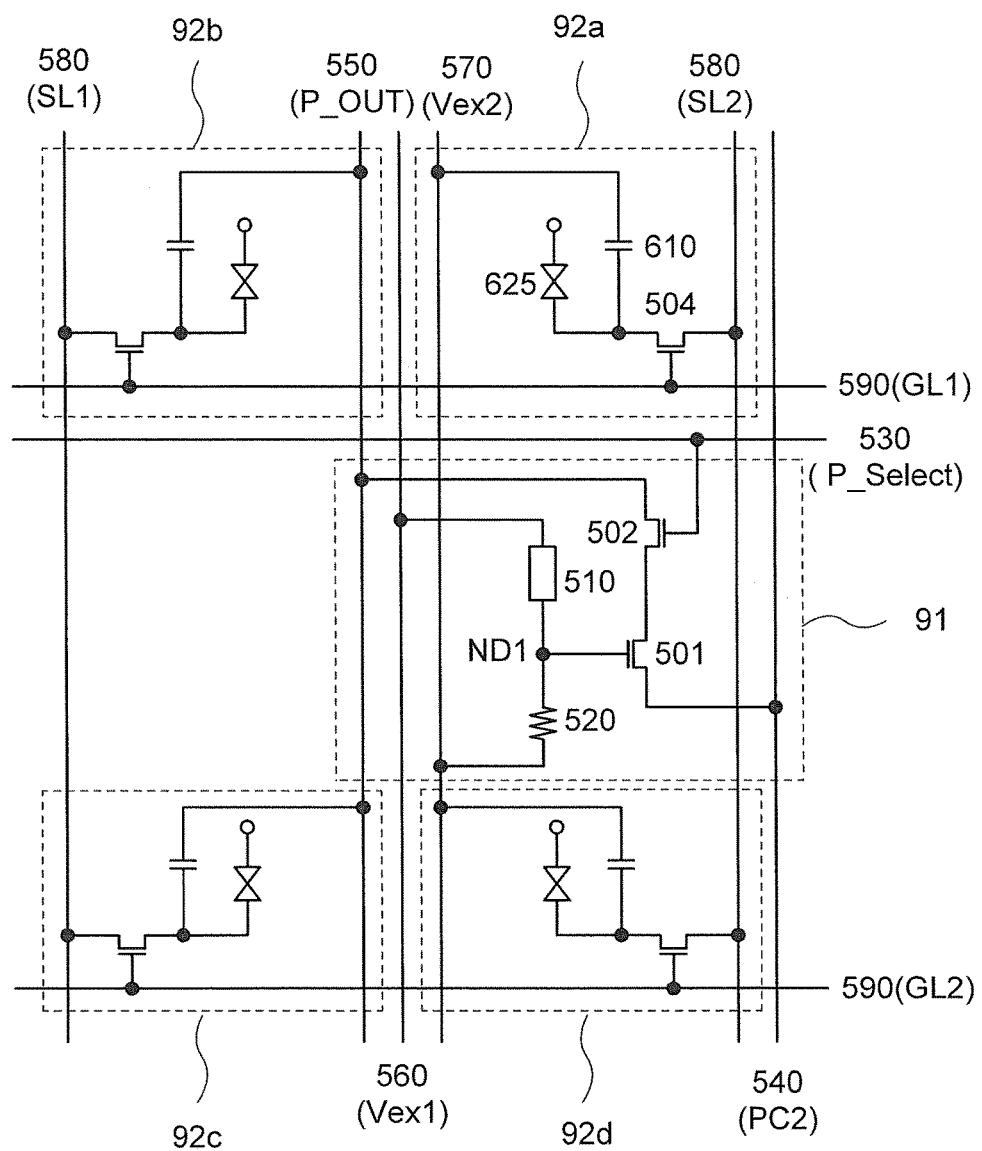
FIG. 15 illustrates a distortion sensor circuit and a pixel circuit.

Although the pixel circuit portion 92 includes the organic EL element 620 in the above examples, the pixel circuit portion 92 may include a liquid crystal element 625 as illustrated in FIGS. 14 and 15. It is needless to say that the transistor 503 may be included in the circuits illustrated in FIGS. 14 and 15 as in the above-described circuits.

The structure described in this embodiment can be used in appropriate combination with the structure described in any of the other embodiments.

Embodiment 4

In this embodiment, a transistor that can be used for a display device of one embodiment of the present invention and a material included in the transistor will be described. The transistor described in this embodiment can be used for the transistors 350, 352, 354, 501, 502, 503, 504, 505, and the like described in the above embodiment.

Figure 16A:
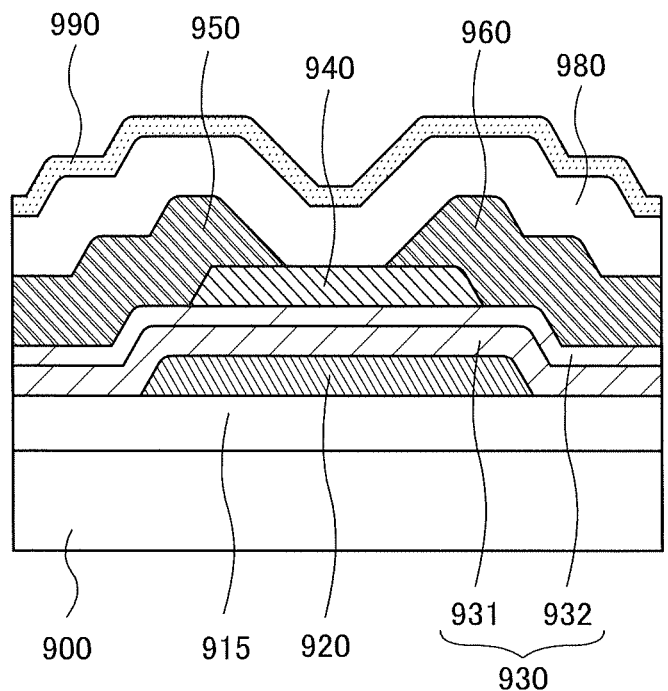
FIGS. 16A and 16B are cross-sectional views illustrating transistors.

FIG. 16A is a cross-sectional view of an example of a transistor that can be used in a display device of one embodiment of the present invention. The transistor includes an insulating film 915 over a substrate 900, a gate electrode layer 920, a gate insulating film 930 in which an insulating film 931 and an insulating film 932 are stacked in this order, an oxide semiconductor layer 940, and a source electrode layer 950 and a drain electrode layer 960 in contact with part of the oxide semiconductor layer 940. In addition, an insulating film 980 and an insulating film 990 may be formed over the gate insulating film 930, the oxide semiconductor layer 940, the source electrode layer 950, and the drain electrode layer 960.

Figure 16B:
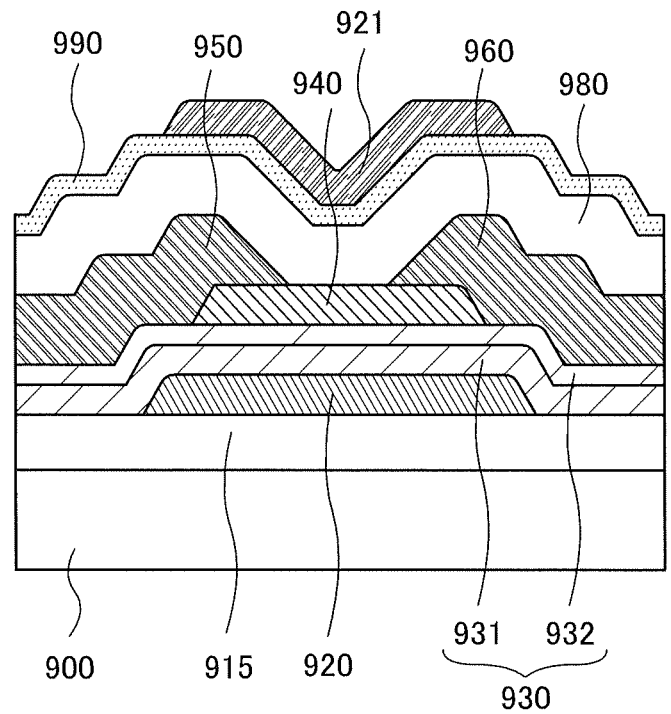

The transistor of one embodiment of the present invention may include, as illustrated in FIG. 16B, a conductive film 921 that overlaps with the gate electrode layer 920 and the oxide semiconductor layer 940 and is over the insulating film 990. When the conductive film 921 is used as a second gate electrode layer (back gate), the on-state current can be increased and the threshold voltage can be controlled. To increase the on-state current, for example, the gate electrode layer 920 and the conductive film 921 are set to have the same potential, and the transistor is driven as a dual-gate transistor. Further, to control the threshold voltage, a fixed potential that is different from a potential of the gate electrode layer 920 is supplied to the conductive film 921.

Figure 17A:
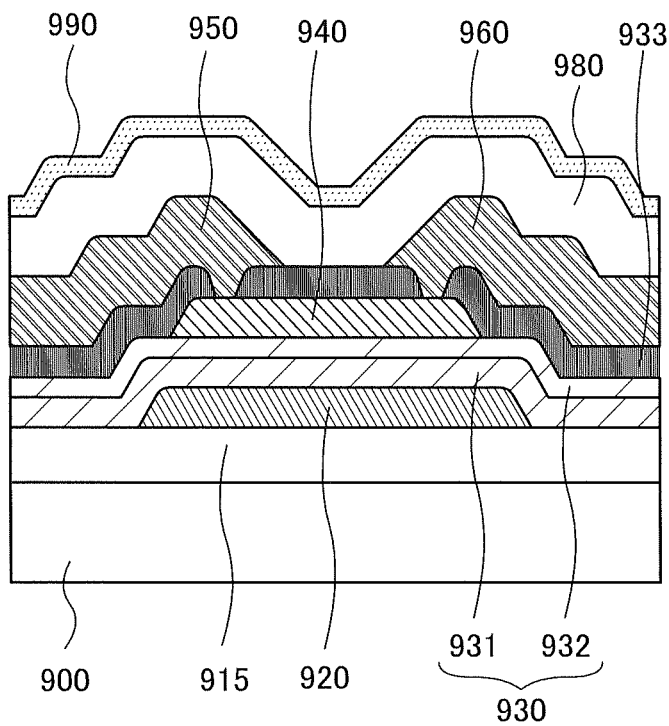
FIGS. 17A and 17B are cross-sectional views illustrating transistors.
Figure 17B:
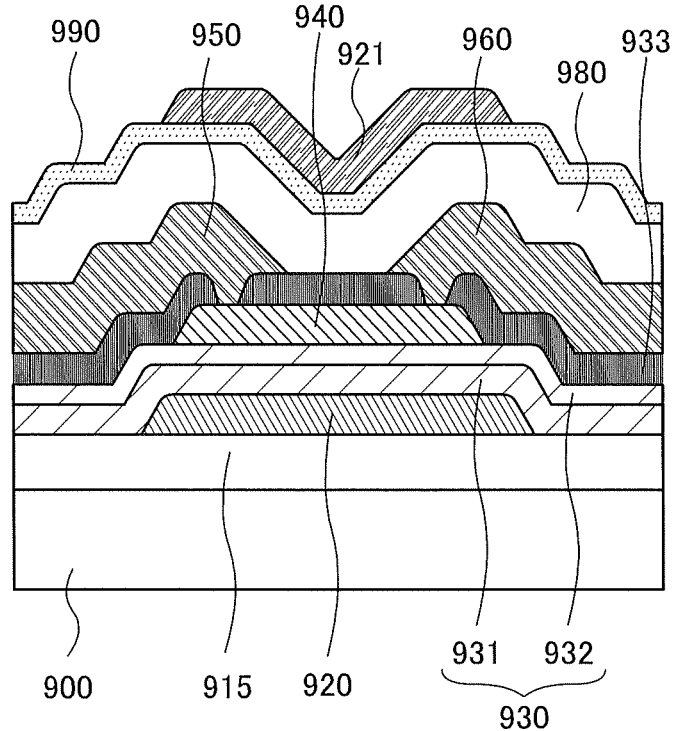

The transistor of one embodiment of the present invention may have a channel-protective bottom-gate structure as illustrated in FIGS. 17A and 17B. In this structure, an insulating film 933 has a function of protecting a channel region. Thus, the insulating film 933 may be provided only in a region overlapping with the channel region or provided in not only the region but also a region other than the region as illustrated in FIGS. 17A and 17B.

Figure 18A:
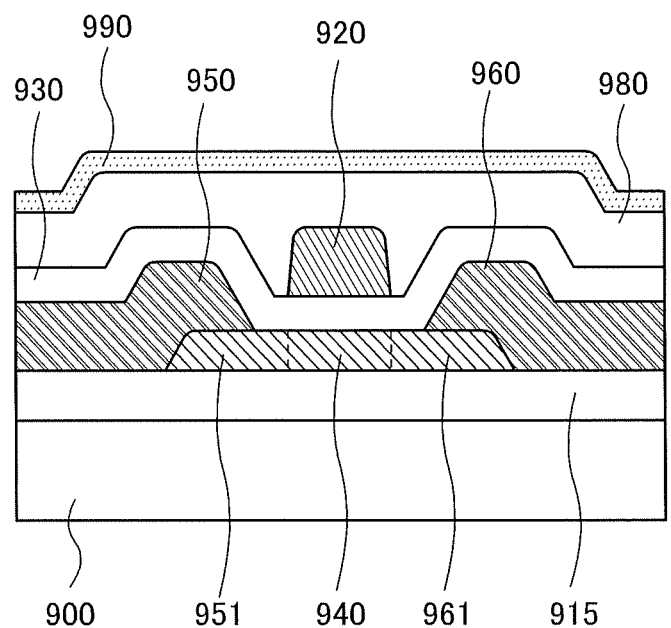
FIGS. 18A and 18B are cross-sectional views illustrating transistors.
Figure 18B:
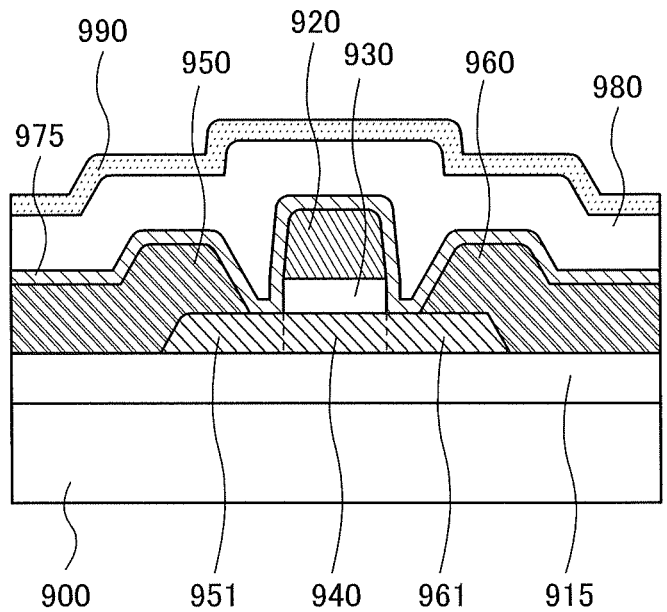

The transistor of one embodiment of the present invention may have a self-aligned top-gate structure as illustrated in FIGS. 18A and 18B. In the structure in FIG. 18A, a source region 951 and a drain region 961 can be formed in the following manner: oxygen vacancies are generated by making the source electrode layer 950 and the drain electrode layer 960 be in contact with the oxide semiconductor layer 940; and the oxide semiconductor layer 940 is doped with impurities such as boron, phosphorus, or argon using the gate electrode layer 920 as a mask. In the structure in FIG. 18B, the source region 951 and the drain region 961 can be formed, instead of using the doping method, in the following manner: an insulating film 975 containing hydrogen, such as a silicon nitride film, is formed to be in contact with part of the oxide semiconductor layer 940 and the hydrogen is diffused to the part of the oxide semiconductor layer 940.

Figure 19A:
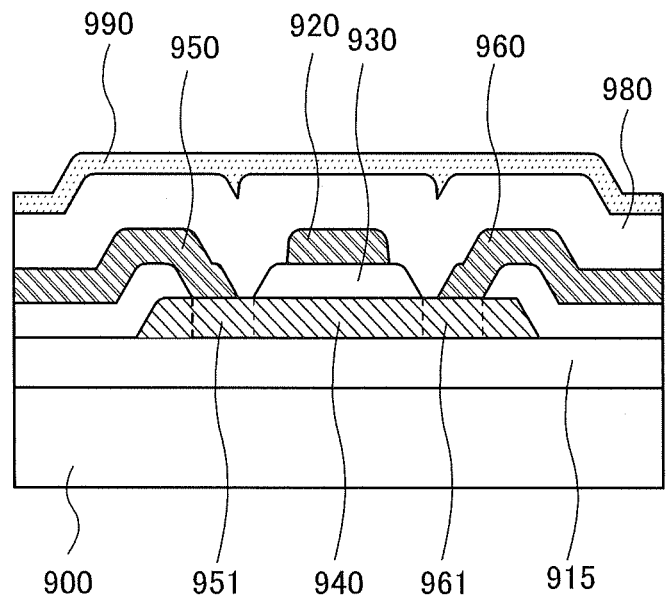
FIGS. 19A and 19B are cross-sectional views illustrating transistors.

The transistor of one embodiment of the present invention may have a self-aligned top-gate structure as illustrated in FIG. 19A. In the structure in FIG. 19A, the source region 951 and the drain region 961 can be formed in the following manner: oxygen vacancies are generated by making the source electrode layer 950 and the drain electrode layer 960 be in contact with the oxide semiconductor layer 940; and the oxide semiconductor layer 940 is doped with impurities such as boron, phosphorus, or argon using the gate insulating film 930 as a mask. In the structure in FIG. 19A, the source electrode layer 950, the drain electrode layer 960, and the gate electrode layer 920 can be formed in one process.

Figure 19B:
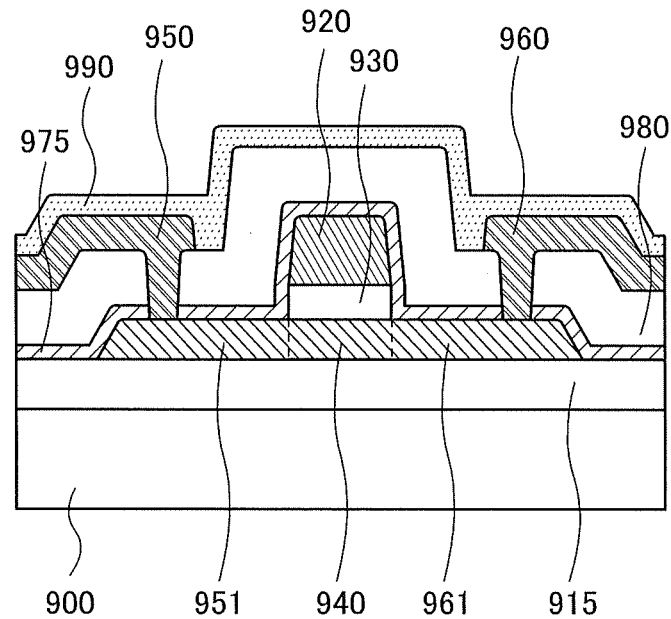

The transistor of one embodiment of the present invention may have a self-aligned top-gate structure as illustrated in FIG. 19B. In the structure in FIG. 19B, the source region 951 and the drain region 961 can be formed by, besides the doping with impurities such as boron, phosphorus, or argon using the gate insulating film 930 as a mask, diffusion of hydrogen from the insulating film 975 such as a silicon nitride film, which contains hydrogen and is in contact with part of the oxide semiconductor layer 940, to the part of the oxide semiconductor layer 940. In the structure, the source region 951 and the drain region 961 can have lower resistance. Alternatively, a structure in which doping with the impurities is not performed or a structure without the insulating film 975 can be formed.

Figure 20A:
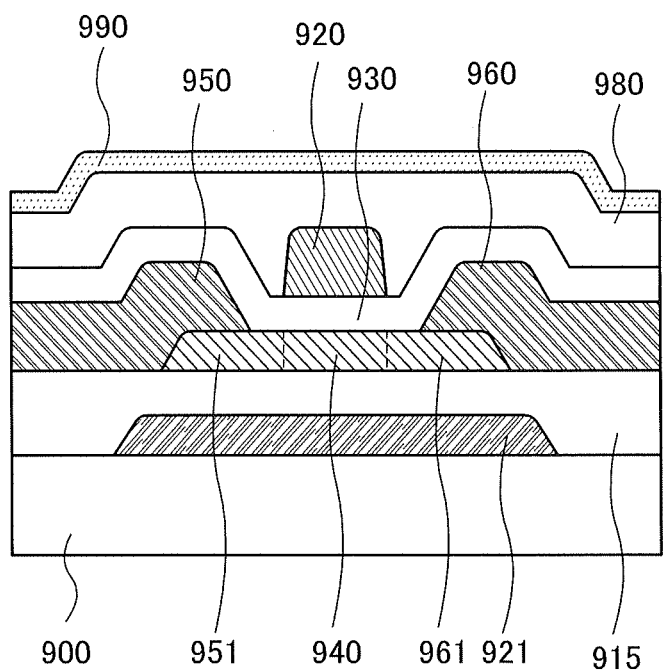
FIGS. 20A and 20B are cross-sectional views illustrating transistors.
Figure 20B:
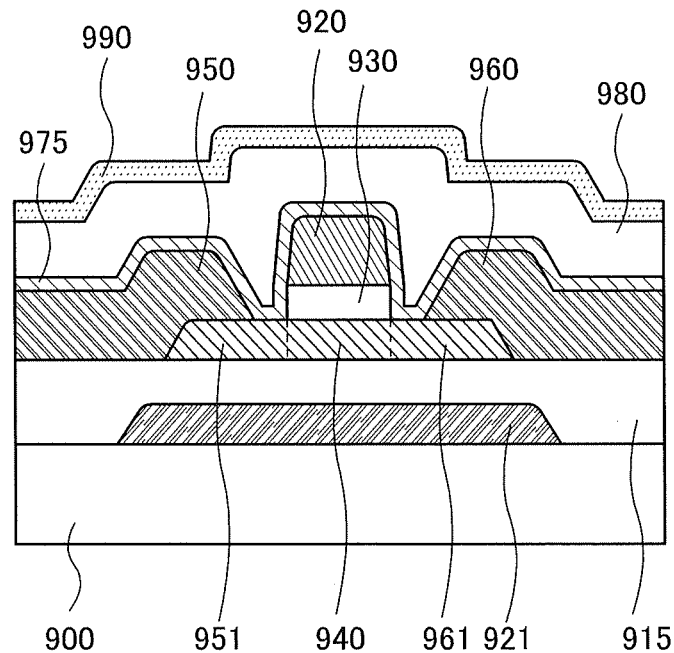

The transistor of one embodiment of the present invention may include a conductive film 921 overlapping with the oxide semiconductor layer 940 with the insulating film 915 interposed therebetween as illustrated in FIGS. 20A and 20B. Although FIGS. 20A and 20B illustrate examples where the conductive film 921 is provided in the transistors illustrated in FIGS. 18A and 18B, the conductive film 921 can be provided in the transistors illustrated in FIGS. 19A and 19B.

In the display device of one embodiment of the present invention, an oxide semiconductor can be used in an active layer as described above. The transistor using an oxide semiconductor layer has a higher mobility than a transistor using amorphous silicon, and is thus easily reduced in size, resulting in a reduction in the size of a pixel. The transistor using an oxide semiconductor layer enables a flexible display device to have high reliability. Note that one embodiment of the present invention is not limited thereto. An active layer may include a semiconductor other than an oxide semiconductor depending on the case or condition.

Note that in the cross-sectional structures of the transistors illustrated in FIGS. 16A and 16B and FIGS. 17A and 17B, the width of the gate electrode layer 920 is preferably larger than that of the oxide semiconductor layer 940. In the display device having a backlight, the gate electrode layer functions as a light-blocking layer, and a deterioration of electrical characteristics, caused by irradiation of the oxide semiconductor layer 940 with light, can be suppressed. In a display device including an organic EL element or the like, a gate electrode layer in a top-gate transistor can function as a light-blocking layer.

Next, the components of the transistor of one embodiment of the present invention will be described in detail.

The substrate 900 can be formed using a material that can be used for the first substrate 41 and the second substrate 42 described in Embodiment 1. Note that the substrate 900 corresponds to the first substrate 41 in Embodiment 1.

As the insulating film 915, for example, a single layer of a silicon oxide film, a silicon oxynitride film, a silicon nitride film, or a silicon nitride oxide film, or a stacked layer including any of the above films can be used. The insulating film 915 corresponds to the insulating film 321a in Embodiment 1.

The gate electrode layer 920 and the conductive film 921 can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co), an alloy including the above metal element, an alloy in which any of the above metal elements are combined, or the like. Furthermore, the gate electrode layer 920 may have a single-layer structure or a stacked structure of two or more layers.

Alternatively, the gate electrode layer 920 and the conductive film 921 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, or graphene. A layered structure formed using the above light-transmitting conductive material and the above metal element can also be employed.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode layer 920 and the insulating film 932.

As each of the insulating films 931 and 932 functioning as the gate insulating film 930, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked structure of the insulating films 931 and 932, the gate insulating film 930 may be an insulating film of a single layer formed using a material selected from the above or an insulating film of three or more layers.

Note that the insulating film 932 that is in contact with the oxide semiconductor layer 940 functioning as a channel formation region of the transistor is preferably an oxide insulating film and preferably has a region (oxygen-excess region) containing oxygen in excess of the stoichiometric composition. In other words, the insulating film 932 is an insulating film from which oxygen can be released. In order to provide the oxygen-excess region in the insulating film 932, the insulating film 932 is formed in an oxygen atmosphere, for example. Alternatively, oxygen may be introduced into the deposited insulating film 932 to provide the oxygen-excess region therein. Oxygen can be introduced by an ion implantation method, an ion doping method, a plasma immersion ion implantation method, plasma treatment, or the like.

In the case where hafnium oxide is used for the insulating films 931 and 932, the following effect is attained. Hafnium oxide has higher dielectric constant than silicon oxide and silicon oxynitride. Therefore, when hafnium oxide is used, a thickness can be made larger than when silicon oxide is used; thus, leakage current due to tunnel current can be low.

In this embodiment, a silicon nitride film is formed as the insulating film 931, and a silicon oxide film is formed as the insulating film 932. A silicon nitride film has a higher dielectric constant than a silicon oxide film and needs a larger thickness for capacitance equivalent to that of the silicon oxide. Thus, when a silicon nitride film is used for the gate insulating film 930 of the transistor, the physical thickness of the insulating film can be increased. From the above, the electrostatic breakdown of the transistor can be prevented by improving the withstand voltage of the transistor.

The oxide semiconductor layer 940 is typically formed using an In—Ga oxide, an In—Zn oxide, or an In-M-Zn oxide (M is Ti, Ga, Y, Zr, La, Ce, Nd, Sn, or Hf). In particular, an In-M-Zn oxide (M is Ti, Ga, Y, Zr, La, Ce, Nd, Sn, or Hf) is preferably used for the oxide semiconductor layer 940.

In the case where the oxide semiconductor layer 940 is an In-M-Zn oxide (M is Ti, Ga, Y, Zr, La, Ce, Nd, Sn, or Hf), it is preferable that the atomic ratio of metal elements of a sputtering target used for forming a film of the In-M-Zn oxide satisfy In≥M and Zn≥M. The sputtering target is preferably polycrystalline. As the atomic ratio of metal elements of such a sputtering target, In:M:Zn=1:1:1, In:M:Zn=5:5:6, In:M:Zn=3:1:2, In:M:Zn=2:1:3, and the like are preferable. Note that the atomic ratio of metal elements in the formed oxide semiconductor layer 940 varies from the above atomic ratio of metal elements of the sputtering target within a range of ±40% as an error.

In the case of using an In-M-Zn oxide for the oxide semiconductor layer 940, when Zn and O are eliminated from consideration, the proportion of In and the proportion of M are greater than 25 atomic % and less than 75 atomic %, respectively, preferably greater than 34 atomic % and less than 66 atomic %, respectively.

The energy gap of the oxide semiconductor layer 940 is 2 eV or more, preferably 2.5 eV or more, and more preferably 3 eV or more. In this manner, the amount of off-state current of a transistor can be reduced by using an oxide semiconductor having a wide energy gap.

The oxide semiconductor layer 940 has a thickness greater than or equal to 3 nm and less than or equal to 200 nm, preferably 3 nm to 100 nm, and further preferably 3 nm to 50 nm.

An oxide semiconductor layer with low carrier density is used as the oxide semiconductor layer 940. For example, an oxide semiconductor layer whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$ is used as the oxide semiconductor layer 940.

However, the composition is not limited to those described above, and a material having the appropriate composition may be used depending on required semiconductor characteristics and electrical characteristics of the transistor (e.g., field-effect mobility and threshold voltage). Further, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layer 940 be set to appropriate values.

Further, in the oxide semiconductor layer, hydrogen, nitrogen, carbon, silicon, and metal elements except for main components are impurities. For example, hydrogen and nitrogen form donor levels to increase the carrier density. Silicon forms impurity states in the oxide semiconductor layer. The impurity state becomes a trap, which might deteriorate the electrical characteristics of the transistor. It is preferable to reduce the concentration of the impurities in the oxide semiconductor layer and at interfaces with other layers.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In order to make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, more preferably lower than $1\times10^{18}$ atoms/cm$^3$. Further, the concentration of hydrogen at a certain depth of the oxide semiconductor layer or in a region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$, for example.

Various experiments can prove low off-state current of a transistor including a highly purified oxide semiconductor layer for a channel fix/nation region. For example, even when an element has a channel width of $1\times10^6$ μm and a channel length of 10 μm, off-state current can be less than or equal to the measurement limit of a Semiconductor parameter analyzer, i.e., less than or equal to $1\times10^{-13}$ A, at voltage (drain voltage) between the source electrode and the drain electrode of from 1 V to 10 V. In this case, it can be seen that the off-state current normalized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor layer is used for a channel formation region of the transistor, and the off-state current of the transistor is measured by a change in the amount of electric charge of the capacitor per unit time. As a result, it is found that in the case where the voltage between the source electrode and the drain electrode of the transistor is 3 V, lower off-state current of several tens of yoctoamperes per micrometer (yA/μm) can be obtained. Accordingly, the off-state current of the transistor including a channel formation region formed of the highly purified oxide semiconductor layer is considerably lower than that of a transistor including silicon having crystallinity.

For the source electrode layer 950 and the drain electrode layer 960, a conductive film having properties of extracting oxygen from the oxide semiconductor layer is preferably used. For example, Al, Cr, Cu, Ta, Ti, Mo, W, Ni, Mn, Nd, or Sc can be used. An alloy or a conductive nitride of any of these materials can also be used. A stack including a plurality of materials selected from these materials, alloys of these materials, and conductive nitrides of these materials can also be used. Typically, it is preferable to use Ti, which is particularly easily bonded to oxygen, or W, which has a high melting point and thus allows subsequent process temperatures to be relatively high. Alternatively, Cu or a Cu—X alloy (X indicates Mn, Ni, Cr, Fe, Co, Mo, Ta, or Ti), which has low resistance may be used. Further alternatively, a stacked layer including any of the above materials and Cu or a Cu—X alloy may be used.

In the case of using a Cu—X alloy (X indicates Mn, Ni, Cr, Fe, Co, Mo, Ta, or Ti), a covering film is formed in a region in contact with the oxide semiconductor layer or a region in contact with an insulating film by heat treatment, in some cases. The covering film includes a compound containing X. Examples of a compound containing X include an oxide of X, an In—X oxide, a Ga—X oxide, an In—Ga—X oxide, and In—Ga—Zn—X oxide. When the covering film is formed, the covering film functions as a blocking film, and Cu in the Cu—X alloy film can be prevented from entering the oxide semiconductor layer.

By the conductive film capable of extracting oxygen from the oxide semiconductor layer, oxygen in the oxide semiconductor layer is released to form oxygen vacancies in the oxide semiconductor layer. Hydrogen slightly contained in the layer and the oxygen vacancy are bonded to each other, whereby the region is markedly changed to an n-type region. Accordingly, the n-type regions can serve as a source or a drain region of the transistor.

The insulating films 980 and 990 each have a function of a protective insulating film. The insulating film 980 is formed using an oxide insulating film containing oxygen in excess of that in the stoichiometric composition. Part of oxygen is released by heating from the oxide insulating film containing oxygen in excess of that in the stoichiometric composition. The oxide insulating film containing oxygen in excess of that in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

Silicon oxide, silicon oxynitride, or the like with a thickness greater than or equal to 30 nm and less than or equal to 500 nm, preferably greater than or equal to 50 nm and less than or equal to 400 nm can be used as the insulating film 980.

Further, it is preferable that the amount of defects in the insulating film 980 be small, typically the spin density of a signal which appears at g=2.001 originating from a dangling bond of silicon, be lower than $1.5\times10^{18}$ spins/cm$^3$, further preferably lower than or equal to $1\times10^{18}$ spins/cm$^3$ by ESR measurement. Note that the insulating film 980 is provided more apart from the oxide semiconductor layer 940 than the insulating film 970 is; thus, the insulating film 980 may have higher defect density than the insulating film 970.

The insulating film 990 has a function of blocking oxygen, hydrogen, water, an alkali metal, an alkaline earth metal, or the like. With the insulating film 990, oxygen diffusion from the oxide semiconductor layer 940 to the outside and entry of hydrogen, water, or the like from the outside to the oxide semiconductor layer 940 can be prevented. As the insulating film 990, a nitride insulating film can be used, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. The oxide insulating film having a blocking effect against oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like.

Figure 21A:
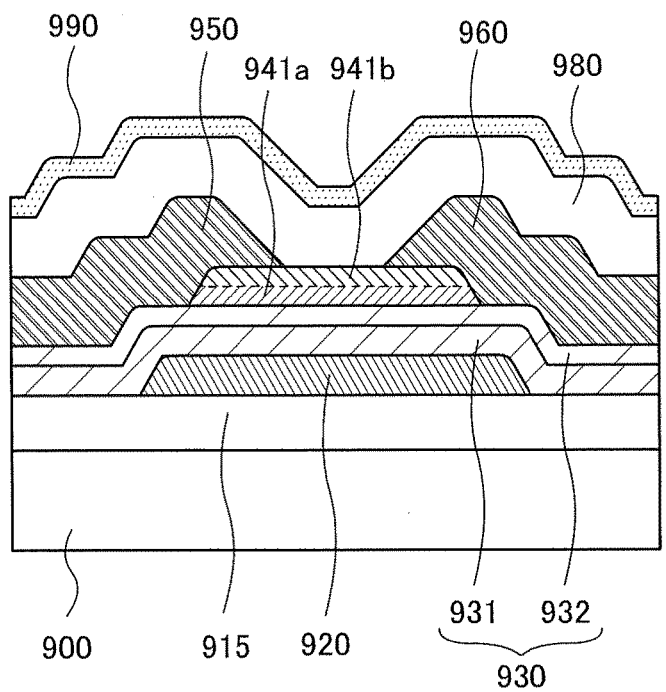
FIGS. 21A and 21B are cross-sectional views illustrating transistors.

Note that the oxide semiconductor layer 940 may have a structure in which a plurality of oxide semiconductor layers are stacked. For example, as in a transistor illustrated in FIG. 21A, stacked layers of a first oxide semiconductor layer 941a and a second oxide semiconductor layer 941b may constitute the oxide semiconductor layer 940. The first oxide semiconductor layer 941a and the second oxide semiconductor layer 941b may include metal oxides having different atomic ratios. For example, one of the oxide semiconductor layers may include one of an oxide containing two kinds of metals, an oxide containing three kinds of metals, and an oxide containing four kinds of metals, and the other of the oxide semiconductor layers may include another one of the oxide containing two kinds of metals, the oxide containing three kinds of metals, and the oxide containing four kinds of metals.

Alternatively, the first oxide semiconductor layer 941a and the second oxide semiconductor layer 941b may include the same constituent elements with different atomic ratios. For example, one of the oxide semiconductor layers may contain In, Ga, and Zn at an atomic ratio of 1:1:1, 5:5:6, 3:1:2, or 2:1:3 and the other of the oxide semiconductor layers may contain In, Ga, and Zn at an atomic ratio of 1:3:2, 1:3:4, 1:3:6, 1:4:5, 1:6:4, or 1:9:6. Note that the atomic ratio of each oxide semiconductor layer varies within a range of ±40% of the above atomic ratio as an error.

In the above, one of the oxide semiconductor layers, which is closer to the gate electrode (the oxide semiconductor layer on the channel side), has an atomic ratio of In≥Ga (in the atomic ratio, In is greater than or equal to Ga); and the other oxide semiconductor layer, which is farther from the gate electrode (the oxide semiconductor layer on the back channel side), has an atomic ratio of In<Ga. In that case, a transistor with a high field-effect mobility can be manufactured. On the other hand, when the oxide semiconductor layer on the channel side has an atomic ratio of In<Ga and the oxide semiconductor layer on the back channel side has an atomic ratio of In≥Ga (in the atomic ratio, In is greater than or equal to Ga), the amount of change in the threshold voltage of a transistor due to change over time or a reliability test can be reduced.

Further alternatively, the semiconductor film of the transistor may have a three-layer structure of a first oxide semiconductor layer, a second oxide semiconductor layer, and a third oxide semiconductor layer. In that case, the first to third oxide semiconductor layers may include the same constituent elements with different atomic ratios. A transistor including a three-layer semiconductor film will be described with reference to FIG. 21B and FIGS. 22A and 22B. Note that a structure in which a semiconductor film has a stacked structure can be employed for other transistors described in this embodiment.

Figure 21B:
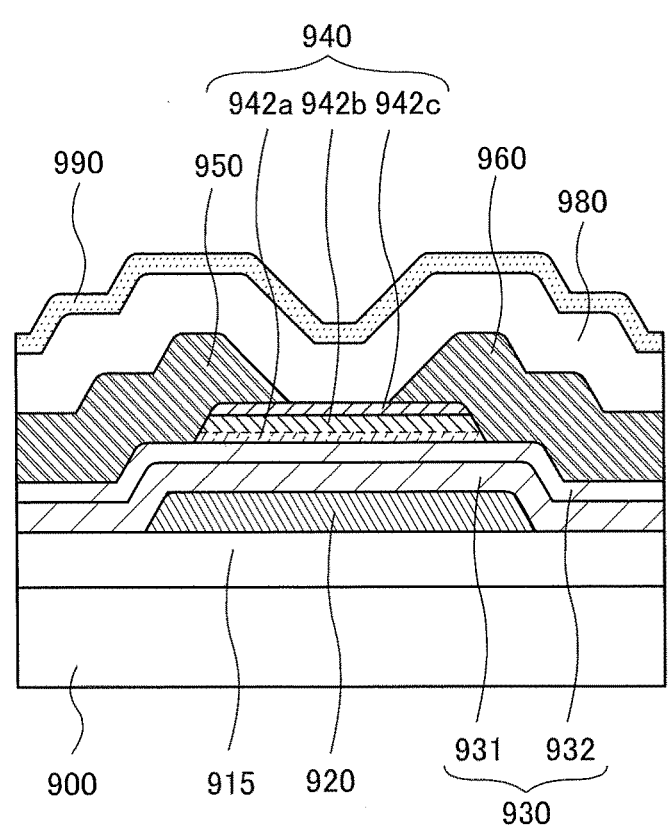
Figure 22A:
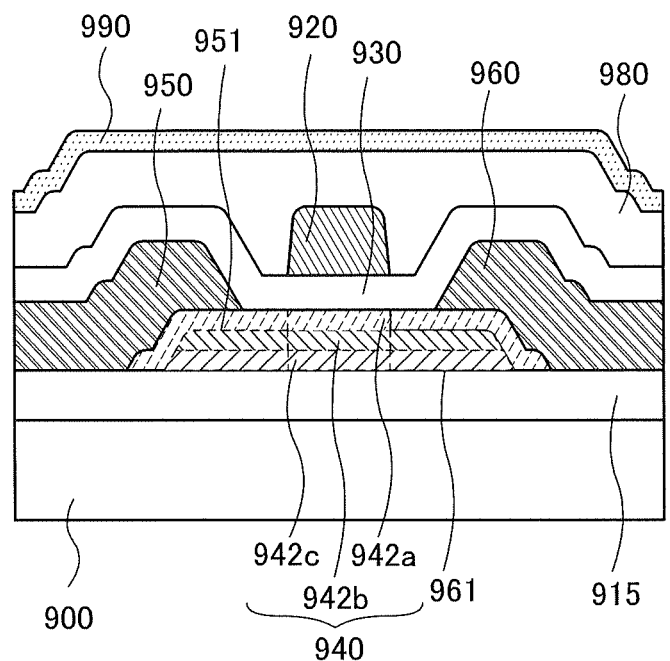
FIGS. 22A and 22B are cross-sectional views illustrating transistors.
Figure 22B:
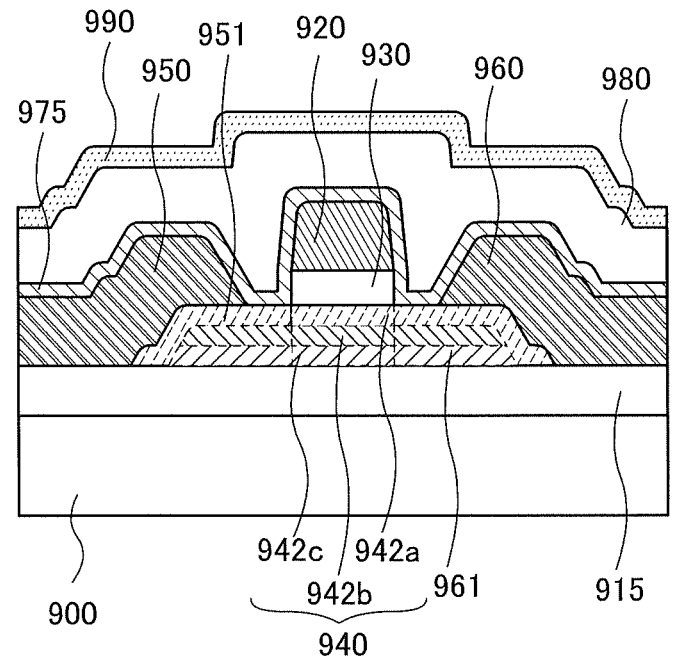

Each of the transistors illustrated in FIG. 21B and FIGS. 22A and 22B includes a third oxide semiconductor layer 942a, a second oxide semiconductor layer 942b, and a first oxide semiconductor layer 942c which are stacked in this order from a gate insulating film side.

The first oxide semiconductor layer 942c and the third oxide semiconductor layer 942a are formed using a material represented by $InM_{1x}Zn_yO_z$ (x≥1 (x is greater than or equal to 1), y>1, z>0, $M_1$=Ga, Hf, or the like). The second oxide semiconductor layer 942b is formed using a material which can be represented by $IM_{2x}Zn_yO_z$ (x≥1 (x is greater than or equal to 1), y≥x (y is greater than or equal to x), z>0, $M_2$=Ga, Sn, or the like).

Materials of the first to third oxide semiconductor layers are selected as appropriate so as to form a well-shaped structure in which the conduction band minimum in the second oxide semiconductor layer 942b is deeper from the vacuum level than the conduction band minimum in the first and third oxide semiconductor layers 942c and 942a.

For example, the first oxide semiconductor layer 942c and the third oxide semiconductor layer 942a may each have an atomic ratio of In:Ga:Zn=1:1:1, 1:3:2, 1:3:4, 1:3:6, 1:4:5, 1:6:4, or 1:9:6; the second oxide semiconductor layer 942b may have an atomic ratio of In:Ga:Zn=1:1:1, 5:5:6, 3:1:2, or 2:1:3.

Since the first to third oxide semiconductor layers 942c to 942a include the same constituent elements, the second oxide semiconductor layer 942b has few defect states (trap states) at the interface with the third oxide semiconductor layer 942a. Specifically, the defect states (trap states) are fewer than those at the interface between the gate insulating film and the third oxide semiconductor layer 942a. For this reason, when the oxide semiconductor layers are stacked in the above manner, the amount of change in the threshold voltage of a transistor due to a change over time or a reliability test can be reduced.

Further, a well-shaped structure is preferably formed in which the conduction band minimum in the second oxide semiconductor layer 942b is deeper from the vacuum level than the conduction band minimum in the first and third oxide semiconductor layers 942c and 942a. When materials of the first to third oxide semiconductor layers are selected as appropriate, the field-effect mobility of the transistor can be increased and the amount of change in the threshold voltage of the transistor due to change over time or a reliability test can be reduced.

Further, the first to third oxide semiconductor layers 942c to 942a may be formed using oxide semiconductors having different crystallinities. Note that at least the second oxide semiconductor layer 942b that can function as a channel formation region is preferably a film with crystallinity, further preferably a film in which c-axes are aligned in a direction substantially perpendicular to a surface.

Figure 23A:
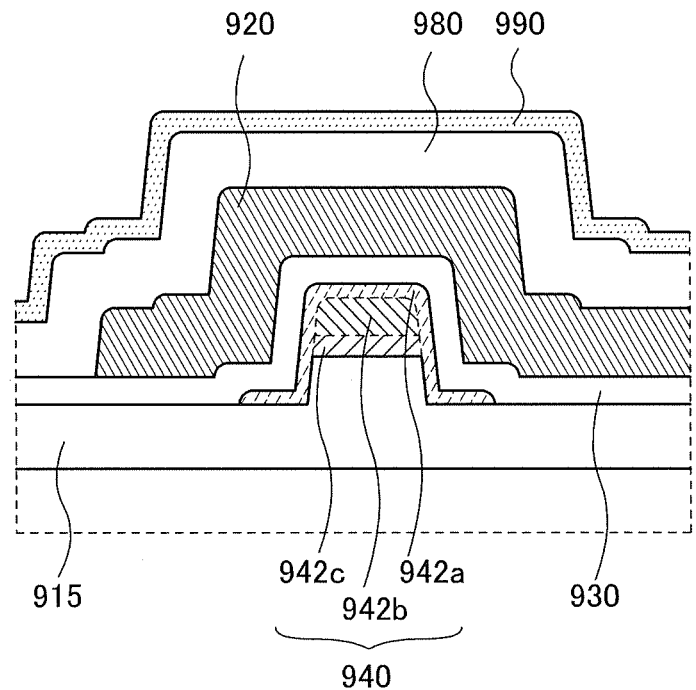
FIGS. 23A and 23B are cross-sectional views illustrating transistors.
Figure 23B:
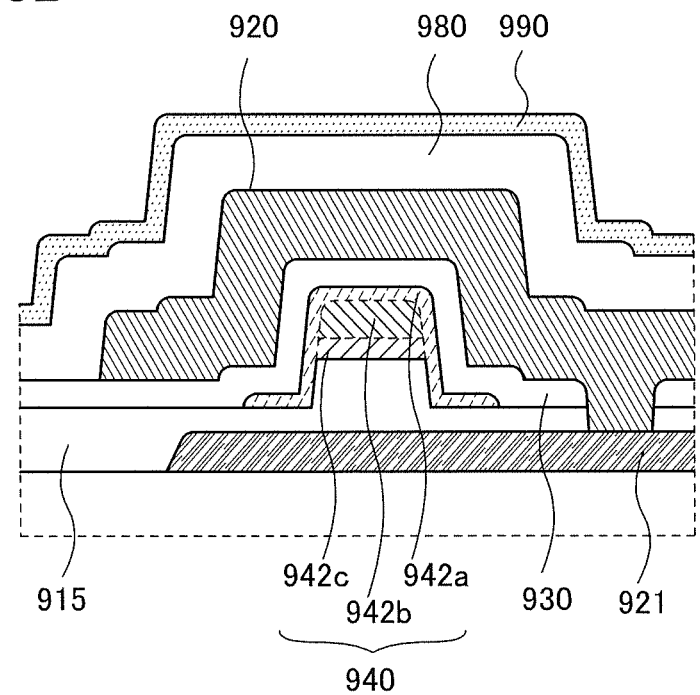

The top-gate transistor illustrated in FIG. 22A or the like preferably has any of cross-sectional structures illustrated in FIGS. 23A and 23B in the channel width direction of a channel formation region. In each of the above structures, the gate electrode layer 920 electrically surrounds the oxide semiconductor layer 940 in the channel width direction. This structure increases the on-state current. Such a transistor structure is referred to as a surrounded channel (s-channel) structure.

In the structure including the conductive film 921 as illustrated in FIGS. 20A and 20B, the gate electrode layer 920 and the conductive film 921 may be connected to each other through a contact hole, as illustrated in FIG. 23B, so as to have the same potential.

Figure 24A:
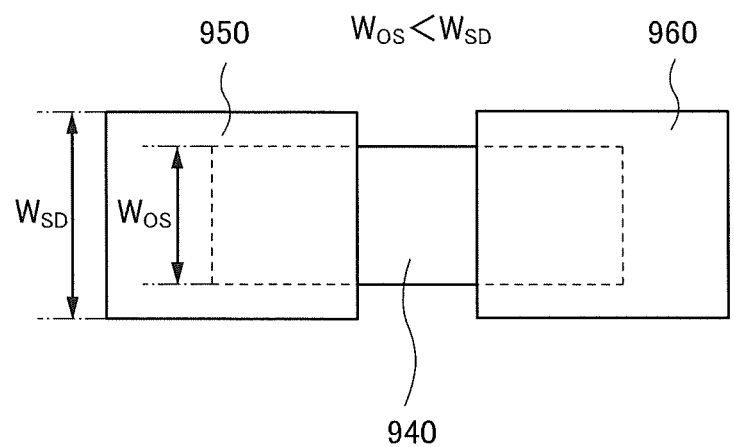
FIGS. 24A and 24B are top views illustrating transistors.
Figure 24B:
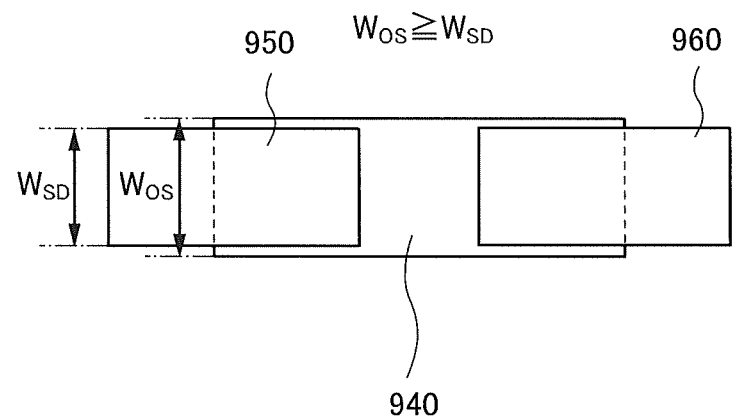

Furthermore, top-view structures of the source electrode layer 950 and the drain electrode layer 960 of the transistor of one embodiment of the present invention can be as illustrated in FIGS. 24A and 24B. Note that FIGS. 24A and 24B each illustrate only the oxide semiconductor layer 940, the source electrode layer 950, and the drain electrode layer 960. As shown in FIG. 24A, the width ($W_{SD}$) of each of the source electrode layer 950 and the drain electrode layer 960 may be larger than the width ($W_{OS}$) of the oxide semiconductor layer 940. Alternatively, $W_{SD}$ may be smaller than $W_{OS}$ as shown in FIG. 24B. When $W_{OS} \geq W_{SD}$ ($W_{SD}$ is less than or equal to $W_{OS}$) is satisfied, a gate electric field is easily applied to the entire oxide semiconductor layer 940, so that electrical characteristics of the transistor can be improved.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching the respective switching valves (also referred to as high-speed valves) such that the source gases are not mixed. For example, a first source gas is introduced, an inert gas (e.g., argon or nitrogen) or the like is introduced at the same time as or after the introduction of the first gas, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then, the second source gas is introduced to react with the first layer; as a result, a second layer is stacked over the first layer, so that a thin film is formed. The sequence of the gas introduction is controlled and repeated plural times until a desired thickness is obtained, whereby a thin film with excellent step coverage can be formed. The thickness of the thin film can be adjusted by the number of repetition times of the sequence of the gas introduction; therefore, an ALD method makes it possible to adjust a thickness accurately and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn oxide film is fouled, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn oxide film is formed using a deposition apparatus employing ALD, an $In(CH_3)_3$ gas and an $O_3$ gas are sequentially introduced plural times to form an In-0 layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Further, a $Zn(CH_3)_2$ gas may be used.

The structure described in this embodiment can be used in appropriate combination with the structure described in any of the other embodiments.

Embodiment 5

A structure of an oxide semiconductor film which can be used for one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak at 2θ of around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, the transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots appear in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is observed in some cases. Furthermore, in the high-resolution TEM image, there are a region where a crystal part is clearly observed and a region where a crystal part is not observed. In the a-like OS film, crystallization occurs by a slight amount of electron beam used for TEM observation and growth of the crystal part is found in some cases. In contrast, crystallization by a slight amount of electron beam used for TEM observation is hardly observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

Note that an oxide semiconductor film may be a stacked film including two or more films of an amorphous oxide semiconductor film, an a-like OS film, a microcrystalline oxide semiconductor film, and a CAAC-OS film, for example.

The structure described in this embodiment can be used in appropriate combination with the structure described in any of the other embodiments.

Embodiment 6

In this embodiment, a display module which can be formed using a display device of one embodiment of the present invention will be described.

Figure 25:
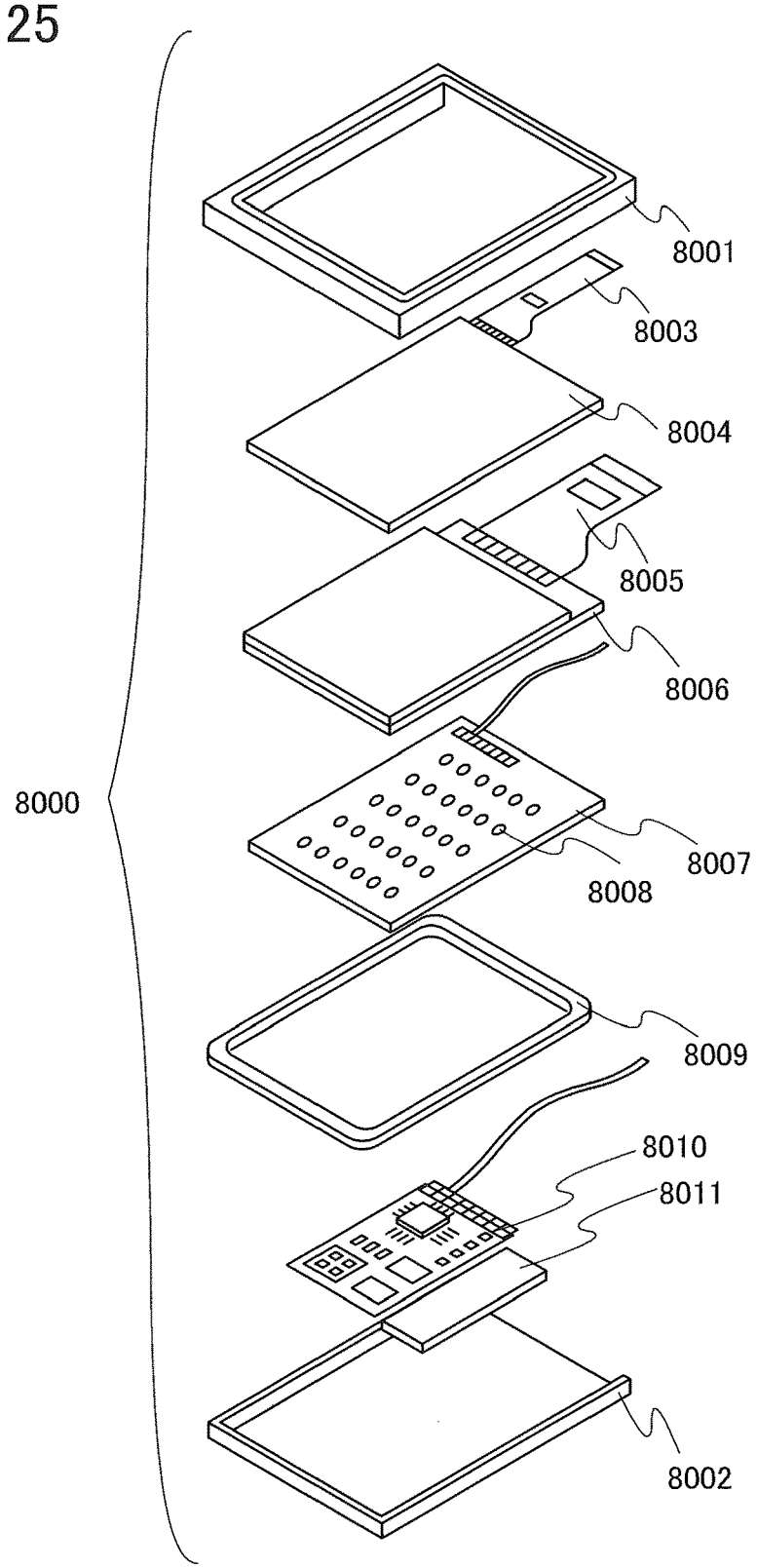
FIG. 25 is a perspective view illustrating a display module.

In a display module 8000 in FIG. 25, a touch panel 8004 connected to an FPC 8003, a display panel 8006 connected to an FPC 8005, a backlight unit 8007, a frame 8009, a printed circuit board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006. The upper cover 8001 and the lower cover 8002 have flexibility.

The touch panel 8004 is, typically, a resistive touch panel or a capacitive touch panel and overlaps with the display panel 8006. A counter substrate (sealing substrate) of the display panel 8006 can have a touch panel function. A photosensor may be provided in each pixel of the display panel 8006 so that the touch panel 8004 can function as an optical touch panel. The touch panel 8004 may have flexibility. The function of the touch panel may be achieved by the use of the distortion sensor element of one embodiment of the present invention.

The backlight unit 8007 includes a light source 8008. Note that although a structure in which the light sources 8008 are provided over the backlight unit 8007 is illustrated in FIG. 25, one embodiment of the present invention is not limited to this structure. For example, a structure in which a light source 8008 is provided at an end portion of the backlight unit 8007 and a light diffusion plate is further provided may be employed. In the case where a self-luminous light-emitting element such as an organic EL element is used or the case where a reflective panel is used, the backlight unit 8007 is not necessarily provided. The backlight unit 8007 may have flexibility.

The frame 8009 protects the display panel 8006 and functions as an electromagnetic shield for blocking electromagnetic waves generated by the operation of the printed circuit board 8010. The frame 8009 can function as a radiator plate. The frame 8009 may have flexibility.

The printed circuit board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source. The printed circuit board 8010 may be an FPC.

The display module 8000 may be additionally provided with a member such as a polarizing plate, a retardation plate, or a prism sheet.

The structure described in this embodiment can be used in appropriate combination with the structure described in any of the other embodiments.

Embodiment 7

In this embodiment, a touch panel that can include a display device provided with the distortion sensor of one embodiment of the present invention will be described.

The touch panel of one embodiment of the present invention includes an active matrix touch sensor, a display element, and a distortion sensor element between a pair of substrates. The touch sensor is a capacitive type touch sensor, for example. The touch panel allows not only input by local touch on a display portion but also input by bending of the display portion owing to the distortion sensor element. Note that the description of the distortion sensor element in the above embodiment is not made below.

In a touch panel including a touch sensor portion and a display portion that overlap with each other, a parasitic capacitance is formed in some cases between a wiring or an electrode included in a capacitive type touch sensor and a wiring or an electrode included in the display portion. Noise caused by operating the display element travels to the touch sensor side through the parasitic capacitance and the detection sensitivity of the touch sensor might decrease.

By sufficiently increasing the distance between the touch sensor portion and the display portion, the adverse effect of the noise can be avoided and the decrease in the detection sensitivity of the touch sensor can be suppressed; however, the thickness of the whole touch panel is increased in some cases.

In one embodiment of the present invention, an active matrix touch sensor is provided. The touch sensor includes a transistor and a capacitor. The transistor and the capacitor are electrically connected to each other.

In the active matrix touch sensor of one embodiment of the present invention, an electrode of a capacitor and a read wiring can be formed in different layers. When the read wiring has a narrow width, a parasitic capacitance can be small and the adverse effect of the noise can be suppressed. Accordingly, a decrease in the detection sensitivity of the touch sensor can be suppressed. In addition, by amplifying a detection signal and outputting the amplified signal, the adverse effect of the noise can be suppressed.

An active matrix touch sensor is used in the touch panel of one embodiment of the present invention, whereby the distance between the sensor portion and the display portion can be reduced in the touch panel, and the touch panel can have a small thickness. Furthermore, the touch sensor and the display element can be located between two substrates, whereby the touch panel can have a small thickness. Here, using the touch sensor of one embodiment of the present invention can suppress a decrease in the detection sensitivity of the touch sensor even when the distance between the sensor portion and the display portion is reduced. Therefore, in one embodiment of the present invention, both a small thickness and high detection sensitivity of a touch sensor or a touch panel can be achieved. Furthermore, by using a flexible material for the pair of substrates of the touch panel, the touch panel can have flexibility. Furthermore, in one embodiment of the present invention, a touch panel with high resistance to repeated bending can be provided. Furthermore, a large-sized touch panel can be provided.

The touch sensor included in the touch panel of one embodiment of the present invention may include an oxide conductor layer as the electrode of the capacitor. In the active matrix touch sensor, a semiconductor layer and a conductive film of the transistor and the electrode of the capacitor are preferably formed in the same step. Thus, the number of steps of manufacturing the touch panel can be reduced and the cost of manufacturing the touch panel can be reduced.

Note that because the oxide conductor layer is used as the electrode of the capacitor in the touch panel of one embodiment of the present invention, viewing angle dependence is smaller than that of a touch panel using another material as the electrode of the capacitor in some cases. Furthermore, because the oxide conductor layer is used as the electrode of the capacitor in the touch panel of one embodiment of the present invention, an NTSC ratio can be higher than that of a touch panel using another material as the electrode of the capacitor in some cases.

Specifically, one embodiment of the present invention is a touch panel including a touch sensor, a light-blocking layer, and a display element. In the touch panel, the light-blocking layer is located between the touch sensor and the display element, the light-blocking layer includes a portion overlapping with a transistor included in the touch sensor, and the display element includes a portion overlapping with a capacitor included in the touch sensor. Note that the touch panel allows data input without contact.

The display element can be, but is not particularly limited to, an organic EL element.

<Structure Example of Touch Panel>

Figure 26A:
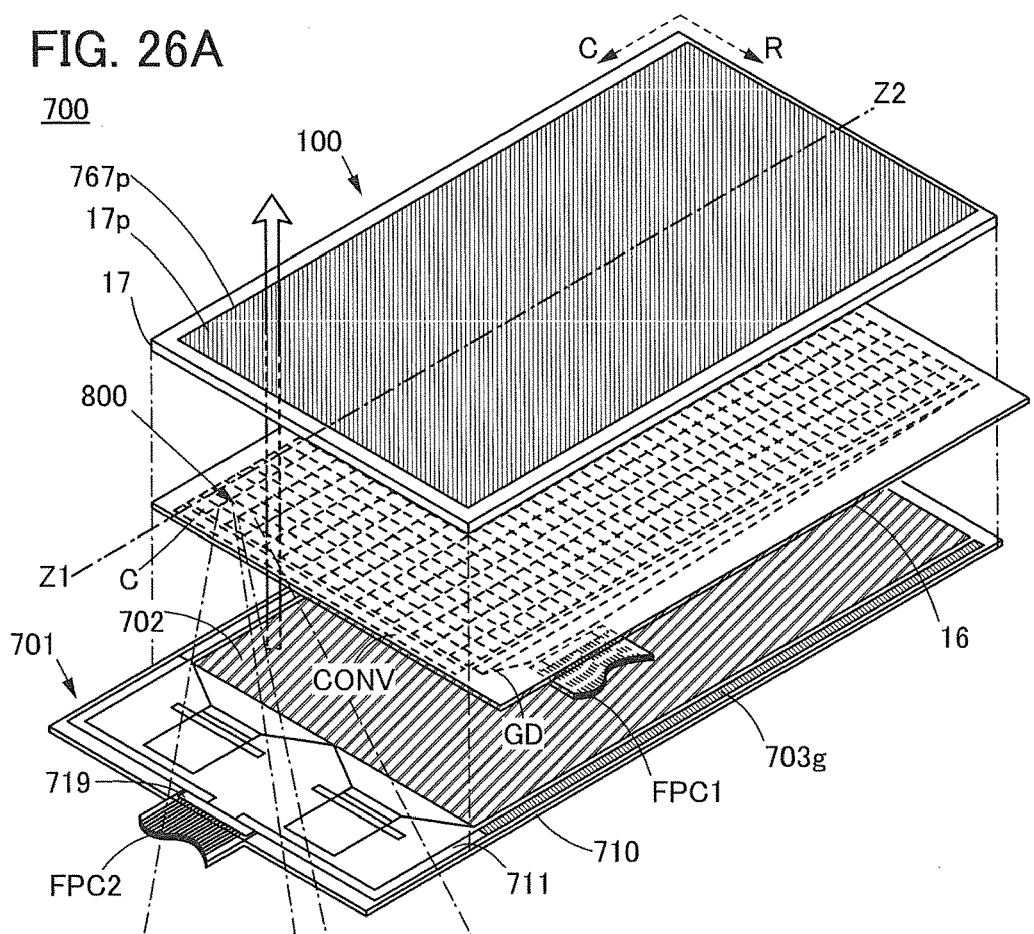
FIGS. 26A and 26B illustrate an example of a touch panel.
Figure 26B:
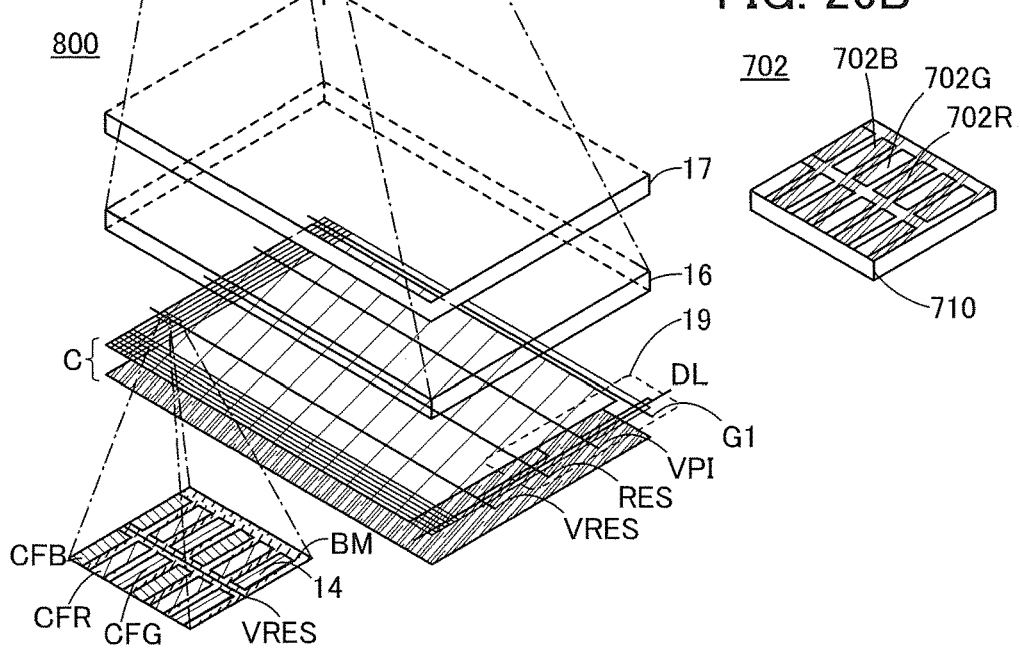

FIGS. 26A and 26B are a projection view and a perspective view illustrating components of a touch panel of one embodiment of the present invention. FIG. 26A is a projection view illustrating components of a touch panel 700 of one embodiment of the present invention and a sensor unit 800 included in the touch panel 700.

The touch panel 700 described in this embodiment includes a flexible input device 100 and a display portion 701 (see FIGS. 26A and 26B). The flexible input device 100 is provided with a plurality of sensor units 800 arranged in matrix and including window portions 14 that transmit visible light; a scan line G1 electrically connected to the plurality of sensor units 800 arranged in the row direction (shown by an arrow R in FIG. 26A); a signal line DL electrically connected to the plurality of sensor units 800 arranged in the column direction (shown by an arrow C in FIG. 26A); and a flexible base material 16 supporting the sensor units 800, the scan line G1, and the signal line DL. The display portion 701 is provided with a plurality of pixels 702 overlapping with the window portions 14 and arranged in matrix; and a flexible base material 710 supporting the pixels 702.

The sensor unit 800 includes a sensor element C overlapping with the window portion 14 and a sensor circuit 19 electrically connected to the sensor element C (FIG. 26A).

The sensor circuit 19 is supplied with a selection signal, and supplies a sensor signal DATA in accordance with a change in capacitance of the sensor element C.

The scan line G1 can supply a selection signal. The signal line DL can supply the sensor signal DATA. The sensor circuit 19 is provided so as to overlap with a gap between the window portions 14.

In addition, the touch panel 700 described in this embodiment includes a coloring layer between the sensor unit 800 and the pixel 702 overlapping with the window portion 14 of the sensor unit 800.

The touch panel 700 described in this embodiment includes the flexible input device 100 including the plurality of sensor units 800, each of which is provided with the window portions 14 transmitting visible light, and the flexible display portion 701 including the plurality of pixels 702 overlapping with the window portions 14. The coloring layer is included between the window portion 14 and the pixel 702.

With such a structure, the touch panel can supply a sensor signal based on the change in the capacitance and positional data of the sensor unit supplying the sensor signal, can display image data associated with the positional data of the sensor unit, and can be bent. As a result, a novel touch panel with high convenience or high reliability can be provided.

The touch panel 700 may include a flexible substrate FPC1 to which a signal from the input device 100 is supplied and/or a flexible substrate FPC2 supplying a signal including image data to the display portion 701.

In addition, a protective layer 17p protecting the touch panel 700 by preventing damage and/or an anti-reflective layer 767p that weakens the intensity of external light reflected by the touch panel 700 may be included.

Moreover, the touch panel 700 includes a scan line driver circuit 703g which supplies the selection signal to a scan line of the display portion 701, a wiring 711 supplying a signal, and a terminal 719 electrically connected to the flexible substrate FPC2.

Components of the touch panel 700 are described below. Note that these components cannot be clearly distinguished and one component also serves as another component or includes part of another component in some cases.

For example, the input device 100 including the coloring layer overlapping with the plurality of window portions 14 also serves as a color filter.

Furthermore, for example, the touch panel 700 in which the input device 100 overlaps the display portion 701 serves as the input device 100 as well as the display portion 701.

The touch panel 700 includes the input device 100 and the display portion 701 (FIG. 26A).

The input device 100 includes the plurality of sensor units 800 and the flexible base material 16 supporting the sensor units. For example, the plurality of sensor units 800 are arranged in matrix with 40 rows and 15 columns on the flexible base material 16.

The window portion 14 transmits visible light.

For example, the window portion 14 may be formed as follows: the base material 16, the sensor element C, and a flexible protective base material 17 each formed using a material transmitting visible light or a material thin enough to transmit visible light overlap with each other such that transmission of visible light is not prevented.

For example, an opening, portion may be provided in a material that does not transmit visible light. Specifically, one opening portion or a plurality of opening portions having any of a variety of shapes such as a rectangle may be provided.

A coloring layer that transmits light of a predetermined color is provided to overlap with the window portion 14. For example, a coloring layer CFB transmitting blue light, a coloring layer CFG transmitting green light, and a coloring layer CFR transmitting red light are included (FIG. 26A).

Note that in addition to the coloring layers transmitting blue light, green light, and/or red light, coloring layers transmitting light of various colors such as a coloring layer transmitting white light and a coloring layer transmitting yellow light can be included.

For a coloring layer, a metal material, a resin material, a pigment, dye, or the like can be used.

A light-blocking layer BM is provided to surround the window portions 14. The light-blocking layer BM does not easily transmit light as compared to the window portion 14. Note that in an example illustrated in this specification and the like, a black matrix is used as the light-blocking layer, and the letter symbol BM is used to denote the light-blocking layer.

For the light-blocking layer BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 19 are provided to overlap with the light-blocking layer BM.

Note that a light-transmitting overcoat covering the coloring layer and the light-blocking layer BM can be provided.

As the flexible base material 16 and the flexible base material 710, an organic material, an inorganic material, or a composite material of an organic material and an inorganic material can be used.

For the base material 16 and the base material 710, a material with a thickness of 5 μm or more and 2500 μm or less, preferably 5 μm or more and 680 μm or less, further preferably 5 μm or more and 170 μm or less, still further preferably 5 μm or more and 45 μm or less, yet still further preferably 8 μm or more and 25 μm or less can be used.

A material with which passage of impurities is inhibited can be favorably used for the base material 16 and the base material 710. For example, a material with a vapor permeability of lower than or equal to $10^{-5}$ g/(m$^2$·day), preferably lower than or equal to $10^{-6}$ g/(m$^2$·day) can be favorably used.

The base material 710 can be favorably formed using a material whose coefficient of linear expansion is substantially equal to that of the material of the base material 16. For example, the base material 710 and the base material 16 can each be formed using a material whose coefficient of linear expansion is preferably lower than or equal to $1\times10^{-3}$/K, further preferably lower than or equal to $5\times10^{-5}$/K, and still further preferably lower than or equal to $1\times10^{-5}$/K.

Examples of the materials of the base material 16 and the base material 710 are organic materials such as a resin, a resin film, and a plastic film.

Examples of the materials of the base material 16 and the base material 710 are inorganic materials such as a metal plate and a thin glass plate with a thickness of more than or equal to 10 μm and less than or equal to 50 μm.

The input device 100 can include the flexible protective base material 17 and/or the protective layer 17p. The flexible protective base material 17 or the protective layer 17p protects the input device 100 by preventing damage.

The display portion 701 includes a plurality of pixels 702 arranged in matrix (FIG. 26B). For example, the pixel 702 includes a sub-pixel 702B, a sub-pixel 702G, and a sub-pixel 702R, and each sub-pixel includes a display element and a pixel circuit for driving the display element.

Note that in the pixel 702, the sub-pixel 702B is located to overlap with the coloring layer CFB, the sub-pixel 702G is located to overlap with the coloring layer CFG, and the sub-pixel 702R is located to overlap with the coloring layer CFR.

The display portion 701 may include the anti-reflective layer 767p positioned in a region overlapping with pixels. As the anti-reflective layer 767p, a circular polarizing plate can be used, for example.

The display portion 701 includes the wiring 711 through which a signal can be supplied. The wiring 711 is provided with the terminal 719. Note that the flexible substrate FPC2 through which a signal such as an image signal or a synchronization signal can be supplied is electrically connected to the terminal 719.

Note that a printed wiring board (PWB) may be attached to the flexible substrate FPC2.

<<Sensor Element C>>

The sensor element C is described giving an example that uses a capacitor. The capacitor includes a pair of electrodes. The capacitor includes an insulating film as the dielectric layer between the pair of electrodes.

When an object whose dielectric constant is different from that of the air gets closer to one of the pair of electrodes of the sensor element C that is put in the air, the capacitance of the sensor element C is changed. Specifically, when a finger or the like gets closer to the sensor element C, the capacitance of the sensor element C is changed. Thus, the sensor element C can be used in a proximity sensor.

When the sensor element C is changed in shape, the capacitance is changed with the change in shape.

Specifically, when a finger or the like is in contact with the sensor element C, and the gap between the pair of electrodes becomes small, the capacitance of the sensor element C is increased. Accordingly, the sensor element C can be used in a tactile sensor.

Specifically, when the sensor element C is bent, and the gap between the pair of electrodes becomes small, the capacitance of the sensor element C is increased. Accordingly, the sensor element C can also be used in a bend sensor.

<<Sensor Circuit 19 and Converter CONV>>

FIGS. 27A, 27B1, 27B2, and 27C illustrate configurations of the sensor circuit 19 and a converter CONV and a driving method of the sensor circuit 19 that are embodiments of the present invention.

Figure 28A:
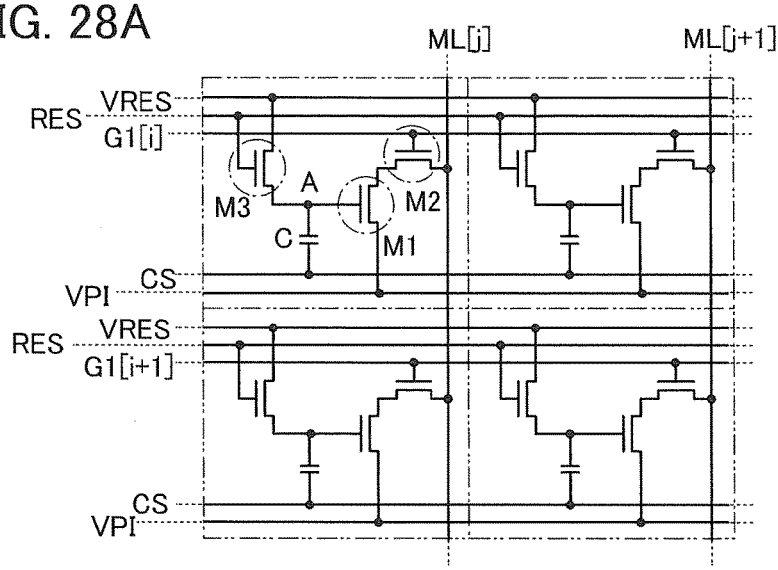
FIGS. 28A to 28C illustrate an example of a sensor circuit.

FIG. 27A is a circuit diagram illustrating configurations of the sensor circuit 19 and the converter CONV of embodiments of the present invention, and FIGS. 27B1 and 27B2 are timing charts illustrating a driving method of one embodiment of the present invention. FIG. 27C shows the converter CONV that is different from the converter CONV shown in FIG. 27A. FIG. 28A shows the sensor circuits 19 in matrix.

The sensor circuit 19 includes transistors M1 to M3, for example (FIG. 27A and FIG. 28A). In addition, the sensor circuit 19 includes wirings that supply a power supply potential and a signal. For example, the signal line DL, the wiring VPI, a wiring CS, the scan line G1, the wiring RES, the wiring VRES, and the like are included.

Note that the sensor circuit 19 may be located not to overlap with the window portion 14.

Furthermore, the transistors M1 to M3 each include a semiconductor layer. For example, for the semiconductor layer, an element belonging to Group 14, a compound semiconductor, or an oxide semiconductor can be used. Specifically, a semiconductor containing silicon, a semiconductor containing gallium arsenide, an oxide semiconductor containing indium, or the like can be used.

Transistors that can be formed in the same process can be used as the transistors M1 to M3.

Any one of the transistors M1 to M3 preferably includes an oxide semiconductor layer. At this time, the oxide semiconductor layer and the oxide conductor layer are preferably located over the same surface. The off-state current of a transistor including an oxide semiconductor layer is small; therefore, it is particularly preferable that the transistor M1 include the oxide semiconductor layer.

For the wiring, a conductive material can be used. For example, an inorganic conductive material, an organic conductive material, a metal material, a conductive ceramic material, or the like can be used for the wiring. Specifically, a material that is the same as those of the pair of electrodes of the capacitor can be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 19 may be formed over the base material 16 by processing a film formed over the base material 16.

Alternatively, the sensor circuit 19 formed over another base material may be transferred to the base material 16.

Various circuits that can convert the sensor signal DATA supplied from the sensor unit 800 and supply the converted signal to the flexible substrate FPC1 can be used as the converter CONV (FIG. 26A). For example, a transistor M4 can be used in the converter CONV. Furthermore, as shown in FIG. 27C, the transistor M4 and a transistor M5 can be used in the converter CONV.

The sensor circuit 19 of one embodiment of the present invention includes the transistor M1 whose gate is electrically connected to one electrode of the sensor element C and whose first electrode is electrically connected to the wiring VPI that can supply a ground potential, for example (see FIG. 27A).

The sensor circuit 19 may further include the transistor M2 whose gate is electrically connected to the scan line G1 that can supply a selection signal, whose first electrode is electrically connected to a second electrode of the transistor M1, and whose second electrode is electrically connected to the signal line DL that can supply the sensor signal DATA, for example.

The sensor circuit 19 may further include the transistor M3 whose gate is electrically connected to the wiring RES that can supply a reset signal, whose first electrode is electrically connected to the one electrode of the sensor element C, and whose second electrode is electrically connected to the wiring VRES that can supply, for example, a ground potential.

The capacitance of the sensor element C is changed when an object gets close to the pair of electrodes or when the distance between the pair of electrodes is changed. Thus, the sensor circuit 19 can supply the sensor signal DATA based on a change in the capacitance of the sensor element C.

The sensor circuit 19 is provided with the wiring CS that can supply a control signal for controlling the potential of the other electrode of the sensor element C.

Note that a node at which the one electrode of the sensor element C, the gate of the transistor M1, and the first electrode of the transistor M3 are electrically connected to one another is referred to as a node A.

The wiring VRES and wiring VPI each can supply a ground potential, for example, and a wiring VPO and a wiring BR each can supply a high power supply potential, for example. Furthermore, the wiring RES can supply the reset signal, and the scan line G1 can supply the selection signal. Furthermore, the signal line DL can supply the sensor signal DATA, and a terminal OUT can supply a signal converted based on the sensor signal DATA.

Any of various circuits that can convert the sensor signal DATA and supply the converted signal to the terminal OUT can be used as the converter CONV. For example, a source follower circuit, a current mirror circuit, or the like may be formed by the electrical connection between the converter CONV and the sensor circuit 19.

Specifically, by using the converter CONV including the transistor M4, a source follower circuit can be formed (FIG. 27A). Furthermore, as shown in FIG. 27C, the converter CONV may include the transistors M4 and M5. Note that transistors that can be formed in the same process as those of the transistor M1 to the transistor M3 may be used as the transistors M4 and M5.

Figure 28B:
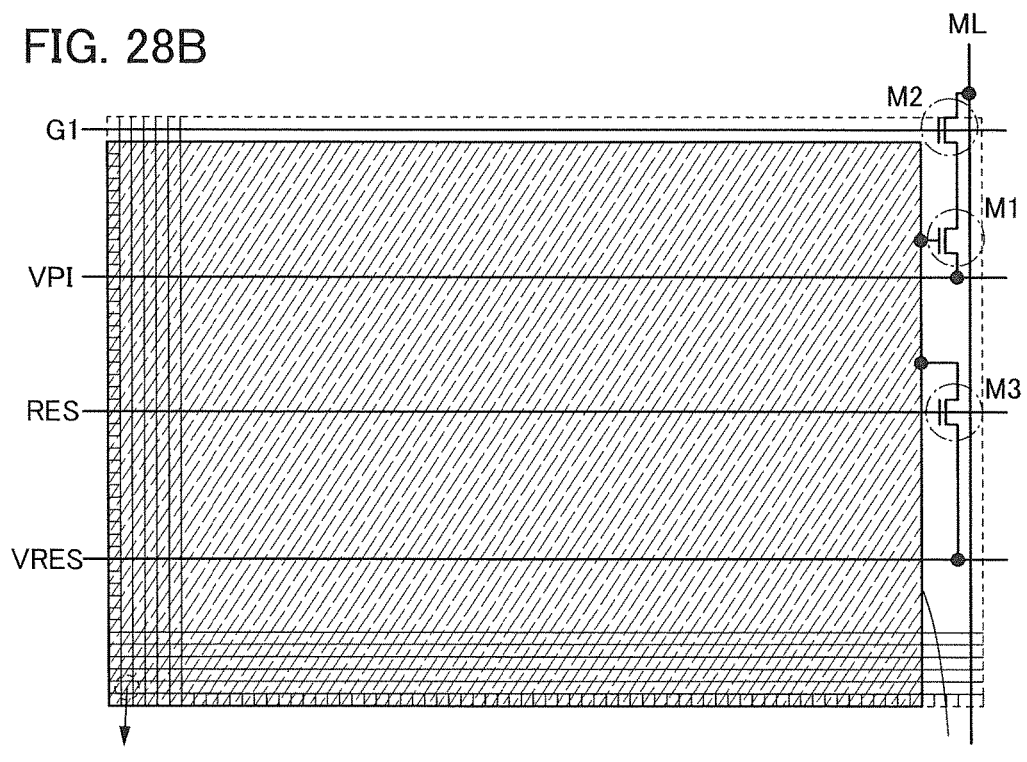
Figure 28C:
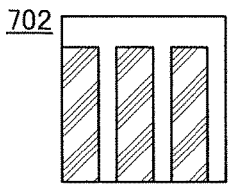

As described above, in the active matrix touch sensor of one embodiment of the present invention, the electrode of the sensor element and the read wiring can be formed in different layers. As shown in FIG. 28B, one electrode CM of a capacitor and a wiring ML are formed in different layers, and the width of the wiring ML is made narrow. Thus, the parasitic capacitance can be small and the adverse effect of noise can be suppressed. Accordingly, a decrease in the detection sensitivity of the touch sensor can be suppressed. Note that the one electrode CM of the capacitor overlaps with the plurality of pixels 702 shown in FIG. 28C that is an enlarged view of FIG. 28B.

<Driving Method of Sensor Circuit 19>

A driving method of the sensor circuit 19 is described.

<<First Step>>

In a first step, after the transistor M3 is turned on, a reset signal for turning off the transistor M3 is supplied to the gate of the transistor M3, so that the potential of the first electrode of the sensor element C is set to a predetermined potential (see Period T1 in FIG. 27B1).

Specifically, the reset signal is supplied from the wiring RES. The transistor M3 supplied with the reset signal renders the potential of the node A a ground potential, for example (see FIG. 27A).

<<Second Step>>

In a second step, a selection signal that turns on the transistor M2 is supplied to the gate of the transistor M2, and the second electrode of the transistor M1 is electrically connected to the signal line DL.

Specifically, the selection signal is supplied from the scan line G1. Through the transistor M2 to which the selection signal is supplied, the second electrode of the transistor M1 is electrically connected to the signal line DL (see a period T2 in FIG. 27B1).

<<Third Step>>

In a third step, a control signal is supplied to the second electrode of the sensor element, and a potential changed in accordance with the control signal and the capacitance of the sensor element C is supplied to the gate of the transistor M1.

Specifically, a rectangular control signal is supplied from the wiring CS. The sensor element C whose second electrode is supplied with the rectangular control signal increases the potential of the node A in accordance with the capacitance of the sensor element C (see the latter part of Period T2 in FIG. 27B1).

For example, in the case where the sensor element C is put in the air, when an object whose dielectric constant is higher than that of the air is placed closer to the second electrode of the sensor element C, the capacitance of the sensor element C is apparently increased.

Thus, the change in the potential of the node A caused by the rectangular control signal becomes smaller than that in the case where an object whose dielectric constant is higher than that of the air is not placed close to the second electrode of the sensor element C (see a solid line in FIG. 27B2).

<<Fourth Step>>

In a fourth step, a signal obtained by the change in the potential of the gate of the transistor M1 is supplied to the signal line DL.

For example, a change in current due to the change in the potential of the gate of the transistor M1 is supplied to the signal line DL.

The converter CONV converts the change in the current flowing through the signal line DL into a change in voltage and supplies the voltage.

<<Fifth Step>>

In a fifth step, a selection signal for turning off the transistor M2 is supplied to the gate of the transistor M2.

Figure 29:
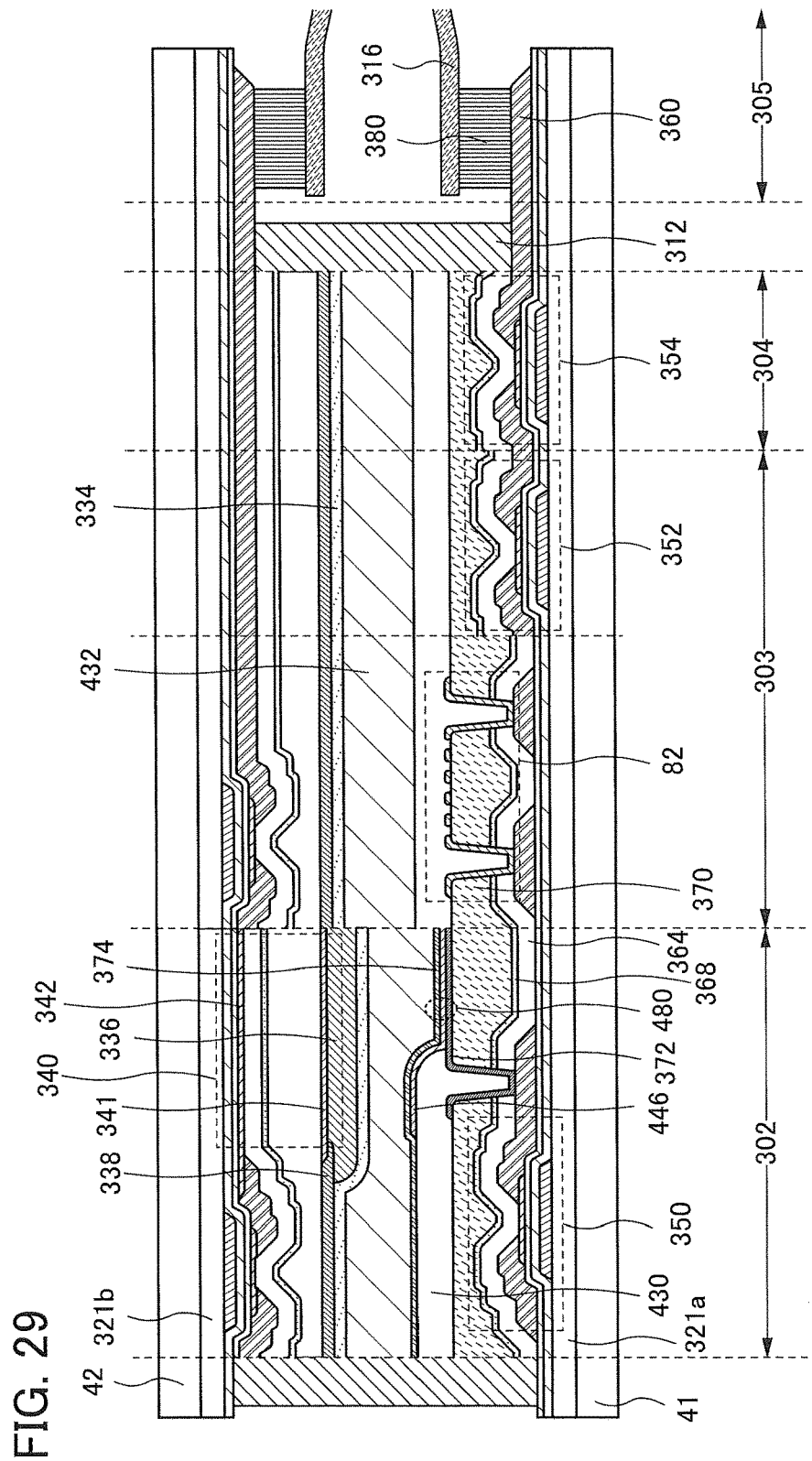
FIG. 29 is a cross-sectional view illustrating a touch panel.

FIG. 29 is a cross-sectional view illustrating the structure of the above-described touch panel. FIG. 29 illustrates an example in which the display device in FIGS. 3A and 3B is provided with a touch sensor. In the touch panel, the transistor of the sensor circuit 19 and a capacitor 340 are formed on the second substrate 42 side.

One electrode 341 of the capacitor 340 is formed to overlap with the coloring layer 336, using a material transmitting the light passing through the coloring layer 336. The other electrode 342 of the capacitor 340 can be formed using, for example, the same material as a semiconductor layer of the transistor. For example, an oxide conductor layer formed by adding impurities forming oxygen vacancies, impurities forming donor levels, or the like to an oxide semiconductor layer can be used.

The structure described in this embodiment can be used in appropriate combination with the structure described in any of the other embodiments.

Embodiment 8

In this embodiment, a structure of a data processing device that can include the display device of one embodiment of the present invention will be described with reference to FIGS. 30A to 30C.

Figure 30A:
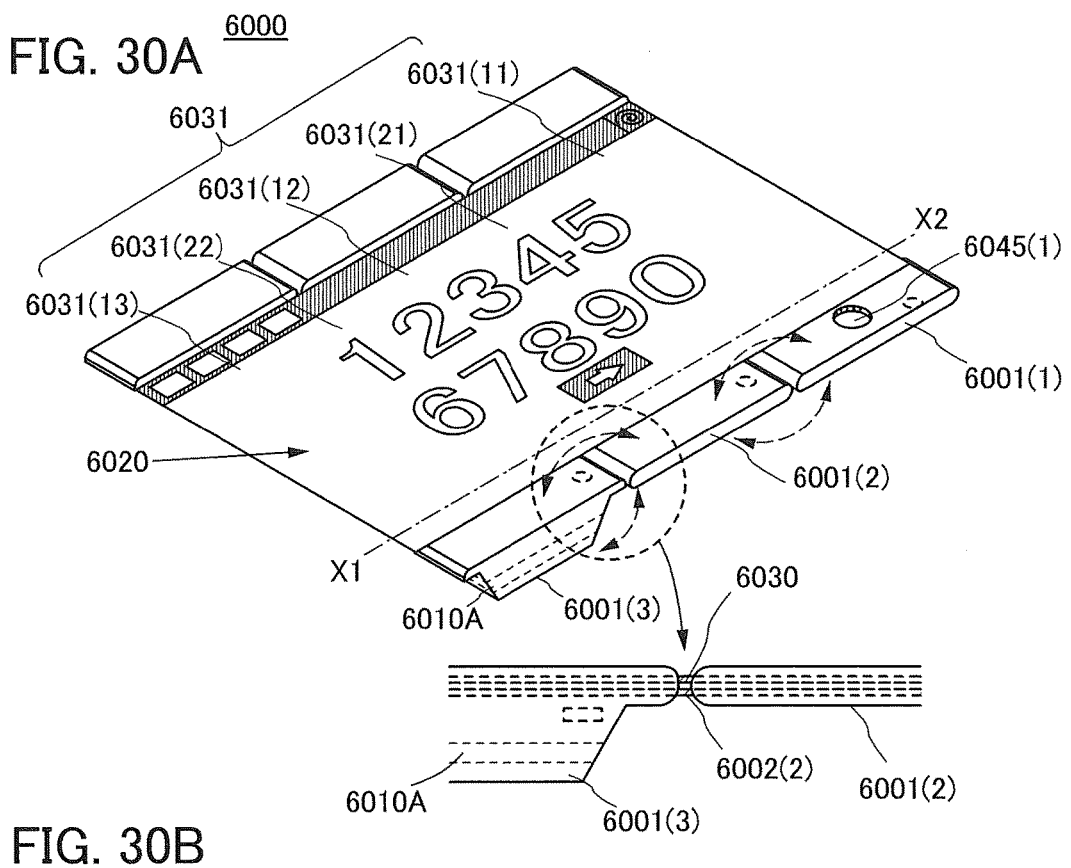
FIGS. 30A to 30C illustrate a structure of a data processing device.
Figure 30B:
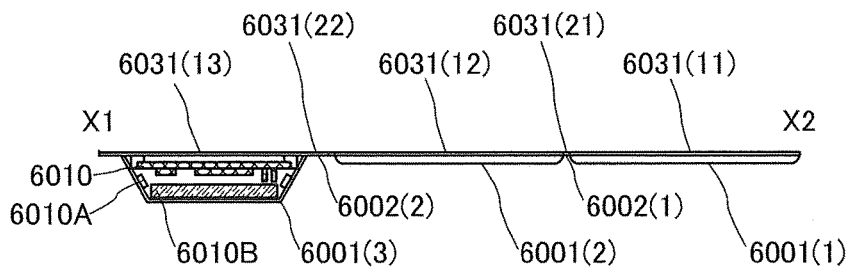
Figure 30C:
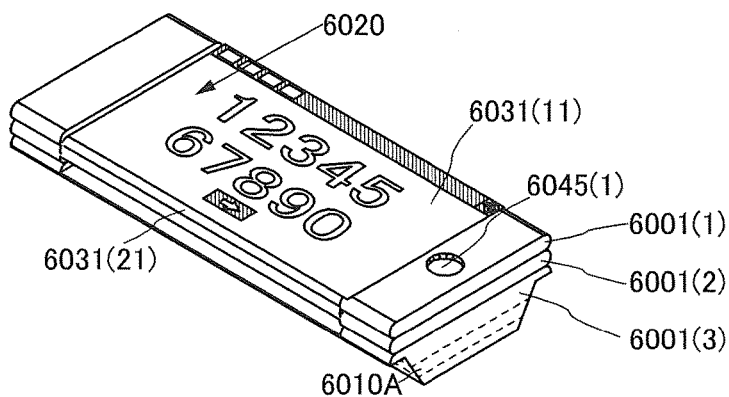

FIGS. 30A to 30C illustrate a data processing device including the display device of one embodiment of the present invention.

FIG. 30A is a projection view illustrating an input/output device 6020 of a data processing device 6000 of one embodiment of the present invention that is unfolded. FIG. 30B is a cross-sectional view of the data processing device 6000 along X1-X2 in FIG. 30A. FIG. 30C is a projection view illustrating the input/output device 6020 that is folded.

<Structural Example of Data Processing Device>

The data processing device 6000 described in this embodiment includes the input/output device 6020 that is supplied with image data V and supplies sensing data S, and an arithmetic device 6010 that supplies the image data V and is supplied with the sensing data S.

The input/output device 6020 includes a display portion 6030 that is supplied with the image data V and an input device that supplies the sensing data S. Note that the input device corresponds to the distortion sensor element described in the above embodiment.

The display portion 6030 includes a region 6031 where a first region 6031(11), a first bendable region 6031(21), a second region 6031(12), a second bendable region 6031(22), and a third region 6031(13) are arranged in stripes in this order (see FIG. 30A).

The display portion 6030 can be folded and unfolded along a first fold line formed in the first bendable region 6031(21) and a second fold line formed in the second bendable region 6031(22) (see FIGS. 30A and 30C).

The above input device determines whether the input/output device 6020 is folded or unfolded and supplies the sensing data S that contains data showing the determined state.

The arithmetic device 6010 supplies the image data V containing a first image to the first region 6031(11) in the case where the sensing data S shows the folded state, and supplies the image data V to the display region 6031 of the display portion 6030 in the case where the sensing data S shows the unfolded state (see FIGS. 30A to 30C).

The data processing device 6000 described in this embodiment includes the input/output device 6020 and the arithmetic device 6010. The input/output device 6020 is foldable and supplied with the image data V. The arithmetic device 6010 supplies the image data V and is supplied with the sensing data S. The input/output device 6020 includes the input device that determines whether the input/output device 6020 is folded or unfolded and supplies the sensing data S containing the data showing the determined state.

With such a structure, the first image can be displayed on the first region 6031(11) of the folded display portion, and a second image can be displayed on a display region of the unfolded display portion 6030 (see FIG. 30A). As a result, a novel data processing device with high convenience or high reliability can be provided.

A housing 6001(1), a hinge 6002(1), a housing 6001(2), a hinge 6002(2), and a housing 6001(3) are positioned in this order such that the input/output device 6020 can be held, folded, and unfolded (see FIG. 30B).

In the example described in this embodiment, the data processing device has the three housings connected with one another with the two hinges. The data processing device having this structure can be folded with the input/output device 6020 bent at two positions.

Note that n housings (n is a natural number of two or more) may be connected with one another with (n−1) hinges. The data processing device having this structure can be folded with the input/output device 6020 bent at (n−1) positions.

Note that the input/output device 6020 or another sensor may sense the state where the input/output device 6020 is folded or unfolded and may supply data indicating that the input/output device 6020 is folded. The arithmetic device 6010 to which data indicating that the input/output device 6020 is folded may stop operation of the portion that is folded inside. Specifically, operation of the display portion 6030 and/or the input device may be stopped. Accordingly, the user of the data processing device 6000 can reduce power wasted by an unavailable portion (portion folded inside).

The display device of one embodiment of the present invention can self-detect the shape of the display portion with the use of the distortion sensor element. Therefore, the data processing device in this embodiment, which can be folded into two or more, can automatically display an image appropriate for the shape of the display portion.

The housing 6001(1) overlaps with the first region 6031(11) and is provided with a button 6045(1).

The housing 6001(2) overlaps with the second region 6031(12).

The housing 6001(3) overlaps with the third region 6031(13). The arithmetic device 6010, an antenna 6010A, and a battery 6010B are provided in the housing 6001(3).

The hinge 6002(1) overlaps with the first bendable region 6031(21) and rotatably connects the housing 6001(1) to the housing 6001(2).

The hinge 6002(2) overlaps with the second bendable region 6031(22) and rotatably connects the housing 6001(2) to the housing 6001(3).

The antenna 6010A is electrically connected to the arithmetic device 6010 and supplies or is supplied with a signal.

In addition, the antenna 6010A is wirelessly supplied with power from an external device and supplies the power to the battery 6010B.

The battery 6010B is electrically connected to the arithmetic device 6010 and supplies or is supplied with power.

The structure described in this embodiment can be used in appropriate combination with the structure described in any of the other embodiments.

Embodiment 9

In this embodiment, electronic devices to which one embodiment of the present invention is applied will be described with reference to FIGS. 31A to 31D.

Highly reliable flexible electronic devices can be manufactured by adopting the display device of one embodiment of the present invention.

Examples of the electronic devices are a television device, a monitor of a computer or the like, digital signage, a camera such as a digital camera or a digital video camera, a digital photo frame, a mobile phone, a portable game console, a portable information terminal, an audio reproducing device, a large-sized game machine, and the like.

The display device of one embodiment of the present invention has flexibility and thus can be incorporated along a curved inside/outside wall surface of a house or a building or a curved interior/exterior surface of a car. The display device of one embodiment of the present invention can be folded or rolled up to be carried.

Figure 31A:
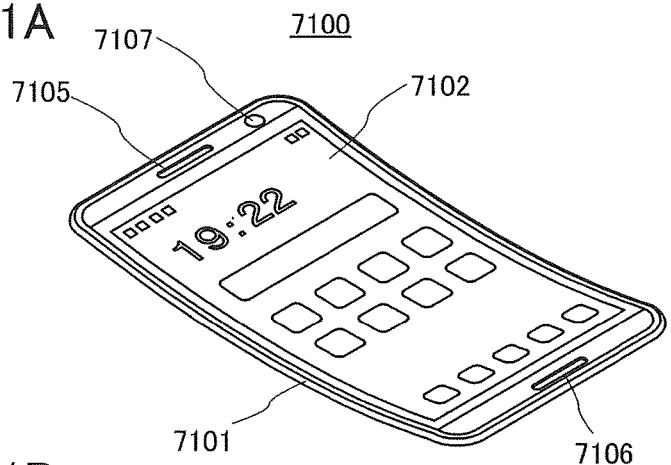
FIGS. 31A to 31D illustrate electronic devices.

FIG. 31A illustrates an example of a thin portable information terminal. A portable information terminal 7100 includes a display portion 7102 incorporated in a housing 7101, a speaker 7105, a microphone 7106, a camera 7107, and the like. Note that the housing 7101, the display portion 7102, and the like are flexible, whereby the portable information terminal 7100 achieves excellent portability and high resistance against shock such as a drop impact. The display portion 7102 includes the display device of one embodiment of the present invention, and for example, images can be switched in bending of the display portion.

Figure 31B:
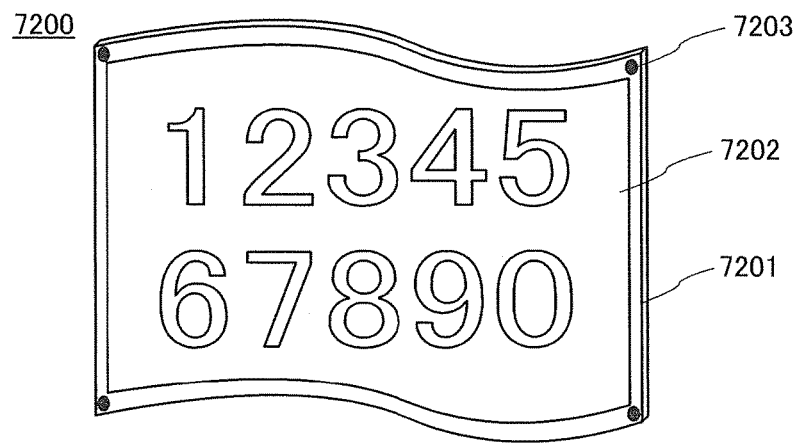

FIG. 31B illustrates an example of a large-sized display such as a television or digital signage. A large-sized display 7200 includes a flexible housing 7201 and a display portion 7202 including the display device of one embodiment of the present invention. The large-sized display 7200 can be folded or rolled up. Even when the large-sized display is curved as shown in the drawing, image display can be performed with viewability as high as that in the case where the display is flat. In addition, when a sensor 7203 sensing the position of a viewer operates, an image with high viewability can be displayed to only a specific viewer.

Figure 31C:
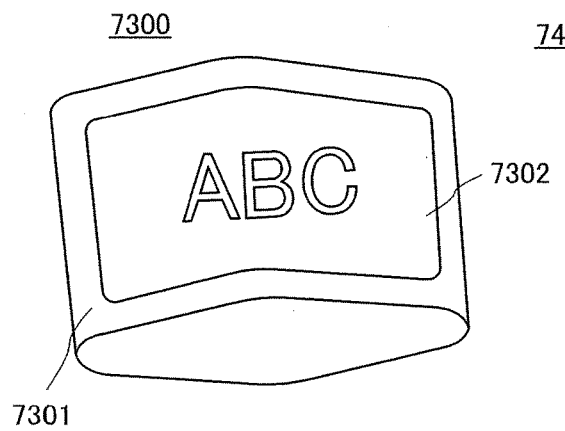

FIG. 31C illustrates an example of an armband with a display function. An armband 7300 includes a tube-shaped flexible body 7301 formed using a cloth, a resin, or the like and a display portion 7302 including the display device of one embodiment of the present invention. The armband 7300 is foldable. Displayed images can be enlarged or reduced in accordance with the degree of curvature, so that an image with high viewability can be displayed.

Figure 31D:
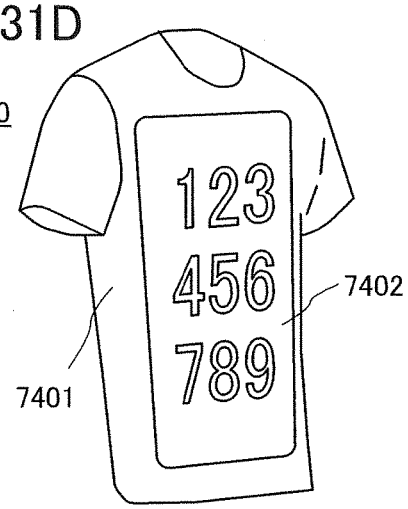

FIG. 31D illustrates an example of clothing with a display function. Clothing 7400 includes flexible fabric 7401 and a display portion 7402 including the display device of one embodiment of the present invention. The clothing 7400 can be easily changed in shape and folded. Since the display device can self-detect its shape, an image with high viewability can be displayed in a specific direction regardless of the amount of change in shape of the clothing 7400.

The structure described in this embodiment can be used in appropriate combination with the structure described in any of the other embodiments.

This application is based on Japanese Patent Application serial no. 2014-086089 filed with Japan Patent Office on Apr. 18, 2014 and Japanese Patent Application serial no. 2014-095331 filed with Japan Patent Office on May 2, 2014 the entire contents of which are hereby incorporated by reference.

What is claimed is:

1. A data processing device comprising:
a display portion; and
a circuit configured to perform the following steps:
a first step of acquiring image data to form a virtual screen;
a second step of acquiring data on a shape of the display portion to form a three-dimensional shape model;
a third step of acquiring positional data of a viewer to regard the three-dimensional shape model as a two-dimensional display portion and to assign a coordinate to the two-dimensional display portion;
a fourth step of performing calculation to determine a portion of the display portion not seen from a position of the viewer;
a fifth step of converting a coordinate of the virtual screen to the coordinate of the two-dimensional display portion;
and a sixth step of outputting image data obtained in the fifth step to the display portion.

2. The data processing device according to claim 1, wherein the display portion is bent.

3. The data processing device according to claim 1, wherein the portion of the display portion not seen from the position of the viewer is in an off state.

4. The data processing device according to claim 1, wherein an image is displayed in reduced form in the display portion after the sixth step.

5. The data processing device according to claim 1, wherein an image on the display portion is changed in accordance with the shape of the display portion.

6. The data processing device according to claim 1, wherein the display portion can be folded.

7. A data processing device comprising:
a display portion; and
a circuit configured to perform the following steps:
a first step of acquiring image data to forma virtual screen;
a second step of sensing a status of the data processing device and a status of a viewer;
a third step of acquiring data on a shape of the display portion to form a three-dimensional shape model;
a fourth step of acquiring positional data of the viewer to regard the three-dimensional shape model as a two-dimensional display portion and to assign a coordinate to the two-dimensional display portion;
a fifth step of performing calculation to determine a portion of the display portion not seen from a position of the viewer;
a sixth step of converting a coordinate of the virtual screen to the coordinate of the two-dimensional display portion; and
a seventh step of outputting image data obtained in the sixth step to the display portion, wherein the second to seventh steps are performed one by one, and wherein operation of returning from the seventh step to the second step is performed.

8. The data processing device according to claim 7,
wherein the second step comprises:
an eighth step of determining whether the shape of the display portion is changed or not;
a ninth step of determining whether the position of the viewer is changed or not; and
a tenth step of determining whether an image change instruction is issued or not,
wherein operation proceeds to the third step when the shape of the display portion is changed in the eighth step, whereas the operation proceeds to the ninth step when the shape of the display portion is not changed in the eighth step,
wherein the operation proceeds to the fourth step when the position of the viewer is changed in the ninth step, whereas the operation proceeds to the tenth step when the position of the viewer is not changed in the ninth step, and
wherein the operation proceeds to the first step and proceeds to the sixth step after the first step is performed when the image change instruction is issued in the tenth step, whereas the operation returns to the second step when the image change instruction is not issued in the tenth step.

9. The data processing device according to claim 7, wherein the display portion is bent.

10. The data processing device according to claim 7, wherein the portion of the display portion not seen from the position of the viewer is in an off state.

11. The data processing device according to claim 7, wherein an image is displayed in reduced form in the display portion after the seventh step.

12. The data processing device according to claim 7, wherein an image on the display portion is changed in accordance with the shape of the display portion.

13. The data processing device according to claim 7, wherein the display portion can be folded.

* * * * *